(12) United States Patent
Fujita

(10) Patent No.: US 7,498,572 B2
(45) Date of Patent: Mar. 3, 2009

(54) DEFLECTING ELECTROMAGNET AND ION BEAM IRRADIATING APPARATUS

(75) Inventor: Hideki Fujita, Kyoto (JP)

(73) Assignee: Nissin Ion Equipment Co., Ltd., Kyoto (JP)

( * ) Notice: Subject to any disclaimer, the term of this patent is extended or adjusted under 35 U.S.C. 154(b) by 203 days.

(21) Appl. No.: 11/519,008

(22) Filed: Sep. 12, 2006

(65) Prior Publication Data

US 2007/0075259 A1    Apr. 5, 2007

(30) Foreign Application Priority Data

Sep. 14, 2005   (JP)   ............ P.2005-267426
Nov. 16, 2005   (JP)   ............ P.2005-331116

(51) Int. Cl.
*B01D 59/44* (2006.01)
*H01J 49/28* (2006.01)
*H01J 49/30* (2006.01)
*H01J 49/00* (2006.01)

(52) U.S. Cl. ............ 250/296; 250/294; 250/298; 250/396 R

(58) Field of Classification Search ............ 250/281, 250/282, 294, 296, 298, 396 R, 396 ML, 250/492.2, 492.3, 492.21
See application file for complete search history.

(56) References Cited

U.S. PATENT DOCUMENTS

| | | | | |
|---|---|---|---|---|
| 4,755,685 A | * | 7/1988 | Kawanami et al. | ....... 250/492.2 |
| 5,132,544 A | * | 7/1992 | Glavish | ............ 250/492.2 |
| 5,189,303 A | * | 2/1993 | Tanjyo et al. | ............ 250/296 |
| 5,481,116 A | * | 1/1996 | Glavish et al. | ........ 250/396 ML |
| 6,271,529 B1 | * | 8/2001 | Farley et al. | ........... 250/492.21 |
| 6,323,493 B1 | * | 11/2001 | Keller et al. | ......... 250/396 ML |
| 6,498,348 B2 | * | 12/2002 | Aitken | ............... 250/396 ML |
| 6,759,665 B2 | | 7/2004 | Benveniste et al. | |
| 6,762,423 B2 | | 7/2004 | Liebert et al. | |
| 6,797,968 B2 | * | 9/2004 | Tsukihara et al. | ...... 250/492.21 |
| 7,078,714 B2 | * | 7/2006 | Maeno et al. | ......... 250/492.21 |
| 7,105,839 B2 | * | 9/2006 | White | ................. 250/492.21 |
| 2002/0043621 A1 | * | 4/2002 | Aitken | ....................... 250/281 |
| 2003/0122090 A1 | * | 7/2003 | Tsukihara et al. | ...... 250/492.21 |
| 2005/0082498 A1 | * | 4/2005 | White | ................. 250/492.21 |
| 2007/0075259 A1 | * | 4/2007 | Fujita | .................. 250/396 ML |

FOREIGN PATENT DOCUMENTS

| | | |
|---|---|---|
| JP | 2001-143651 | 5/2001 |
| JP | 2002-352765 | 12/2002 |
| JP | 3399117 | 2/2003 |

* cited by examiner

*Primary Examiner*—Bernard E Souw
(74) *Attorney, Agent, or Firm*—Finnegan, Henderson, Farabow, Garrett & Dunner LLP

(57) ABSTRACT

A deflecting electromagnet has first and second magnetic poles that are opposed to each other via an inter-pole space through which an ion beam passes. The deflecting electromagnet further has: a pair of potential adjusting electrodes which are placed to sandwich a path of the ion beam in the same directions as the magnetic poles in the inter-pole space; and a DC potential adjusting power source which applies a positive voltage to the potential adjusting electrodes. The deflecting electromagnet further has a permanent-magnet group for, in the inter-pole space, forming a mirror magnetic field in which intensity is low in the vicinity of the middle in an ion beam passing direction, and intensities in locations which are respectively nearer to an inlet and an outlet are higher than the intensity in the vicinity of the middle.

14 Claims, 54 Drawing Sheets

DEFLECTING ELECTROMAGNET AND ION BEAM IRRADIATING APPARATUS

TECHNICAL FIELD

The present disclosure relates to a deflecting electromagnet which is to be used in an apparatus such as an ion beam irradiating apparatus for irradiating a target with an ion beam to perform ion implantation or the like, and which bends the ion beam by means of a magnetic field, and also to an ion beam irradiating apparatus which is provided with such a deflecting electromagnet. In the case where ion implantation is performed, the ion beam irradiating apparatus is called also as an ion implanting apparatus.

RELATED ART

FIG. 51 shows an example of such an ion beam irradiating apparatus. The ion beam irradiating apparatus has a configuration which irradiates a target 16 with an ion beam 4 emitted from an ion source 2. For example, the target 16 is a semiconductor substrate.

Specifically, as disclosed also in Patent Reference 1 (Japanese Patent Unexamined Publication No. 2001-143651 (Paragraphs 0004 to 0005, FIG. 4)), the ion beam irradiating apparatus comprises: the ion source 2 which emits the ion beam 4; a mass separating magnet 6 which selects and extracts a specific ion species from the ion beam 4 emitted from the ion source; an acceleration and deceleration tube 8 which accelerates or decelerates the ion beam 4 extracted from the magnet; an energy separating magnet 10 which selects and extracts an ion having a specific energy, from the ion beam 4 extracted from the tube; a scanning magnet 12 which scans the ion beam 4 extracted from the magnet, in the Y direction (for example, the horizontal direction) by means of a magnetic field; and a parallelizing magnet 14 which bends back the ion beam 4 extracted from the magnet, and which cooperates with the scanning magnet 12 to perform parallel scanning of the ion beam 4, i.e., to produce the parallelized ion beam 4.

The ion beam 4 extracted from the parallelizing magnet 14 irradiates the target 16 which is held by a holder 18 in a processing chamber 20, whereby a process such as ion implantation is applied on the target 16. In the example, the target 16 is reciprocated in the Z direction (for example, the vertical direction) which is substantially perpendicular to the Y direction, by a scanning mechanism (not shown). The reciprocation of the target 16, and the scan of the ion beam 4 cooperate with each other to enable a process such as ion implantation to be uniformly applied on the whole face of the target 16. The whole path of the ion beam 4 is maintained to a vacuum atmosphere.

In the thus configured ion beam irradiating apparatus, the throughput of the apparatus must be enhanced, and the ion implantation depth must be made shallower in accordance with miniaturization of a semiconductor device to be formed on the target 16. Therefore, it is desired to efficiently transport the ion beam 4 having a low energy and a large current. As the ion beam 4 has a lower energy and a larger current, however, the divergence of the ion beam 4 due to space charges becomes larger. Therefore, it is difficult to efficiently transport the ion beam 4.

Many magnets such as the mass separating magnet 6, the energy separating magnet 10, the scanning magnet 12, and the parallelizing magnet 14 exist in the transportation path of the ion beam 4. All of the magnets are used for deflecting (bending) the ion beam 4, and hence can be generically referred to as a deflecting electromagnet. The distance by which the ion beam 4 passes through an inter-pole space of such a deflecting electromagnet constitutes most of the whole transportation distance of the ion beam. Therefore, suppression of divergence by neutralizing space charges of the ion beam in the inter-pole space of the deflecting electromagnet is important for enhancing the transportation efficiency of the ion beam 4, particularly, for enhancing the transportation efficiency of the ion beam 4 having a low energy and a large current.

In order to realize this, it is contemplated to employ a method in which electrons are supplied from the outsides of magnetic poles into the inter-pole space to neutralize space charges of the ion beam passing through the inter-pole space. However, the electron Lamor radius is much reduced because of a strong magnetic field in the inter-pole space. Therefore, it is not easy to supply from the outside into the inter-pole space.

As another method, a technique in which an electron source is disposed on the surfaces of magnetic poles, and electrons are supplied from the source to the inter-pole space to neutralize space charges of the ion beam passing through the inter-pole space has been proposed (for example, see Patent Reference 2 (U.S. Pat. No. 6,762,423 (FIG. 2))).

Furthermore, part of the periphery of an ion beam collides with a vacuum wall or the like to generate secondary electrons, or an ion beam collides with a minute amount of a residual gas in vacuum to ionize the gas and generate electrons. Therefore, electrons originally exist in an ion beam and in the vicinity thereof. As a further method, consequently, a technique in which the confinement of electrons generated due to an ion beam is improved by a cusp magnetic field formed in an ion beam line, to neutralize space charges of the ion beam has been proposed (for example, see Patent Reference 3 (Japanese Patent Unexamined Publication No. 2002-352765 (Paragraphs 0012 to 0019, FIG. 5)) and Patent Reference 4 (U.S. Pat. No. 6,759,665 (FIG. 6))).

In the technique in which the electron source is disposed, the structure is complicated, and the inter-pole space is usually very small. Therefore, it is very difficult to dispose the electron source. When the electron source is disposed, moreover, an area through which the ion beam is passable is correspondingly reduced. Hence, the ion beam is susceptible to collide with the electron source, whereby the transportation efficiency of the ion beam is lowered.

By the E×B (E-cross-B) drift due to an electric field E produced by the ion beam itself and a magnetic field B produced by a deflecting electromagnet, electrons in the vicinity of the ion beam is immediately caused to flow out to the outside of the inter-pole space and disappear. Even when electrons are supplied from the electron source into the inter-pole space, or improvement of the confinement of electrons in an ion beam line by the cusp magnetic field is intended, the effect of neutralizing space charges of the ion beam is not much expected as far as the E×B drift is not suppressed.

Hereinafter, this will be described in detail. First, the E×B drift will be described.

In the case where a magnetic field B exists, as shown in FIG. 52, electrons 38 perform the cyclotron motion so as to be wound around the magnetic field B. The reference numeral 48 denotes the rotation center of the motion.

When an electric field E is applied in a direction perpendicular to the magnetic field B, a phenomenon that an orbit 40 of the rotation center of the electrons 38 gradually is shifted in the direction of the outer product of E×B occurs as shown in FIG. 53. This phenomenon is called the E×B drift. The E×B drift is caused by a phenomenon that the motion energy of each of the electrons 38 is varied depending on the position of the electron 38 in the electric field E, and therefore the Lamor radius is changed, whereby the cyclotron motion is shifted.

In the case where the magnetic field B is vertically oriented, as shown in FIG. 54, the electrons 38 have a velocity component which is parallel to magnetic force lines, and hence are vertically moved along the magnetic force lines. When the electric field E (see FIGS. 55 and 56) produced by the ion beam 4 further exists, it functions as a restoring force so that the electrons 38 are vertically reciprocated along the magnetic force lines. When the magnetic field B and the electric field E exist, therefore, the E×B drift occurs in the horizontal direction, and the electrons 38 are vertically moved along the magnetic force lines. Consequently, the electrons 38 make the complex orbit 40 along which the electrons are vertically reciprocated and horizontally perform the E×B drift. The reference numeral 50 denotes a center orbit of the orbit 40.

When it is assumed that the ion beam 4 has a positive potential (beam potential) with respect to ground and is formed as a column in which the beam current density is uniform as shown in FIG. 55, the electric field E produced by the ion beam 4 points in a radial direction with respect to the ion beam 4.

As shown in FIG. 56, the potential $V_B$ of the ion beam 4 has the maximum value at the middle of the ion beam 4, and the maximum of the absolute value of the electric field E is produced in the vicinities of both radial ends a, b of the ion beam 4, where the rate of change of the potential $V_B$ in a radial direction of the ion beam (i.e., $|E|=|dV_B/dY|$) typically is maximum. The direction of the electric field E is vertically inverted on both sides with respect to the Y-axis.

When the magnetic field B is applied to the electric field E, as shown in FIG. 57, the E×B drift is zero at the middle of the ion beam 4 where the electric field E is zero, and the E×B drift is maximum at the radial ends a, b of the ion beam 4 because the electric field E is maximum. When the distance from the center of the ion beam 4 to the radial ends a, b becomes very large (i.e., substantially maximum), the electric field E is substantially zero. Therefore, E×B is substantially zero, and the E×B drift hardly occurs. The direction of the E×B drift is vertically inverted on both sides with respect to the Y-axis.

FIG. 58 is a side view schematically showing the E×B drift of electrons in a related-art deflecting electromagnet, and FIG. 59 is a section view taken along the line D-D of FIG. 58.

The deflecting electromagnet 30 has a first magnetic pole 32a and a second magnetic pole 32b that are opposed to each other, both in polarity and position, across an inter-pole space 34 through which the ion beam 4 passes, and is configured so that the ion beam 4 passing through the inter-pole space 34 is bent (in this example, bent in the front and rear directions of the sheet face (i.e., perpendicular to the drawing sheet)) by the magnetic field B produced in the inter-pole space 34 by the magnetic poles 32a, 32b. An example of magnetic force lines 36 forming the magnetic field B is illustrated. For example, the ion beam 4 passes in the direction indicated by the arrow 42. Alternatively, the ion beam passes in the opposite direction.

The E×B drift of the electrons 38 in the inter-pole space 34 is as described above with reference to FIGS. 52 to 57. On the right side of the ion beam 4 in FIG. 59, the E×B drift is oriented in the front-to-rear direction of the sheet face, and, on the left side, oriented contrarily or in the rear-to-front direction of the sheet face. Therefore, the electrons 38 flow out to the outside of the inter-pole space 34 in the same direction as the ion beam 4, resulting in a failure to confine electrons in the inter-pole space 34 FIG. 60 shows the manner of this flow. The drift direction of the electrons 38 is inverted on the right and left sides of the ion beam 4, and loss directions 44, 46 are opposed to each other. Anyway, the E×B drift causes the electrons 38 to flow out to the outside of the inter-pole space 34, resulting in a failure to confine electrons in the inter-pole space 34. In FIG. 60, in order to facilitate the illustration of the manner of drifting of the electrons 38, the magnetic pole 32a which is in the upper side is indicated by phantom lines.

For example, the electrons 38 are secondary electrons which are generated by collision of part of the periphery of the ion beam 4 with a wall face or the like constituting the inter-pole space 34, or electrons which are generated by ionization caused by collision of a residual gas in the inter-pole space 34 with the ion beam 4.

Japanese Patent No. 3,399,117 discloses a technique in which magnetic field producing means for producing a magnetic field in a direction along the axis of an ion beam to magnetically confine electrons (confining in a radial direction of the ion beam), and first and second cylindrical electron confining electrodes that are disposed in the vicinities of the both ends of the means, and that electrostatically confine electrons (confining in the axial direction of the ion beam) are placed outside a deflecting electromagnet (specifically, a mass analysis electromagnet), and space charges of the ion beam are suppressed by confined electrons. However, this technique cannot be applied to the inside of a deflecting electromagnet.

The reason of the above is that, inside the deflecting electromagnet, a strong magnetic field is applied in a direction substantially perpendicular to the traveling direction of the ion beam, and therefore a magnetic field in a direction along the axis of the ion beam cannot be produced unlike the above-described case. As described above, it is important to neutralize space charges of the ion beam inside the deflecting electromagnet. The cylindrical electron confining electrodes perform only a function of repelling electrons by means of a negative voltage. Therefore, it is impossible to suppress flowing of electrons due to the E×B drift to the outside of the space between the electrodes.

SUMMARY

Embodiments of the present invention provide a deflecting electromagnet and an ion beam irradiating apparatus which can suppress divergence of an ion beam by reducing a loss of electrons from an inter-pole space due to an E×B drift to improve confinement of electrons in the inter-pole space, and efficiently neutralizing space charges of the ion beam by the confined electrons.

A deflecting electromagnet according to a first aspect of one or more embodiments of the invention is a deflecting electromagnet comprising: first and second magnetic poles that are opposed to each other across an inter-pole space through which an ion beam passes, for bending the ion beam passing through the inter-pole space; and a first permanent-magnet group for, in the inter-pole space, forming a first mirror magnetic field in which intensity is relatively low in a vicinity of a middle of the inter-pole space in an ion beam passing direction, and intensities in locations of the inter-pole space which are respectively nearer to an inlet and an outlet are relatively higher than the intensity in the middle.

According to the deflecting electromagnet, by a composite magnetic field of a magnetic field produced by the magnetic poles and the mirror magnetic field produced by the permanent-magnet group, an E×B drift produced by a magnetic field component which is substantially perpendicular to the magnetic poles, an E×B drift produced by a magnetic field component which is substantially parallel to the magnetic poles, and a gradient B drift produced by intensity nonuniformity of a magnetic field formed by the permanent-magnet group are caused. As a result of combination of these drifts, a closed electron orbit exists in or in the vicinity of the ion beam. Namely, electrons in a state where the orbit is captured can exist in the ion beam or in the vicinity thereof. Accordingly, the loss of electrons from the inter-pole space due to the E×B drift can be reduced, and hence the confinement of electrons in the inter-pole space can be improved.

For example, the electrons are secondary electrons which are generated by collision of part of the periphery of the ion beam with a wall face or the like constituting the inter-pole space, or electrons which are generated by ionization caused by collision of a residual gas in the inter-pole space with the ion beam.

According to a second aspect of one or more embodiments of the invention, in a specific example of the permanent-magnet group, the permanent-magnet group comprises: a first pair of permanent magnets which are respectively placed on or in vicinities of surfaces of the first and second magnetic poles, and in locations of the inter-pole space that are nearer to the inlet with respect to the middle in the ion beam passing direction, to intersect with a path of the ion beam, the first pair of permanent magnets producing a magnetic field in a direction along which a magnetic field produced by the first and second magnetic poles is enhanced; and a second pair of permanent magnets which are respectively placed on or in vicinities of surfaces of the first and second magnetic poles, and in locations of the inter-pole space that are nearer to the outlet with respect to the middle in the ion beam passing direction, to intersect with the path of the ion beam, the second pair of permanent magnets producing a magnetic field in a direction along which the magnetic field produced by the first and second magnetic poles is enhanced.

According to a third aspect of one or more embodiments of the invention, the deflecting electromagnet may further comprise second permanent-magnet group for, in the inter-pole space, forming a second mirror magnetic field in which intensity is relatively low in the vicinity of the middle of the inter-pole space in a direction intersecting with an ion beam passing direction, and the intensity is relatively high in locations which are respectively nearer to both ends with respect to the middle.

According to a fourth aspect of one or more embodiments of the invention, in a specific example of the second permanent-magnet group, the second permanent-magnet group comprises third and fourth pairs of permanent magnets which are placed on or in vicinities of surfaces of the first and second magnetic poles, and in locations of the inter-pole space which are respectively nearer to both ends with respect to the middle in a direction intersecting with the ion beam passing direction to extend along the path of the ion beam, the third and fourth pairs of permanent magnets producing respectively magnetic fields in a direction along which the magnetic field produced by the first and second magnetic poles is enhanced.

According to a fifth aspect of one or more embodiments of the invention, an ion beam irradiating apparatus for irradiating a target with an ion beam emitted from an ion source, comprises one or more of the above-described deflecting electromagnets in a path of the ion beam from the ion source to the target.

Various implementations may include one or more the following advantages. For example, the first and second aspects of the invention can attain the following effects.

(1) Since the permanent-magnet group for forming the mirror magnetic field is disposed in the inter-pole space, electrons in a state where the orbit is captured can exist in the ion beam or in the vicinity thereof. Accordingly, the loss of electrons from the inter-pole space due to the E×B drift can be reduced, and hence the confinement of electrons in the inter-pole space can be improved. As a result, space charges of the ion beam can be efficiently neutralized by the confined electrons, whereby the divergence of the ion beam can be suppressed, and therefore the transportation efficiency of the ion beam can be improved.

(2) Electrons can be confined into the vicinity of the ion beam orbit. Therefore, electrons which are generated from the vicinity of the ion beam by collision of the ion beam with a residual gas can be efficiently confined. Accordingly, the effect that space charges of the ion beam are neutralized is further enhanced.

(3) As compared with the case where a cusp magnetic field is formed along an ion beam line, the number of permanent magnets in the case where a mirror magnetic field such as described above is formed can be greatly reduced. Therefore, the structure of the deflecting electromagnet can be simplified.

(4) Electrons which are generated due to the ion beam are confined, and space charges of the ion beam are neutralized. Therefore, it is not required to dispose an electron source which supplies electrons from the surfaces of the magnetic poles or the outside into the inter-pole space. When a large ion beam current flows, moreover, electrons which are generated due to the ion beam are increased, and the neutralization of space charges is spontaneously adjusted. Accordingly, a large control system is not necessary.

(5) Even when the ion beam is scanned, electrons are so light that they are moved while being pulled by the electric field of the ion beam, and the electron drift speed is high. Also in the case where the deflecting electromagnet scans the ion beam, such as the case of a scanning magnet, therefore, it is possible to attain the above-mentioned effects.

According to the third and fourth aspects of the inventions, an electron confining region is expanded by the second mirror magnetic field formed by the second permanent-magnet group, so that the electron confining performance can be further enhanced. As a result, space charges of the ion beam can be efficiently neutralized, whereby the divergence of the ion beam can be suppressed, and therefore the transportation efficiency of the ion beam can be improved.

The electromagnet of the fifth aspect of the invention comprises one or more such deflecting electromagnets, and each of the deflecting electromagnets achieves the above-mentioned effects. Therefore, the transportation efficiency of the ion beam emitted from the ion source to the target can be improved.

A deflecting electromagnet according to a sixth aspect of one or more embodiments of the invention is a deflecting electromagnet comprising: first and second magnetic poles that are opposed to each other via an inter-pole space through which an ion beam passes, for bending the ion beam passing through the inter-pole space; and a pair of potential adjusting electrodes which are placed to sandwich a path of the ion beam in same directions as the first and second magnetic poles, in the inter-pole space; and a DC potential adjusting power source which applies a positive voltage to the pair of potential adjusting electrodes.

In the deflecting electromagnet, the potential in the periphery of the ion beam can be adjusted by the potential adjusting electrodes to which the positive voltage is applied from the potential adjusting power source. Therefore, an orbit which is closed in a space including the inter-pole space can exist as an orbit of the electron E×B drift due to an electric field in the periphery of the ion beam and a magnetic field produced by the magnetic poles. As a result, electrons in a state where the orbit is captured can exist in the ion beam or in the vicinity thereof. Accordingly, the loss of electrons from the inter-pole space due to the E×B drift can be reduced, and hence the confinement of electrons in the inter-pole space can be improved.

For example, the electrons are secondary electrons which are generated by collision of part of the periphery of the ion beam with a wall face or the like constituting the inter-pole space, or electrons which are generated by ionization caused by collision of a residual gas in the inter-pole space with the ion beam. This is applicable also to other deflecting electromagnets which will be described later.

According to a seventh aspect of one or more embodiments of the invention, preferably, the voltage which is applied from the potential adjusting power source to the potential adjusting electrodes is higher than a higher one of: a potential which is produced by the ion beam at ion beam inlet ends of the potential adjusting electrodes; and a potential which is produced by the ion beam at ion beam outlet ends of the potential adjusting electrodes.

Another deflecting electromagnet according to an eighth aspect of one or more embodiments of the invention is a deflecting electromagnet comprising: first and second magnetic poles that are opposed to each other via an inter-pole space through which an ion beam passes, for bending the ion beam passing through the inter-pole space; a first pair of correcting electrodes which are placed to sandwich a path of the ion beam in same directions as the first and second magnetic poles, in locations of the inter-pole space which are nearer to an inlet with respect to a middle in an ion beam passing direction; a second pair of correcting electrodes which are juxtaposed with the first pair of correcting electrodes to be positioned outside the first pair of correcting electrodes in the ion beam passing direction; a third pair of correcting electrodes which are placed to sandwich the path of the ion beam in same directions as the first and second magnetic poles, in locations of the inter-pole space which are nearer to an outlet with respect to the middle in the ion beam passing direction; a fourth pair of correcting electrodes which are juxtaposed with the third pair of correcting electrodes to be positioned outside the third pair of correcting electrodes in the ion beam passing direction; a first DC correcting power source which holds potentials of the second pair of correcting electrodes to be lower than potentials of the first pair of correcting electrodes; and a second DC correcting power source which holds potentials of the fourth pair of correcting electrodes to be lower than potentials of the third pair of correcting electrodes.

In the deflecting electromagnet, the electron E×B drift due to: an electric field which is a combination of an electric field produced by the first and second pairs of correcting electrodes, and that produced by the ion beam; and a magnetic field produced by the magnetic poles is oriented in a direction intersecting with the ion beam. Also the electron E×B drift due to: an electric field which is a combination of an electric field produced by the third and fourth pairs of correcting electrodes, and that produced by the ion beam; and a magnetic field produced by the magnetic poles is oriented in a direction which is opposite to the side of the first and second pairs of correcting electrodes, and which intersects with the ion beam.

By contrast, the electron E×B drift due to an electric field produced by the ion beam, and a magnetic field produced by the magnetic poles is oriented in a direction of the ion beam.

Therefore, electrons in the inter-pole space perform the drift in the direction which is obtained as a result of a combination of two kinds of drifts in respective directions that intersect with the ion beam, and that are opposed to each other in the inlet and the outlet, and the drift in the direction of the ion beam. Accordingly, a closed electron orbit exists in the ion beam and in the vicinity thereof, or namely electrons in a state where the orbit is captured can exist in the ion beam or in the vicinity thereof. Therefore, the loss of electrons from the inter-pole space due to the E×B drift can be reduced, so that the confinement of electrons in the inter-pole space can be improved.

According to a ninth aspect of one or more embodiments of the invention, the first DC correcting power source and the second DC correcting power source may be a same power source.

According to a tenth aspect of one or more embodiments of the invention, the first and second pairs of correcting electrodes are placed in a vicinity of an inlet end of the inter-pole space in the ion beam passing direction, and the third and fourth pairs of correcting electrodes are placed in a vicinity of an outlet end of the inter-pole space in the ion beam passing direction.

According to an eleventh aspect of one or more embodiments of the invention, the first pair of correcting electrodes are placed in a vicinity of an inlet end of the inter-pole space in the ion beam passing direction, the second pair of correcting electrodes are placed outside the inlet end of the inter-pole space in the ion beam passing direction, the third pair of correcting electrodes are placed in a vicinity of an outlet end of the inter-pole space in the ion beam passing direction, and the fourth pair of correcting electrodes are placed outside the outlet end of the inter-pole space in the ion beam passing direction.

According to a twelfth aspect of one or more embodiments of the invention, the electromagnet further may comprise: a first pair of permanent magnets which are placed on or in vicinities of surfaces the first and second magnetic poles, and between the first pair of correcting electrodes and the second pair of correcting electrodes to intersect with the path of the ion beam, the first pair of permanent magnets producing a magnetic field in a direction along which a magnetic field produced by the first and second magnetic poles is enhanced; and a second pair of permanent magnets which are placed on or in vicinities of surfaces the first and second magnetic poles, and between the third pair of correcting electrodes and the fourth pair of correcting electrodes to intersect with the path of the ion beam, the second pair of permanent magnets producing a magnetic field in a direction along which a magnetic field produced by the first and second magnetic poles is enhanced.

According to a thirteenth aspect of one or more embodiments of the invention, an ion beam irradiating apparatus for irradiating a target with an ion beam emitted from an ion source, comprises one or more of the above-described deflecting electromagnets in a path of the ion beam from the ion source to the target.

Various implementations may include one or more the following advantages. For example, the sixth aspect of the invention can attain the following effects.

(1) Since the deflecting electromagnet comprises the potential adjusting electrodes and the potential adjusting power source therefor, electrons in a state where the orbit is captured can exist in the ion beam or in the vicinity thereof. Accordingly, the loss of electrons from the inter-pole space due to the E×B drift can be reduced, and hence the confinement of electrons in the inter-pole space can be improved. As a result, space charges of the ion beam can be efficiently neutralized by the confined electrons, whereby the divergence of the ion beam can be suppressed, and therefore the transportation efficiency of the ion beam can be improved.

(2) Electrons can be confined into the vicinity of the ion beam orbit. Therefore, electrons which are generated from the vicinity of the ion beam by collision of the ion beam with a residual gas can be efficiently confined. Accordingly, the effect that space charges of the ion beam are neutralized is further enhanced.

(3) It is not required to form a complex magnetic field such as a cusp magnetic field. Therefore, the structure of the deflecting electromagnet can be simplified. Furthermore, there is no possibility that the orbit of the ion beam is disturbed by an extra magnetic field.

(4) Electrons which are generated due to the ion beam are confined, and space charges of the ion beam are neutralized. Therefore, it is not required to dispose an electron source which supplies electrons from the surfaces of the magnetic poles or the outside into the inter-pole space. When a large ion beam current flows, moreover, electrons which are generated due to the ion beam are increased, and the neutralization of space charges is spontaneously adjusted. Accordingly, a large control system is not necessary.

(5) Even when the ion beam is scanned, electrons are so light that they are moved while being pulled by the electric field of the ion beam, and the electron drift speed is high. Also in the case where the deflecting electromagnet scans the ion beam, such as the case of a scanning magnet, therefore, it is possible to attain the above-mentioned effects.

According to the seventh aspect of the invention, an orbit which is closed in a space including the inter-pole space can exist more surely in the orbit of the electron E×B drift. Therefore, the electron confining performance can be further enhanced. As a result, space charges of the ion beam can be more efficiently neutralized, whereby the divergence of the ion beam can be further suppressed, and therefore the transportation efficiency of the ion beam can be further improved.

According to the eighth aspect of the invention, since the deflecting electromagnet comprises the correcting electrodes and the correcting power source therefore, electrons in a state where the orbit is captured can exist in the ion beam or in the vicinity thereof. Therefore, the loss of electrons from the inter-pole space due to the E×B drift can be reduced, so that the confinement of electrons in the inter-pole space can be improved. As a result, space charges of the ion beam can be efficiently neutralized by the confined electrons, whereby the divergence of the ion beam can be suppressed, and therefore the transportation efficiency of the ion beam can be improved.

Furthermore, the invention can attain the same effects as (2) to (5) above of the sixth aspect of the invention.

The ninth aspect of the invention can attain a further effect that the configuration of the power source can be simplified.

According to the tenth aspect of the invention, the distances between the first and second pairs of correcting electrodes and the third and fourth pairs of correcting electrodes can be prolonged, and the reciprocal confinement length of electrons along the ion beam passing direction can be made long. Therefore, a region where space charges of the ion beam are neutralized can be widened. As a result, space charges of the ion beam can be more efficiently neutralized, whereby the divergence of the ion beam can be further suppressed, and therefore the transportation efficiency of the ion beam can be further improved.

According to the eleventh aspect of the invention, with using the curvature of magnetic force lines in the vicinities of end portions of the magnetic poles, reduction of the electron E×B drift in the vicinities of the correcting electrodes is suppressed, whereby a weak electron confining region can be reduced. Therefore, the electron confining performance can be further enhanced. Furthermore, the distances between the first and second pairs of correcting electrodes and the third and fourth pairs of correcting electrodes can be prolonged, and the reciprocal confinement length of electrons along the ion beam passing direction can be made long. Therefore, a region where space charges of the ion beam are neutralized can be widened. As a result, space charges of the ion beam can be more efficiently neutralized, whereby the divergence of the ion beam can be further suppressed, and therefore the transportation efficiency of the ion beam can be further improved.

According to the twelfth aspect of the invention, with using the curvature of magnetic force lines produced by the first and second pairs of permanent magnets, reduction of the electron E x B drift in the vicinities of the correcting electrodes is suppressed, whereby a weak electron confining region can be reduced. Moreover, the electron confining region can be expanded by the gradient B drift due to the gradient of the magnetic field produced by the permanent magnets. Therefore, the electron confining performance can be further enhanced. As a result, space charges of the ion beam can be more efficiently neutralized, whereby the divergence of the ion beam can be further suppressed, and therefore the transportation efficiency of the ion beam can be further improved.

The electromagnet of the thirteenth aspect of the invention comprises one or more such deflecting electromagnets, and each of the deflecting electromagnets achieves the above-mentioned effects. Therefore, the transportation efficiency of the ion beam emitted from the ion source to the target can be improved.

DETAILED DESCRIPTION

Figure 1:
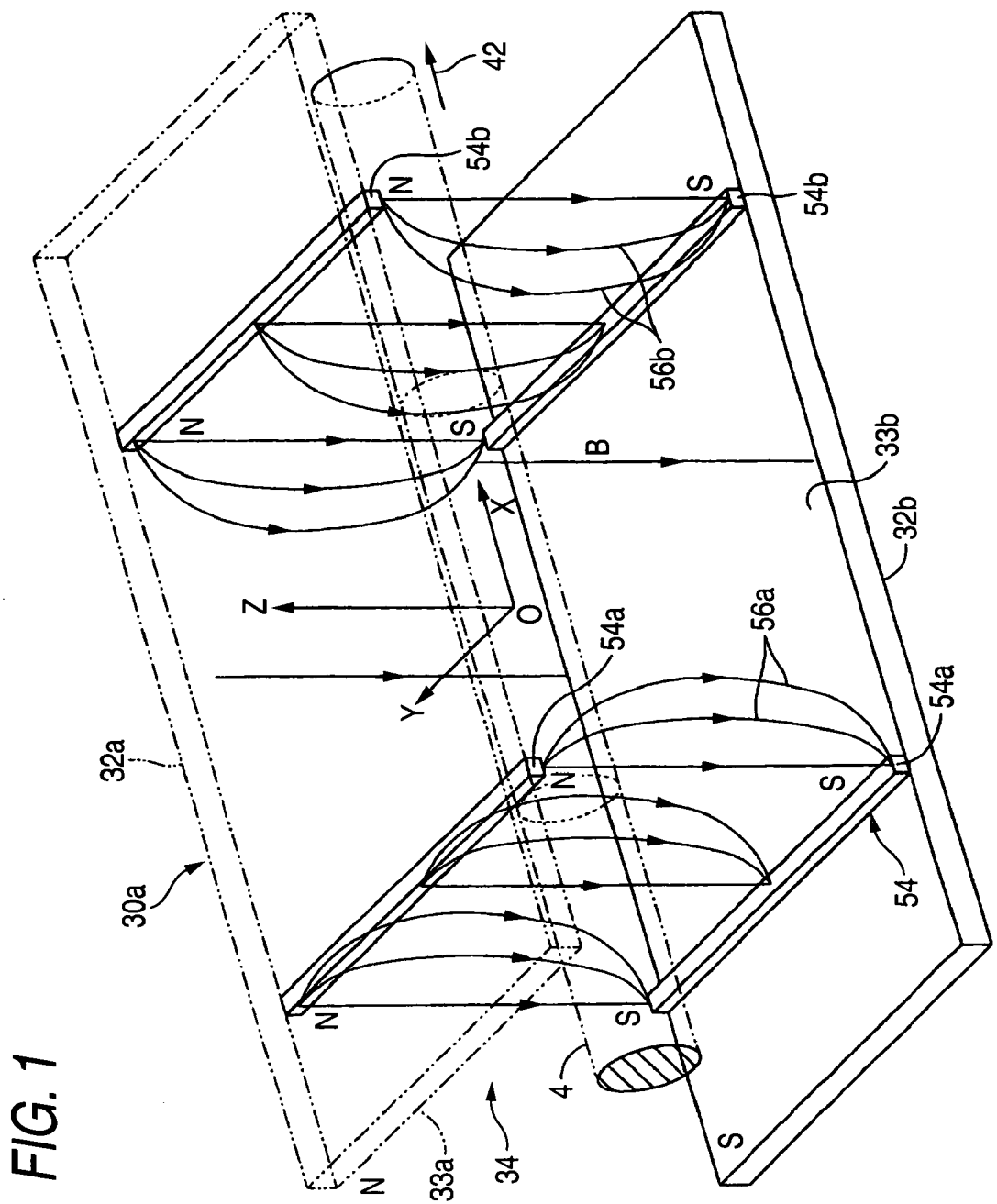
FIG. 1 is a schematic perspective view showing a first embodiment of the deflecting electromagnet of the invention.
Figure 2:
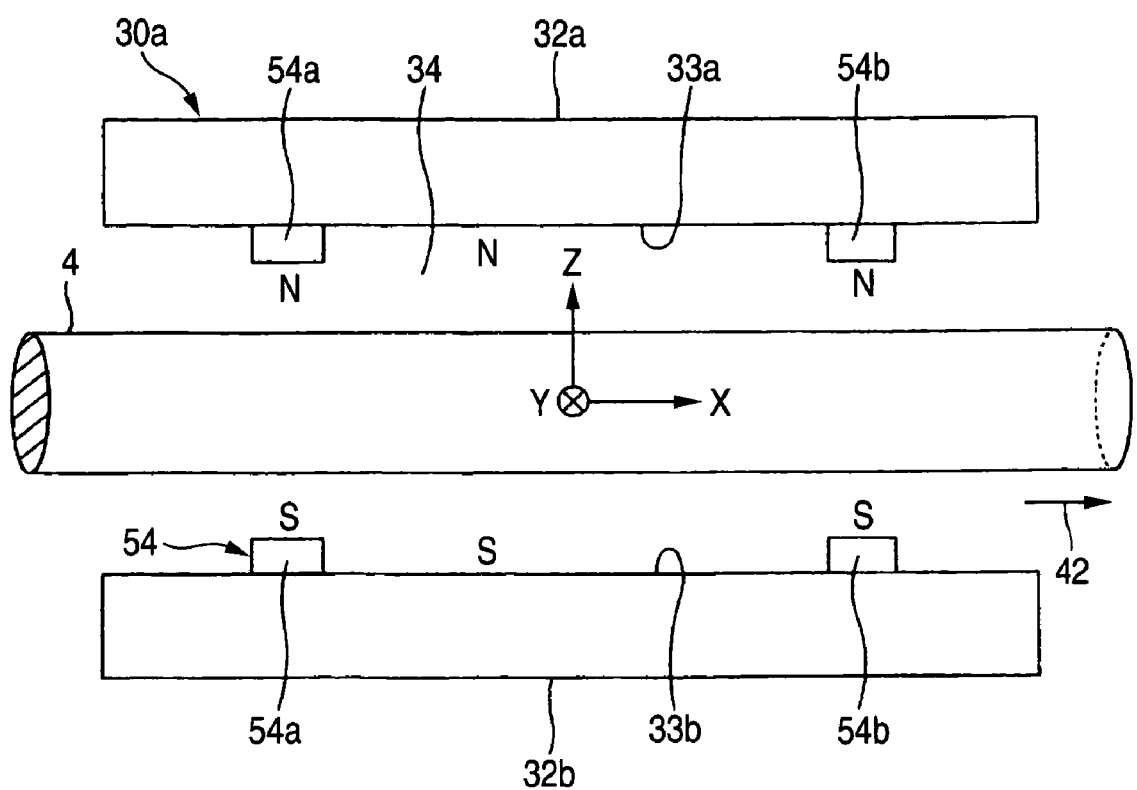
FIG. 2 is a schematic side view in which the deflecting electromagnet of FIG. 1 is seen from the lateral side of an ion beam passing direction, and illustration of magnetic force lines is omitted.
Figure 51:
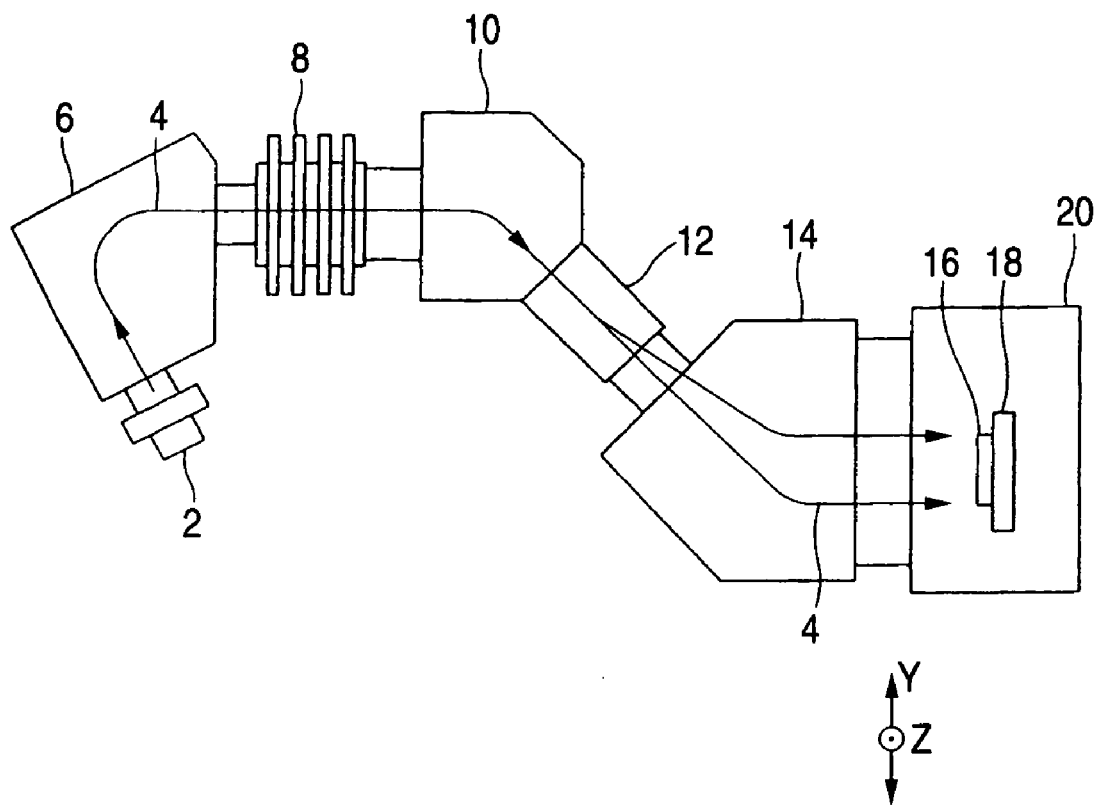
FIG. 51 is a schematic plan view showing an example of an ion beam irradiating apparatus.
Figure 52:
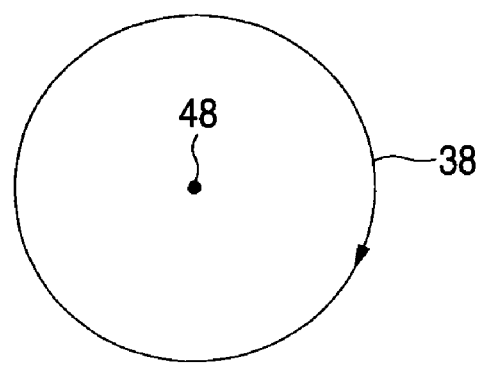
FIG. 52 is a diagram schematically showing the cyclotron motion of electrons.
Figure 53:
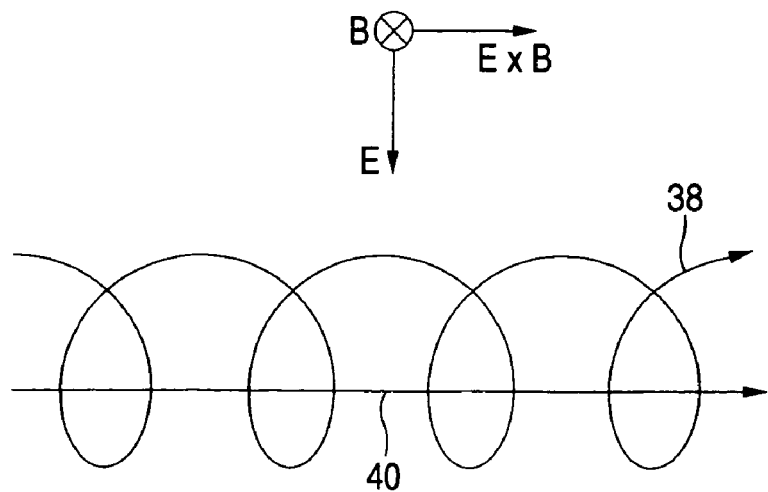
FIG. 53 is a diagram schematically showing the E×B drift of electrons.
Figure 54:
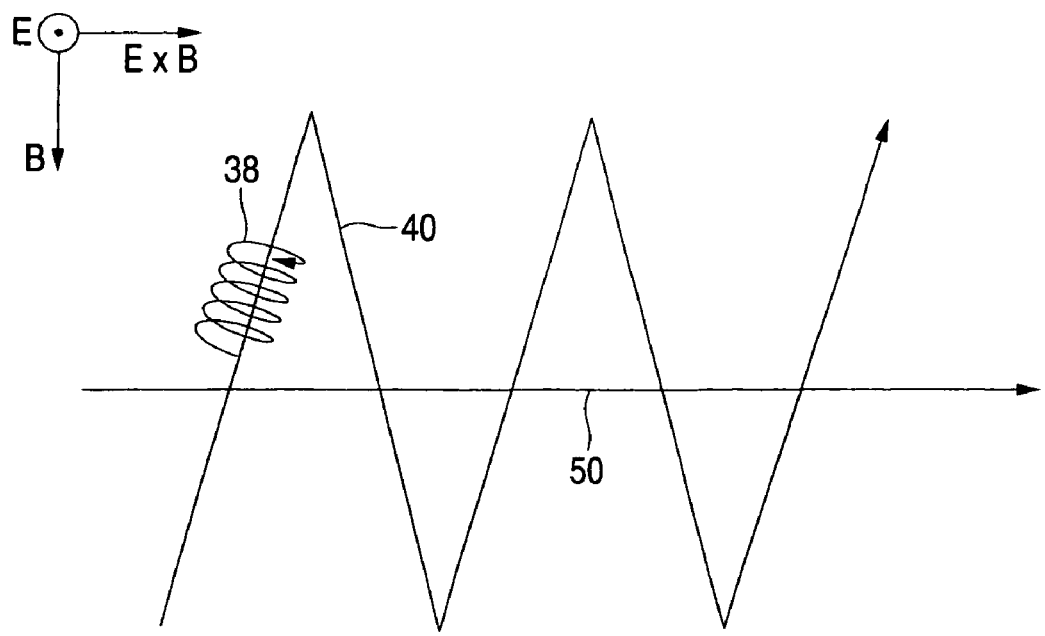
FIG. 54 is a diagram schematically showing the E×B drift of electrons between magnetic poles.
Figure 55:
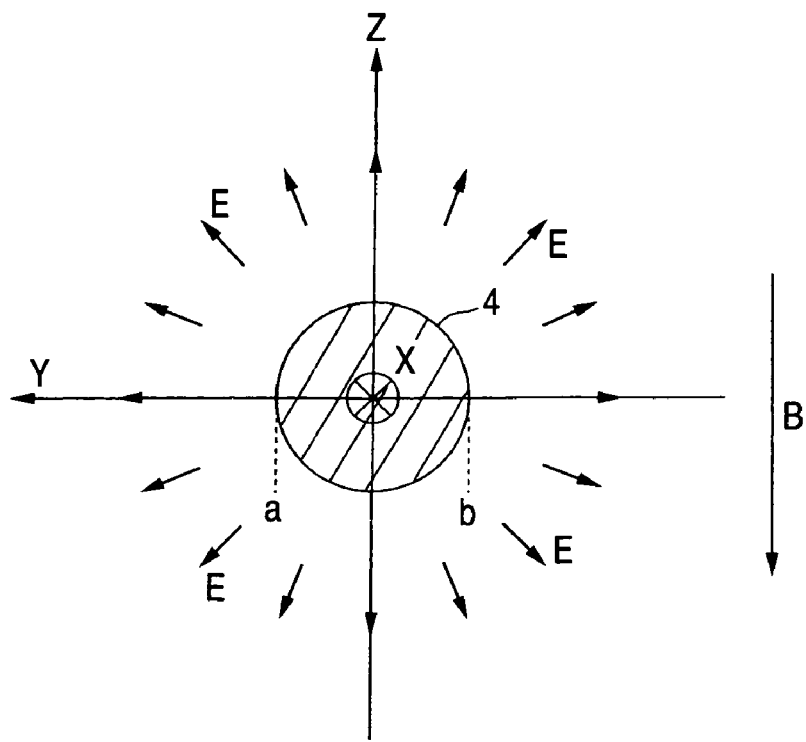
FIG. 55 is a diagram schematically showing an electric field produced by an ion beam.
Figure 58:
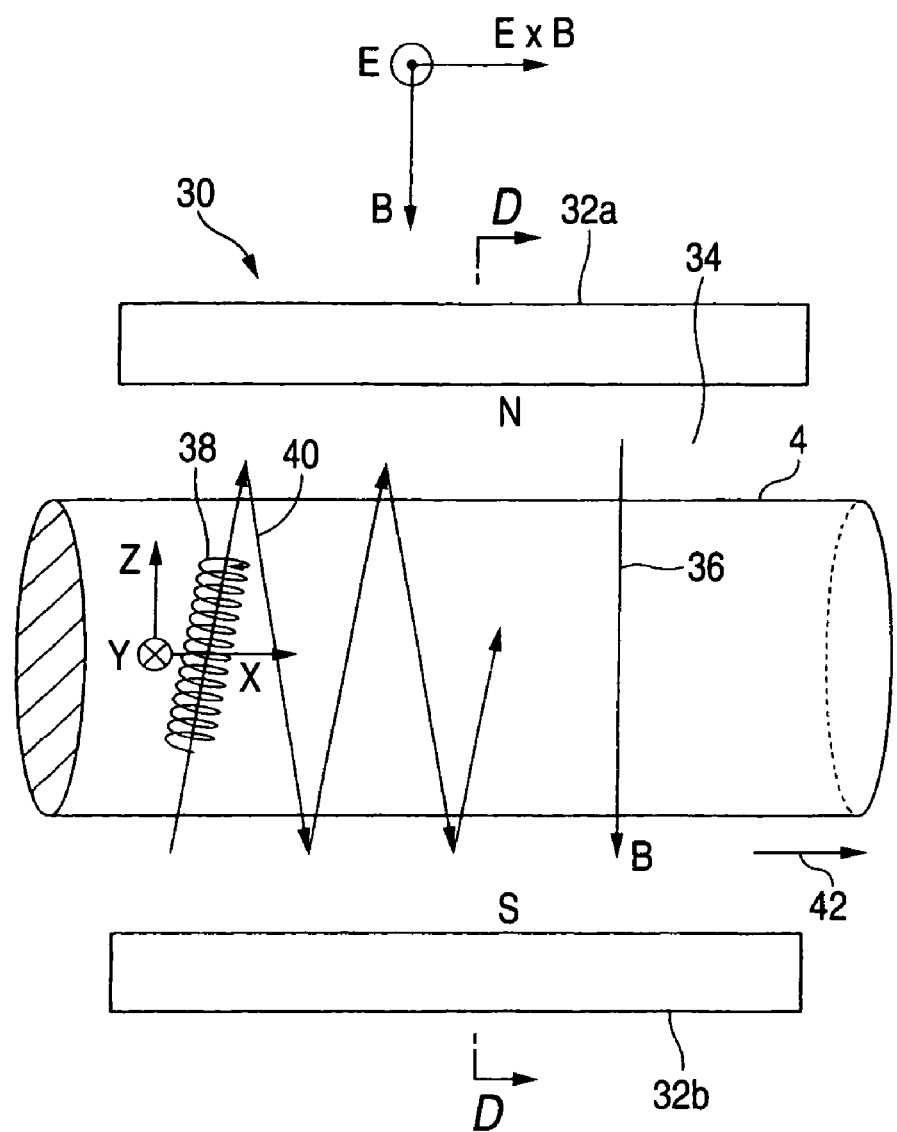
FIG. 58 is a side view schematically showing the E×B drift of electrons in a related-art deflecting electromagnet.
Figure 59:
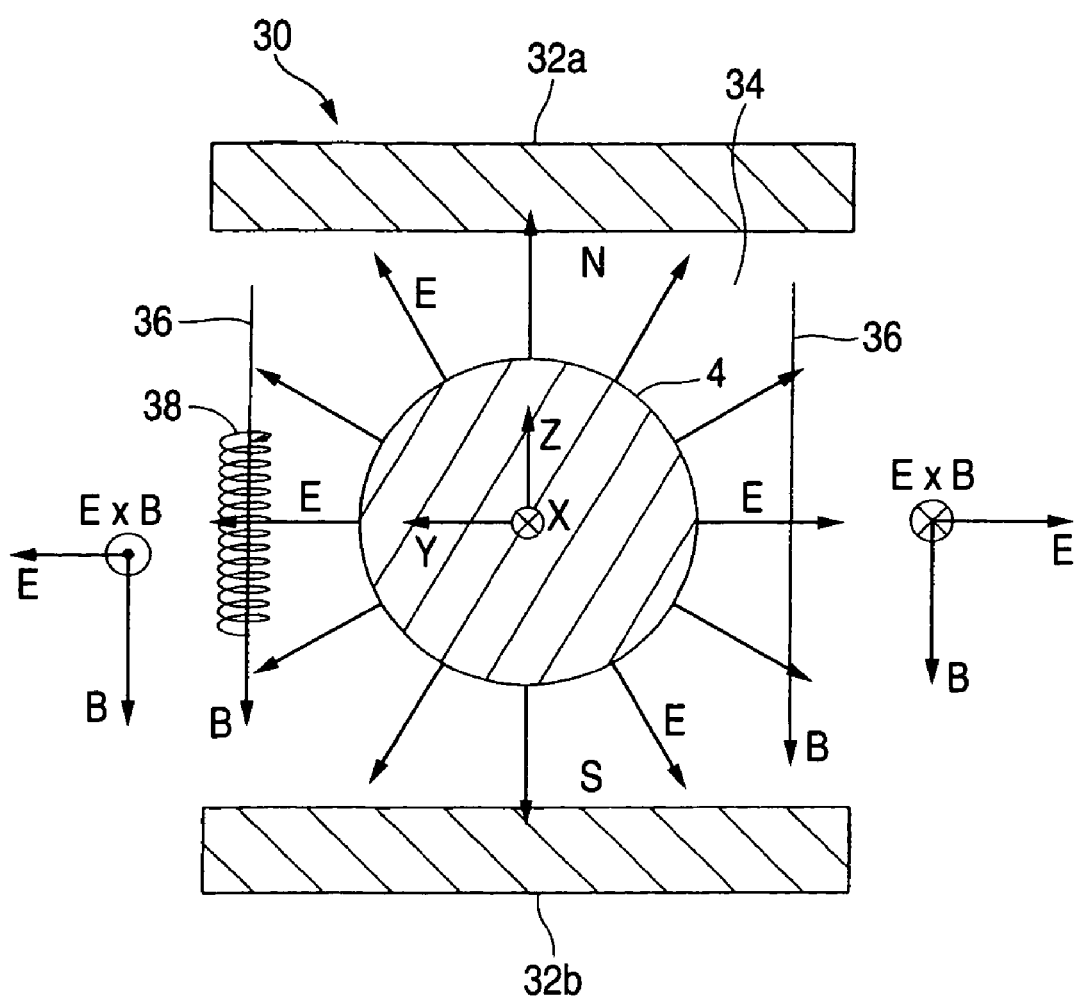
FIG. 59 is a section view taken along the line D-D of FIG. 58.
Figure 60:
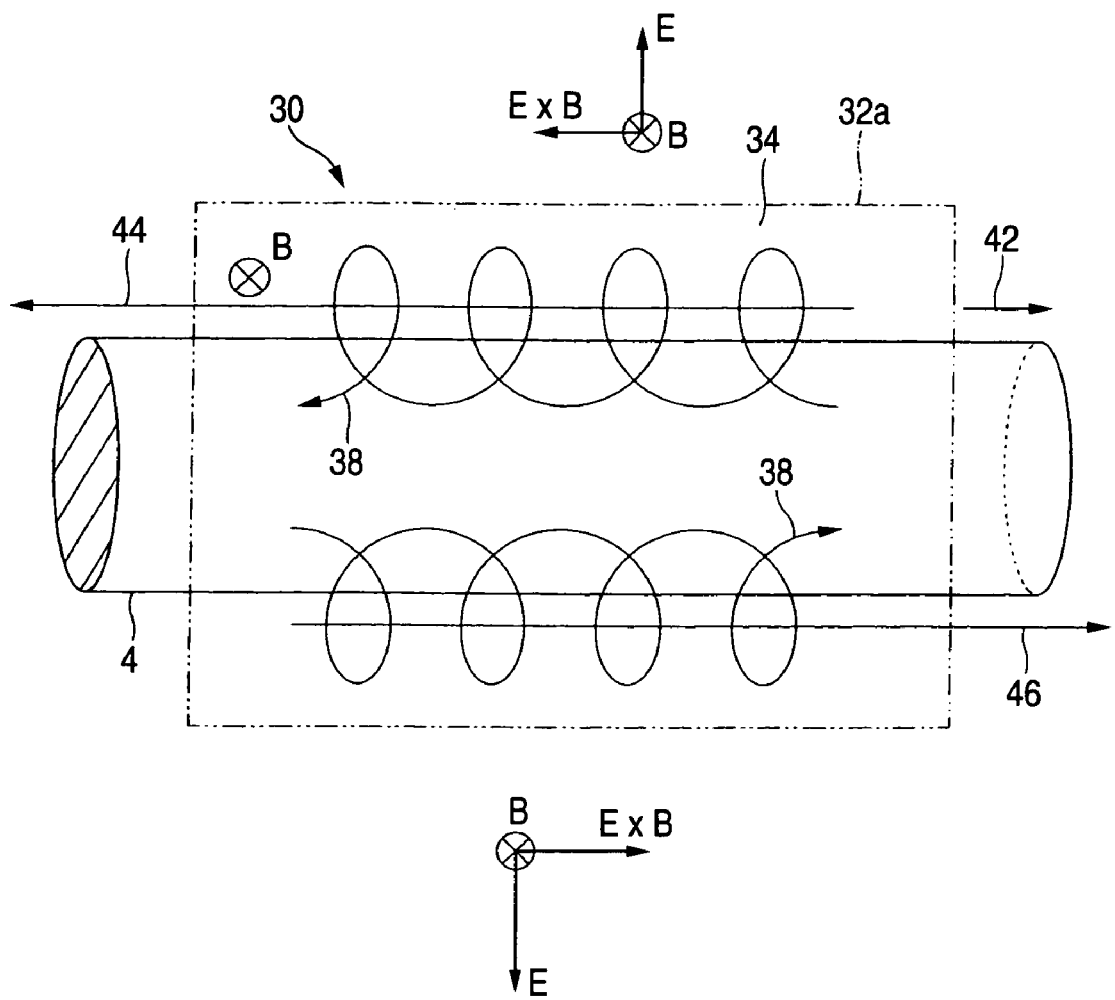
FIG. 60 is a plan view schematically showing a loss due to the E×B drift of electrons in the related-art deflecting electromagnet.

FIG. 1 is a schematic perspective view showing a first embodiment of the deflecting electromagnet of the invention, and FIG. 2 is a schematic side view in which the deflecting electromagnet of FIG. 51 is seen from the lateral side of an ion beam passing direction, and illustration of magnetic force lines is omitted. The components which are identical or corresponding to those of the related-art example shown in FIGS. 58 to 60 are denoted by the same reference numerals. Hereinafter, description is made with placing emphasis on differences between the embodiment and the related-art example.

The deflecting electromagnet 30a comprises a permanent-magnet group 54 for, in an inter-pole space 34 between the first magnetic pole 32a and the second magnetic pole 32b, forming a mirror magnetic field in which the intensity is relatively low in the vicinity of the middle of the inter-pole space 34 in the ion beam passing direction, and the intensities in locations which are respectively nearer to the inlet and the outlet are relatively higher than the intensity in the vicinity of the middle.

In the embodiment, the permanent-magnet group 54 comprises a first pair of permanent magnets 54a and a second pair of permanent magnets 54b.

In the embodiment, the first pair of permanent magnets 54a are respectively placed on the surfaces 33a, 33b of the magnetic poles 32a, 32b, and in locations of the inter-pole space 34 which are nearer to an inlet with respect to the middle in the ion beam passing direction, specifically, in the vicinity of the inlet of the inter-pole space 34 to intersect with a path of the ion beam 4. The permanent magnets produce a magnetic field in a direction along which a magnetic field produced by the magnetic poles 32a, 32b is enhanced. Namely, the polarities of the faces of the upper and lower permanent magnets 54a which are oriented to the ion beam 4 are identical with those of the surfaces 33a, 33b of the magnetic poles 32a, 32b, respectively. Each of the permanent magnets 54a has a rod-like shape which extends in a direction intersecting with the passing direction of the ion beam 4.

In the embodiment, the second pair of permanent magnets 54b are respectively placed on the surfaces 33a, 33b of the magnetic poles 32a, 32b, and in locations of the inter-pole space 34 which are nearer to an outlet with respect to the middle in the ion beam passing direction, specifically, in the vicinity of the outlet of the inter-pole space 34 to intersect with the path of the ion beam 4. The permanent magnets produce a magnetic field in a direction along which the magnetic field produced by the magnetic poles 32a, 32b is enhanced. Namely, the polarities of the faces of the upper and lower permanent magnets 54b which are oriented to the ion beam 4 are identical with those of the surfaces 33a, 33b of the magnetic poles 32a, 32b, respectively. Each of the permanent magnets 54b has a rod-like shape which extends in a direction intersecting with the passing direction of the ion beam 4.

Examples of the polarities of the magnetic poles 32a, 32b and the permanent magnets 54a, 54b are illustrated in FIGS. 1 and 2, etc. Alternatively, all of the polarities may be opposed to the illustrated ones. This is similarly applied to an embodiment shown in FIG. 11. Furthermore, the same is applicable also to permanent magnets 64a, 64b shown in FIG. 11.

The permanent magnets 54a, 54b may not be placed on the surfaces 33a, 33b of the magnetic poles 32a, 32b, and may be placed in the vicinities of the surfaces 33a, 33b. This is similarly applied to the embodiment shown in FIG. 11. Furthermore, the same is applicable also to the permanent magnets 64a, 64b shown in FIG. 11.

The manner of illustrating FIG. 1 and subsequent figures will be described. In order to facilitate the illustration of the permanent magnets 54a, 54b, 64a, 64b, the magnetic pole 32a which is in the upper side is sometimes indicated by phantom lines. For the sake of convenience, the ion beam 4 is illustrated as a cylindrical shape. However, the shape is not restricted to this. Although the ion beam 4 is originally bent by the magnetic field produced by the magnetic poles 32a, 32b, the bend due to the magnetic field is ignored, and the ion beam is indicated by straight lines in order to simplify the illustration.

For the sake of simplicity, several magnetic force lines 56a, 56b which indicate the mirror magnetic field formed by the permanent magnets 54a, 54b, and which are bent to the inside of the inter-pole space 34 are illustrated. Actually, many magnetic force lines exist, and also those which are outwardly bent exist. For the sake of convenience in description, coordinate axes X, Y, Z which are orthogonal to one another are set in the inter-pole space 34 of the deflecting electromagnet 30a, as shown in FIG. 1, etc. Namely, the center coordinate of the inter-pole space 34 is set as the original O, a direction which is oriented in the passing direction 42 of the ion beam 4 is set as the X-axis, a direction which is laterally orthogonal to the X-axis is set as the Y-axis, and a direction which is longitudinally orthogonal to the X-axis (i.e., the vertical direction between the magnetic poles 32a, 32b) is set as the Z-axis.

In the related-art deflecting electromagnet 30 shown in FIGS. 58 to 60, only the magnetic field due to the magnetic poles 32a, 32b contributes to the production of the E×B drift. By contrast, in the deflecting electromagnet 30a shown in FIGS. 1 and 2, the magnetic field produced by the permanent magnets 54a, 54b is superimposed on that produced by the magnetic poles 32a, 32b to form the composite magnetic field B. However, the E×B drift (i.e., E×$B_z$ drift) of the electrons 38 (if not illustrated, see FIGS. 58 to 60, and FIGS. 14 to 17, and the same will apply hereinafter) with respect to the Z-direction component $B_z$ of the composite magnetic field B is the same phenomenon as that in the related-art deflecting electromagnet 30. As described above, for example, the electrons 38 are secondary electrons which are generated by collision of part of the periphery of the ion beam 4 with a wall face or the like constituting the inter-pole space 34, or electrons which are generated by ionization caused by collision of a residual gas in the inter-pole space 34 with the ion beam 4.

Figure 3:
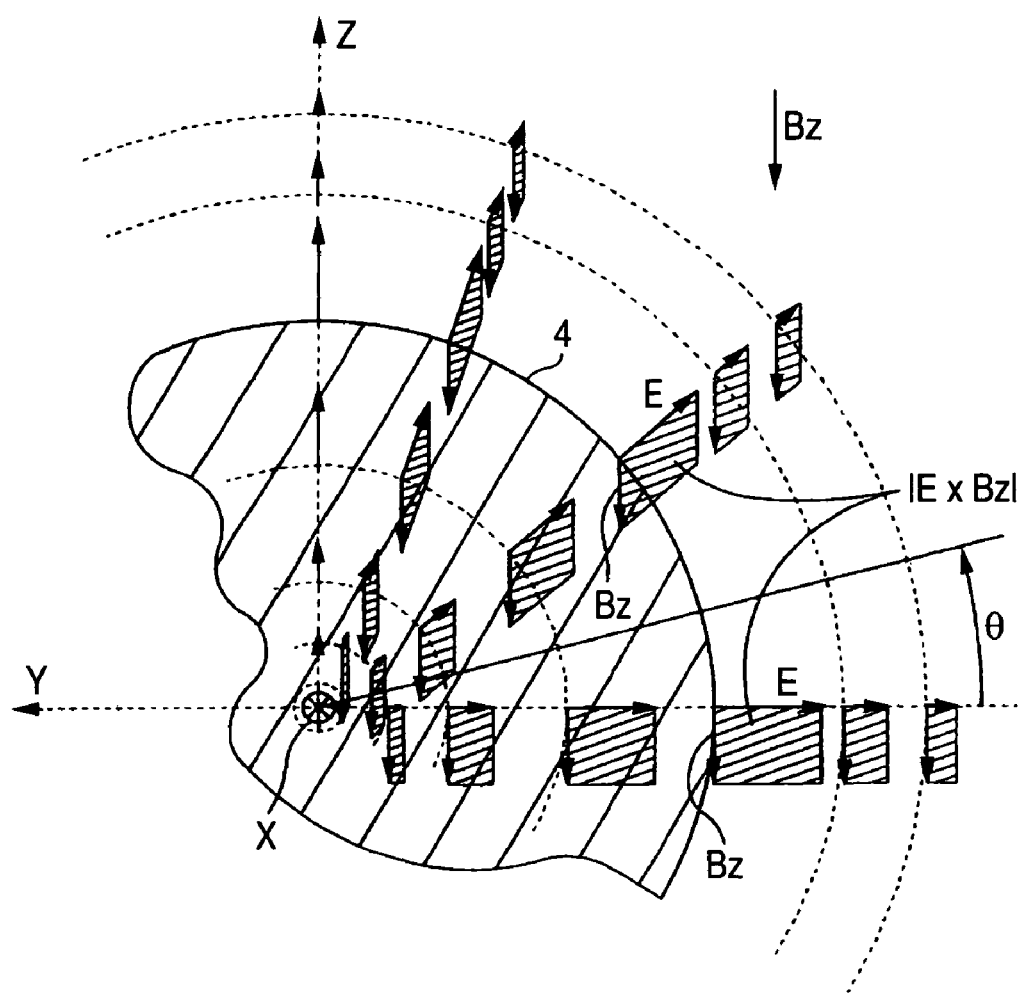
FIG. 3 is a diagram schematically showing the magnitude of the E×B$_z$ drift of electrons in the deflecting electromagnet shown FIG. 1.
Figure 4:
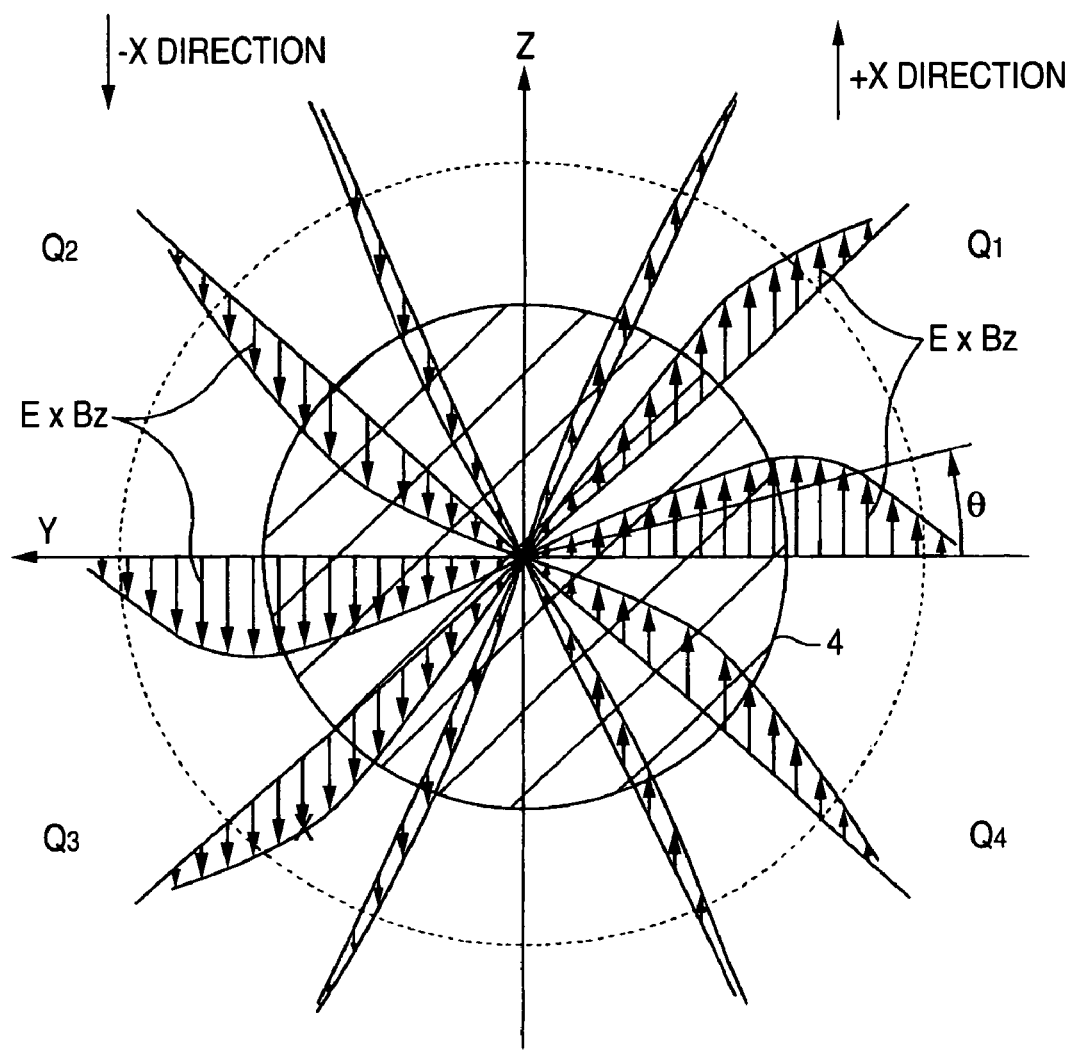
FIG. 4 is a diagram schematically showing the direction and magnitude distribution of the E×B$_z$ drift shown in FIG. 3.

In FIG. 3, the magnitude |E×$B_z$| of the E×$B_z$ drift is indicated by the area of a hatched parallelogram. FIG. 4 shows the direction and magnitude distribution of the E×$B_z$ drift. The magnitude distribution of the drift has the maximum value in the vicinity of the maximum value of the electric field E in a radial direction of the ion beam 4 (namely, in the vicinity of an end portion of the ion beam 4, see FIG. 56). In the XZ-plane which passes through the center of the ion beam 4, E×B is zero, and hence a drift does not occur.

As shown in FIG. 3, when a deflection angle θ from the Y-axis is considered, the magnitude of the E×$B_z$ drift is changed in accordance with cos θ, and changed in a radial direction of the ion beam 4 in accordance with the magnitude of the electric field E.

The electrons 38 drift in the positive X direction in the first and fourth quadrants $Q_1$, $Q_4$ of FIG. 4, and in the negative X direction in the second and third quadrants $Q_2$, $Q_3$. As described above, this is the E×$B_z$ drift due to the magnetic field component $B_z$ which is substantially perpendicular to the magnetic poles 32a, 32b.

By contrast, in the vicinities of the permanent magnets 54a, 54b, the permanent magnets 54a, 54b form a mirror magnetic field, and hence also the E×B drift (i.e., E×$B_x$ drift) produced by the magnetic field component $B_x$ which is substantially parallel to the magnetic poles 32a, 32b occurs. This will be described below.

Figure 5:
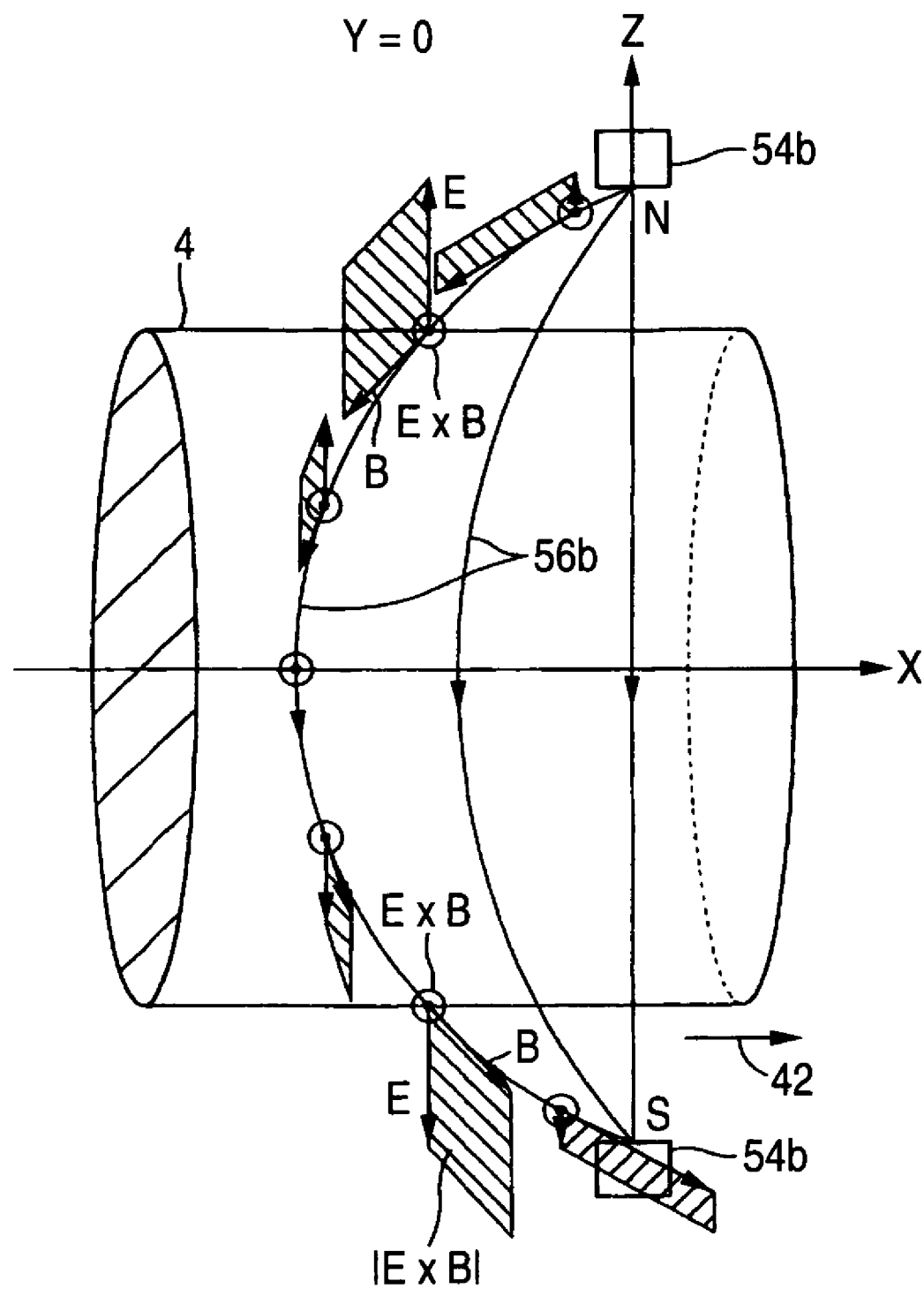
FIG. 5 is a diagram schematically showing the E×B drift of electrons due to a mirror magnetic field in the deflecting electromagnet shown FIG. 1.

FIG. 5 is a diagram of the ion beam 4 which is seen from the lateral side in the vicinity of the permanent magnets 54b on the outlet side, and which shows several of the magnetic force lines 56b produced by the paired permanent magnets 54b. Since the permanent magnets 54b form the mirror magnetic field, also the composite magnetic field B of the magnetic field produced by the magnetic poles 32a, 32b and that produced by the paired permanent magnets 54b is formed as a mirror magnetic field. The mirror magnetic field B is bent toward the inside of the inter-pole space 34, and hence has the magnetic field component $B_z$ which is substantially perpendicular to the magnetic poles 32a, 32b, and the magnetic field component $B_x$ which is substantially parallel to the magnetic poles. Because of the magnetic field component $B_x$, a drift component in the −Y direction is produced on the Z-axis (i.e., Y=0).

Figure 6:
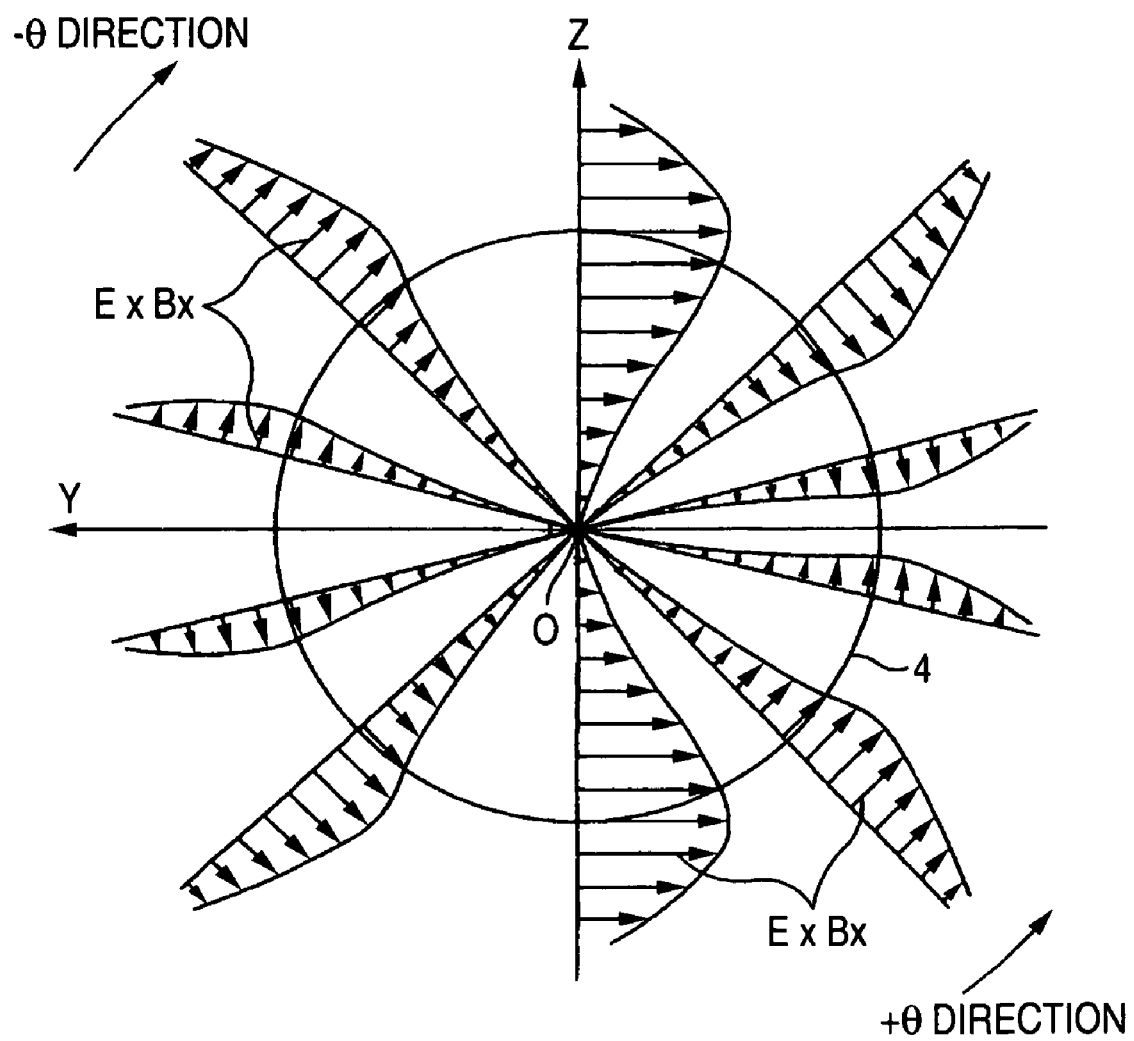
FIG. 6 is a diagram schematically showing the distribution of the E×B drift shown in FIG. 5 in the YZ-plane.

As described above, the electric field E is formed so as to radiate in a radial direction of the ion beam 4. As shown in FIG. 6, in the YZ-plane, eventually, the E×$B_x$ drift of the electrons 38 occurs in the −θ direction in the upper side of the Y-axis, and in the +θ direction in the lower side of the Y-axis. The drift does not occur on the Y-axis. Similarly, the E×$B_x$ drift occurs also in the vicinities of the permanent magnets 54a on the inlet side. However, the mirror magnetic field is bent in the opposite direction, and hence the direction of the drift is opposite to that on the outlet side (see FIG. 9).

Furthermore, the composite magnetic field B in the vicinities of the permanent magnets 54a, 54b is stronger than that in the vicinity of the Y-axis. Therefore, the intensity of the magnetic field B is nonuniform, the Lamor radius of the electrons 38 is changed depending on the location, and there occurs a phenomenon that the cyclotron motion is shifted and the electrons 38 are caused to drift. This phenomenon is called a gradient B drift. Naturally, the phenomenon appears more strongly in the vicinities of the permanent magnets 54a, 54b.

Figure 7:
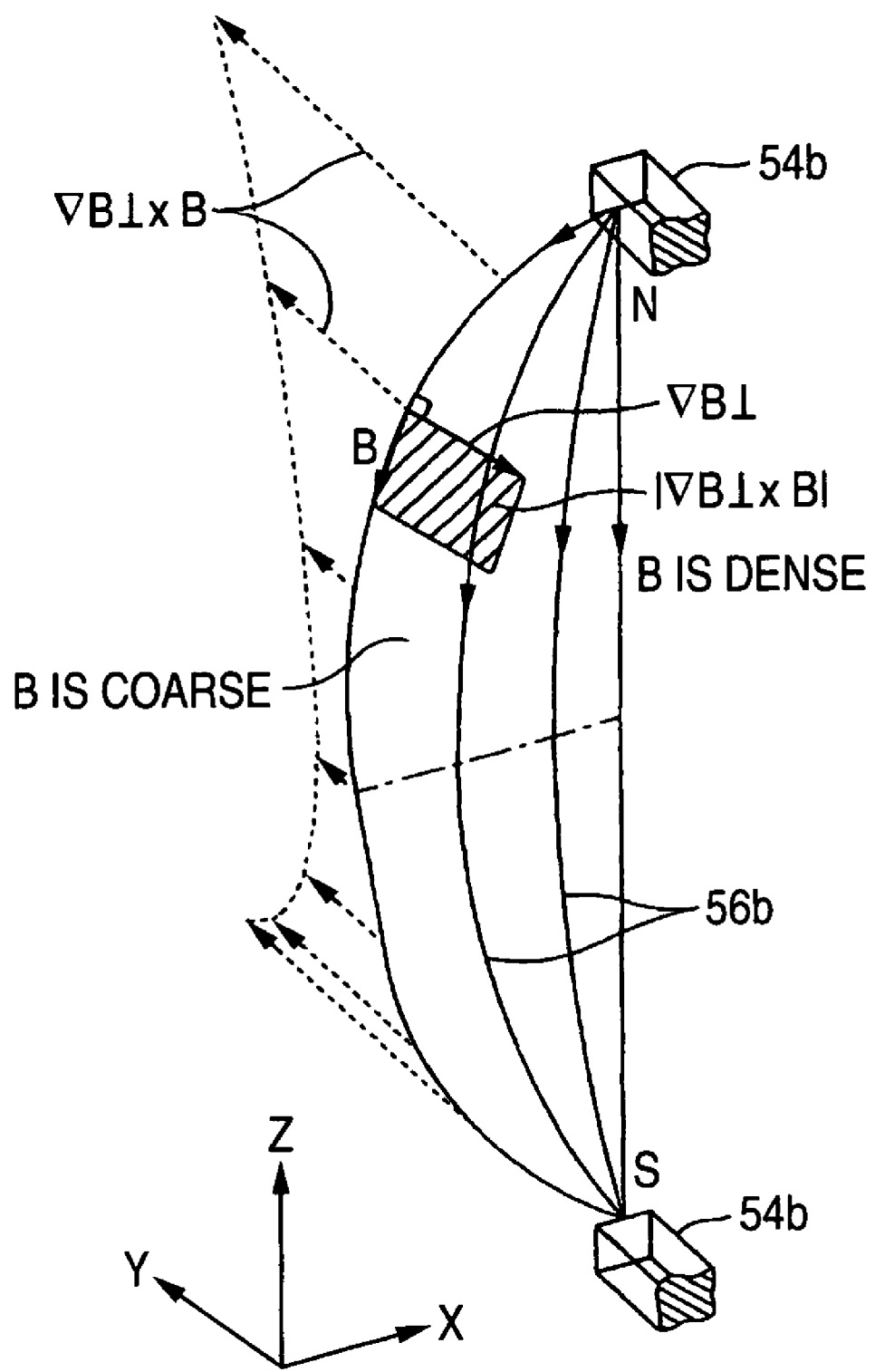
FIG. 7 is a diagram which schematically shows the gradient B drift of electrons due to a mirror magnetic field in the deflecting electromagnet shown FIG. 1, and in which only magnetic force lines on one side of the X direction are shown.

In FIG. 7, a component of the gradient ∇B of the magnetic field B which is perpendicular to the magnetic force lines 56b is indicated by ∇B⊥. In FIG. 7, only the magnetic force lines 56b which are bent in the inward direction of the inter-pole space 34 (in other words, in the −X direction) are shown. However, there are also magnetic force lines which are bent in the outward direction of the inter-pole space 34 (in other words, in the +X direction). The magnetic field density gradient ∇B can be split into the component ∇B⊥ which is perpendicular to the magnetic force lines 56b, and a component ∇B∥ which is parallel to the magnetic force lines. Since ∇B∥×B=0, however, it is requested to consider only the vertical component ∇B⊥. Therefore, the ∇B⊥×B drift due to the component is hereinafter referred to as the gradient B drift. The magnetic force lines 56b are bent in the inward direction of the inter-pole space 34 because of the mirror magnetic field. Therefore, the gradient B drift is oriented in the +Y direction. Of course, the drift is not affected by an electric field.

Figures 8A, 8B, 8C:
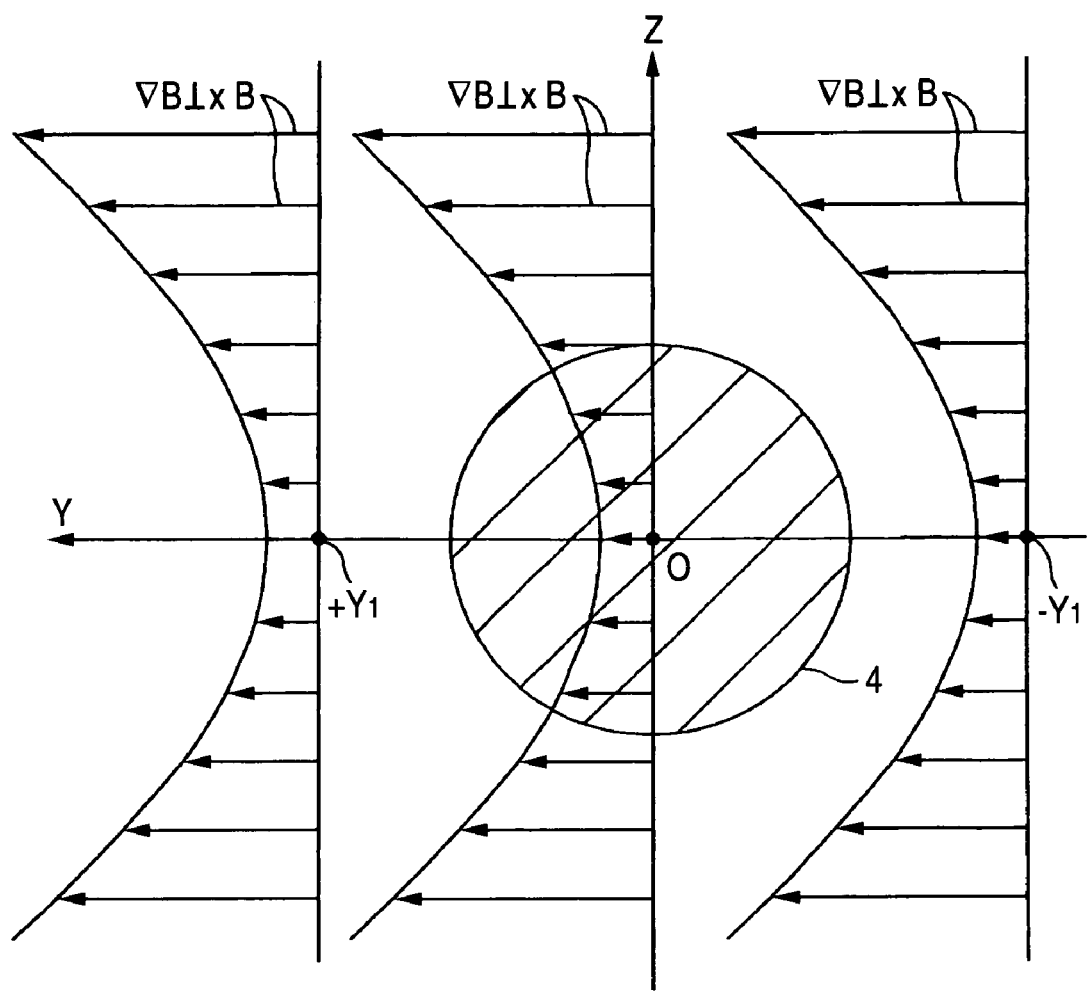
FIGS. 8A to 8C are diagrams schematically showing distributions at different Y-coordinate positions of the gradient B drift shown in FIG. 7.

As shown in FIGS. 8A to 8C, the magnitude and direction of the gradient B drift (∇B⊥×B drift) have a minimum value on the Y-axis, and are maximum in the vicinities of the upper and lower permanent magnets 54b. The shape of the mirror magnetic field is not changed in the Y-axis direction, i.e., the longitudinal direction of the rod-like permanent magnets 54b. As shown in FIGS. 8A to 8C of the figure, therefore, the drift is not changed depending on the Y-coordinate position (for example, +$Y_1$, 0, −$Y_1$). Similarly, the gradient B drift occurs also in the vicinities of the permanent magnets 54a on the inlet side. However, the mirror magnetic field is bent in the opposite direction, and hence the direction of the drift is opposite to that on the outlet side (see FIG. 9).

Figure 9:
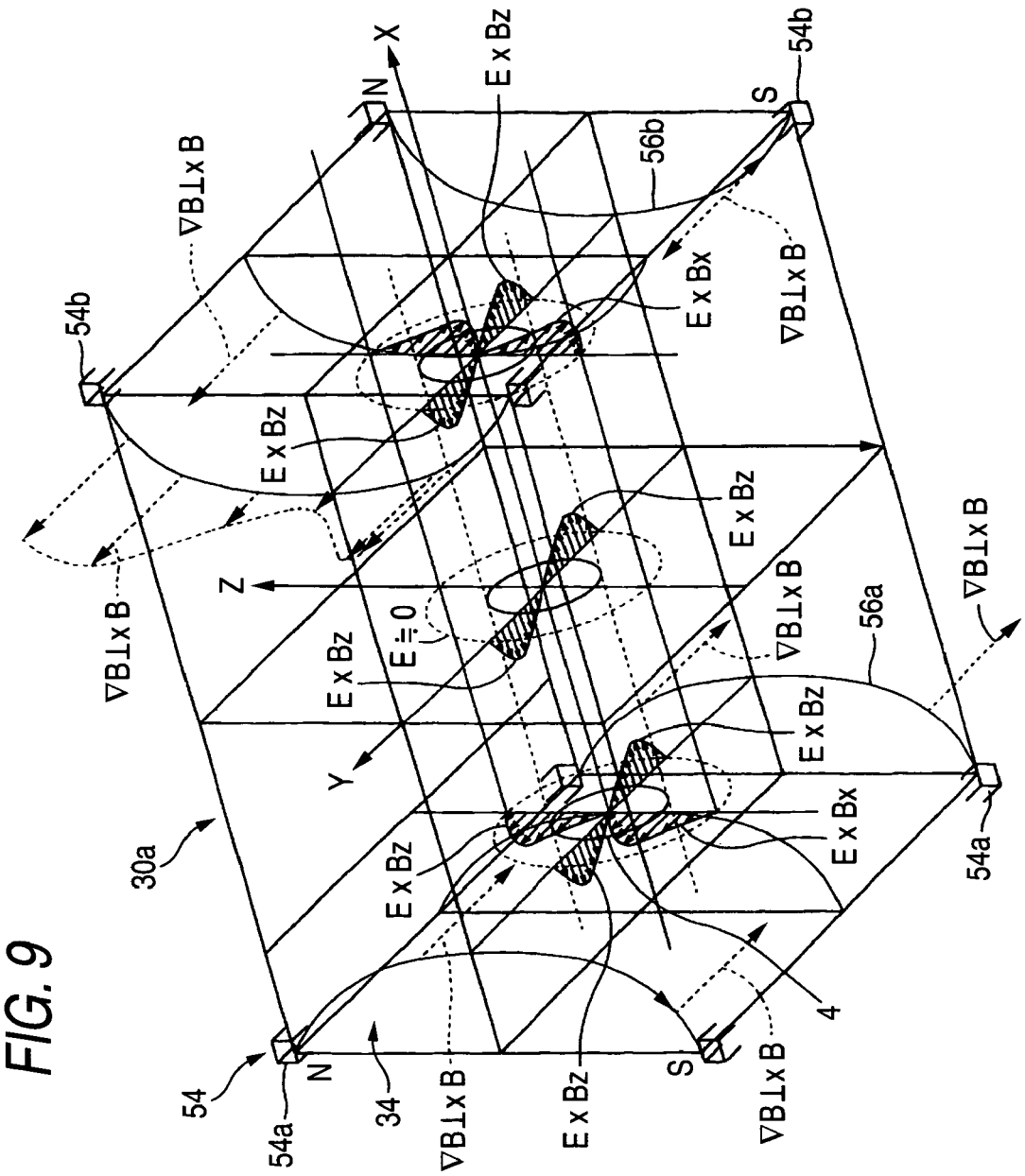
FIG. 9 is a diagram schematically showing drifts of electrons in the deflecting electromagnet shown in FIG. 1.

The above-described drifts of the electrons 38 in the vicinities of the both ends (inlet and outlet ends) of the inter-pole space 34 in the passing direction of the ion beam 4 and the vicinity of the middle of the inter-pole space 34 are collectively shown in FIG. 9. In the vicinity of the middle, influences of the permanent magnets 54a, 54b can be ignored, and only the drift in the X direction exists. In the vicinity of the outlet end, the drifts in the X, θ (particularly, the −Y direction on the XZ-plane), and Y directions overlap with one another. The drifts are the E×$B_z$ drift, the E×$B_x$ drift, and the gradient B drift (∇B⊥×B drift) which are described above, respectively. Also in the vicinity of the inlet end, similar drifts overlap with one another. The θ-direction component of the E×$B_x$ drift, and the Y-direction component of the gradient B drift (∇B⊥×B drift) in the vicinity of the inlet end are opposed to those in the vicinity of the outlet end. The X-direction component of the E×$B_z$ drift is negative or positive when Y is positive or negative.

Figure 10:
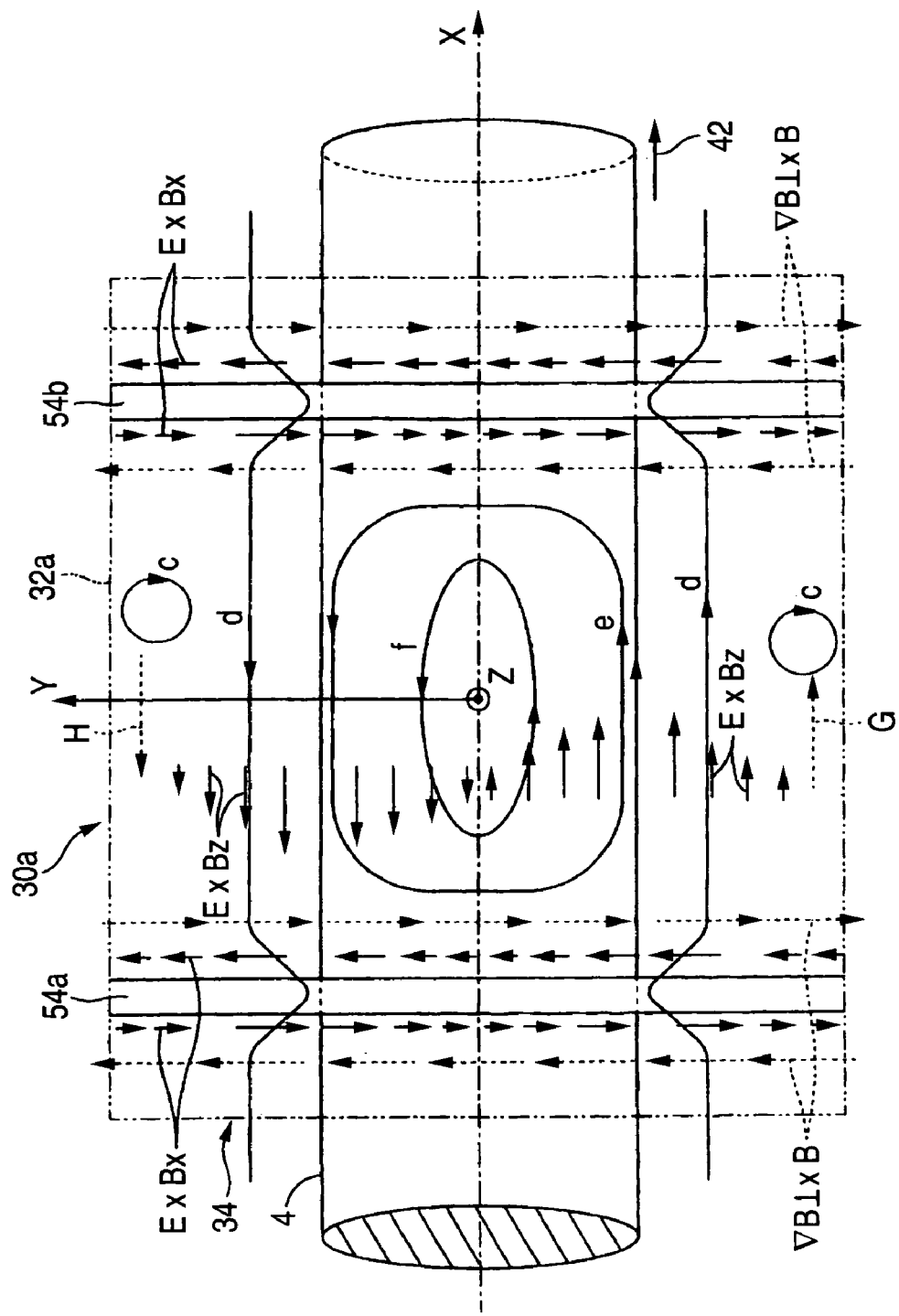
FIG. 10 is a plan view schematically showing averages of drifts of electrons and average orbits of the drifts in the deflecting electromagnet shown in FIG. 1.

In FIG. 10, the averages of the drifts are indicated by arrows. Furthermore, average orbits of the drifts of the electrons 38 in several typical cases are schematically shown. The orbit c is produced in the case where the orbit is separated from the ion beam 4, the electric field E is therefore negligible, and the drift is vertically moved while performing circular motion. The orbit d is produced in the case where the E×$B_z$ drift in the X direction is large in the vicinities of the outsides of the right and left ends of the ion beam 4, and, even when the orbit in the gradient B drift in the Y direction approaches the inside, the orbit is again pushed out toward the outside by the opposite E×$B_x$ drift in the Y direction. The electrons 38 of the orbit d flow out in the X direction from the inter-pole space 34, resulting in a failure to confine the electrons of the orbit d in the inter-pole space 34. The orbit e is produced in the case where the orbit is slightly inner than the right and left ends of the ion beam 4, the E×$B_z$ drift in the X direction and the E×$B_x$ drift in the Y direction are therefore reduced, the gradient B drift in the Y direction is hence superior, the electrons 38 enter inside the ion beam 4, .and the orbit is captured, so that the electrons are confined. In a further inner orbit such as the orbit f, the electric field E is near zero, and hence the E×$B_z$ drift in the X direction and the E×$B_x$ drift in the Y direction are small. Therefore, such an orbit is a thin orbit which is closed in the vicinity of the axis of the ion beam 4.

As a result of combination of the drifts, a closed orbit of the electrons 38 exists in or in the vicinity of the ion beam 4. Namely, the electrons 38 in a state where the orbit is captured can exist in the ion beam or in the vicinity thereof. Accordingly, the loss of the electrons 38 from the inter-pole space 38 due to the E×B drift can be reduced, and hence the confinement of the electrons 38 in the inter-pole space 34 can be improved.

As a result, space charges of the ion beam 4 can be efficiently neutralized by the confined electrons 38, whereby the divergence of the ion beam 4 can be suppressed, and therefore the transportation efficiency of the ion beam 4 can be improved.

The electrons 38 can be confined into the vicinity of the ion beam orbit. Therefore, electrons which are generated from the vicinity of the ion beam 4 by collision of the ion beam with a residual gas can be efficiently confined. Accordingly, the effect that space charges of the ion beam 4 are neutralized is further enhanced.

As compared with the case where a cusp magnetic field is formed along an ion beam line as in the related-art example, the number of permanent magnets in the case where a mirror magnetic field such as described above is formed can be greatly reduced. In the embodiment, for example, only two pairs (namely, four) of the permanent magnets 54a, 54b are required. Therefore, the structure of the deflecting electromagnet 30a can be simplified.

Electrons which are generated due to the ion beam 4, namely, secondary electrons which are generated by collision of part of the periphery of the ion beam 4 with a wall face or the like constituting the inter-pole space 34, or electrons which are generated by ionization caused by collision of a residual gas in the inter-pole space 34 with the ion beam 4 are confined to neutralize space charges of the ion beam 4. Therefore, it is not required to dispose an electron source which supplies electrons from the surfaces of the magnetic poles or the outside into the inter-pole space 34. When a large ion beam current flows, moreover, electrons which are generated due to the ion beam 4 are increased, and the neutralization of space charges is spontaneously adjusted. Accordingly, a large control system is not necessary.

Even when the ion beam 4 is scanned, electrons are so light that they are moved while being pulled by the electric field of the ion beam 4, and the electron drift speed is high. Also in the case where the deflecting electromagnet 30a scans the ion beam 4, such as the case of a scanning magnet, therefore, it is possible to attain the above-mentioned effects.

FIG. 2 is a schematic perspective view showing a second embodiment of the deflecting electromagnet of the invention. Hereinafter, description is made with placing emphasis on differences between this embodiment and the first embodiment shown in FIGS. 1 and 2.

The deflecting electromagnet 30b further comprises, in addition to the permanent-magnet group 54, a second permanent-magnet group 64 for, in the inter-pole space 34, forming a second mirror magnetic field in which the intensity is relatively low in the vicinity of the middle of the inter-pole space 34 in a direction (namely, the Y direction) intersecting with the ion beam passing direction, and the intensities in locations which are respectively nearer to both ends are relatively higher than the intensity in the vicinity of the middle.

In the embodiment, the permanent-magnet group 64 comprises a third pair of permanent magnets 64a and a fourth pair of permanent magnets 64b.

In the embodiment, the third and fourth pairs of permanent magnets 64a, 64b are placed on the surfaces 33a, 33b of the magnetic poles 32a, 32b, and in locations of the inter-pole space 34 which are nearer to the both ends with respect to the middle in the direction (namely, the Y direction) intersecting with the ion beam passing direction, specifically, in the vicinities of the both ends so as to extend along the path of the ion beam 4. The permanent magnets produce magnetic fields in a direction along which the magnetic field produced by the magnetic poles 32a, 32b is enhanced. Namely, the polarities of the faces of the upper and lower permanent magnets 64a, 64b which are oriented to the ion beam 4 are identical with those of the surfaces 33a, 33b of the magnetic poles 32a, 32b, respectively. Each of the permanent magnets 64a, 64b has a rod-like shape which extends in a direction (namely, the X direction) parallel to the passing direction of the ion beam 4. In the embodiment, the permanent magnets 64a, 64b extend so that the both ends butt against the permanent magnets 54a, 54b. However, the butting is not always necessary.

Figure 11:
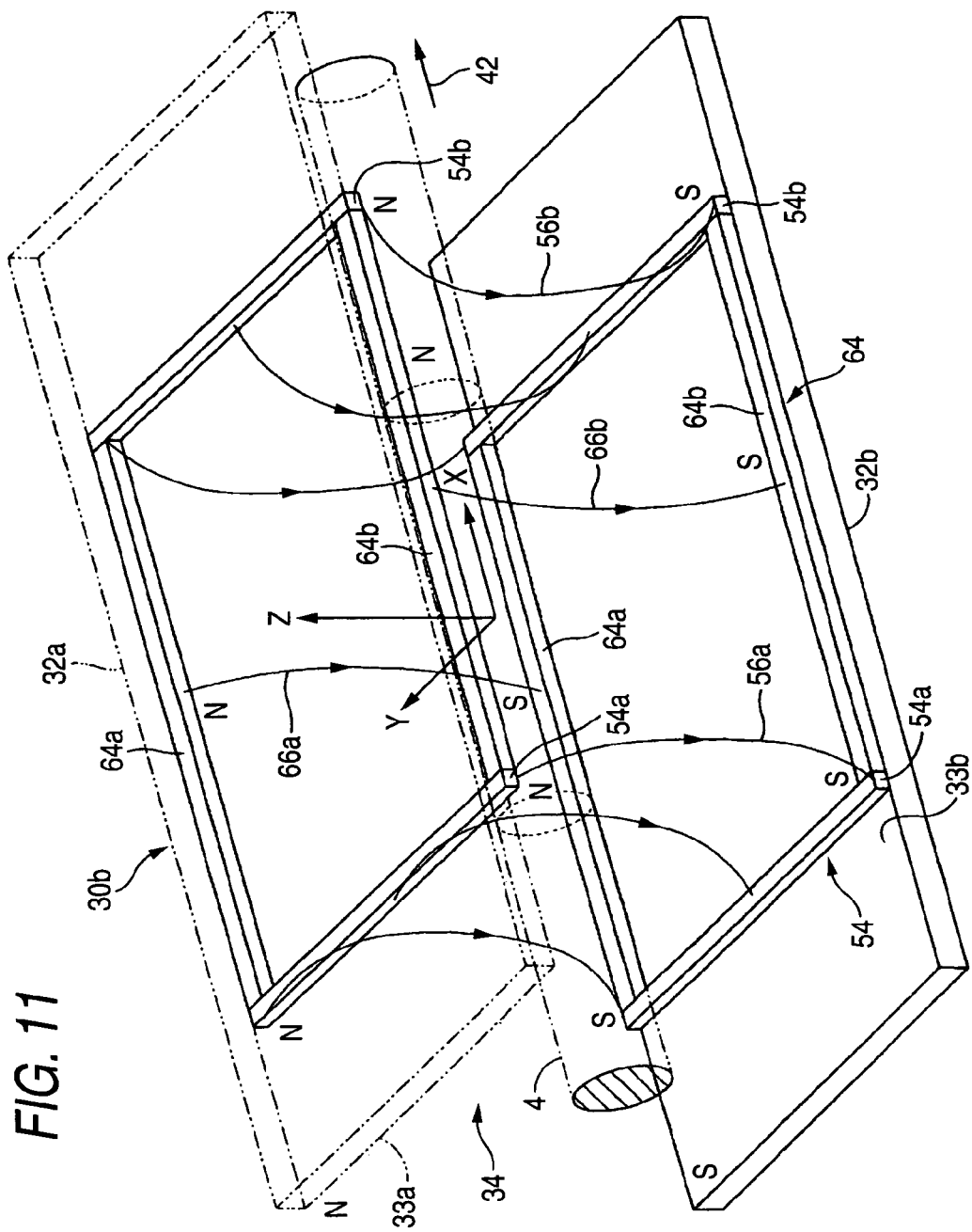
FIG. 11 is a schematic perspective view showing a second embodiment of the deflecting electromagnet of the invention.

For the sake of simplicity, one of each of magnetic force lines 66a, 66b which indicate the mirror magnetic field formed by the permanent magnets 64a, 64b, and which are bent to the inside of the inter-pole space 34 is illustrated in FIG. 11. Actually, many magnetic force lines exist, and also those which are outwardly bent exist as shown in FIG. 13.

Figure 13:
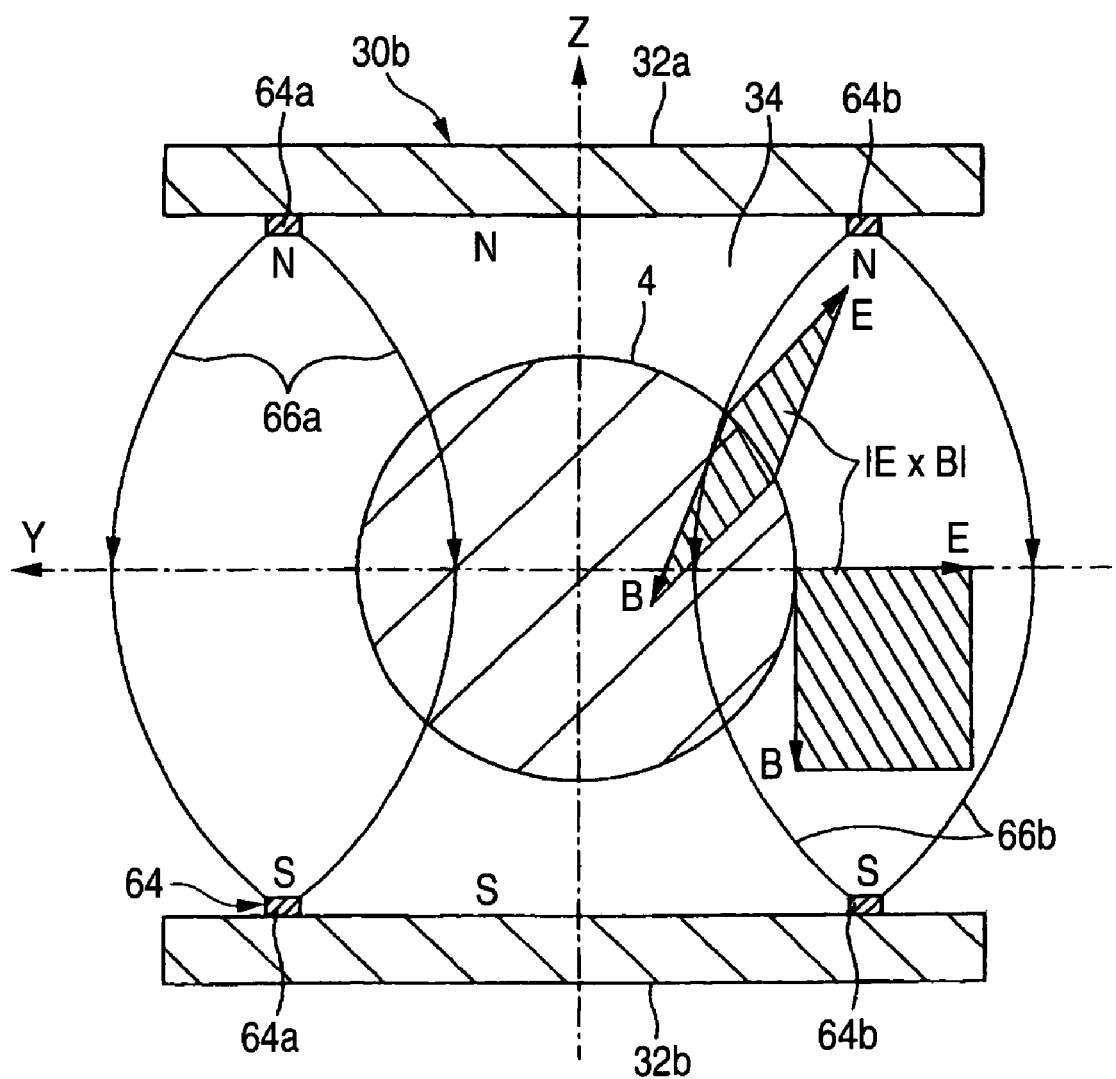
FIG. 13 is a section view schematically showing the magnitude of the E×B drift of electrons in the case where the deflecting electromagnet shown in FIG. 11 is cut along the YZ-plane.

In FIG. 13, examples of the magnitude |E×B| of the E×B drift in the case where the deflecting electromagnet 30b of the second embodiment is cut along the YZ-plane are indicated by the areas of hatched parallelograms. Also an example of the magnetic force lines 66a, 66b produced by the paired permanent magnets 64a, 64b are shown in the figure. Since the permanent magnets 64a, 64b form a mirror magnetic field, also the composite magnetic field B of the magnetic field produced by the magnetic poles 32a, 32b and that produced by the paired permanent magnets 64a, 64b is formed as a mirror magnetic field.

Figure 12:
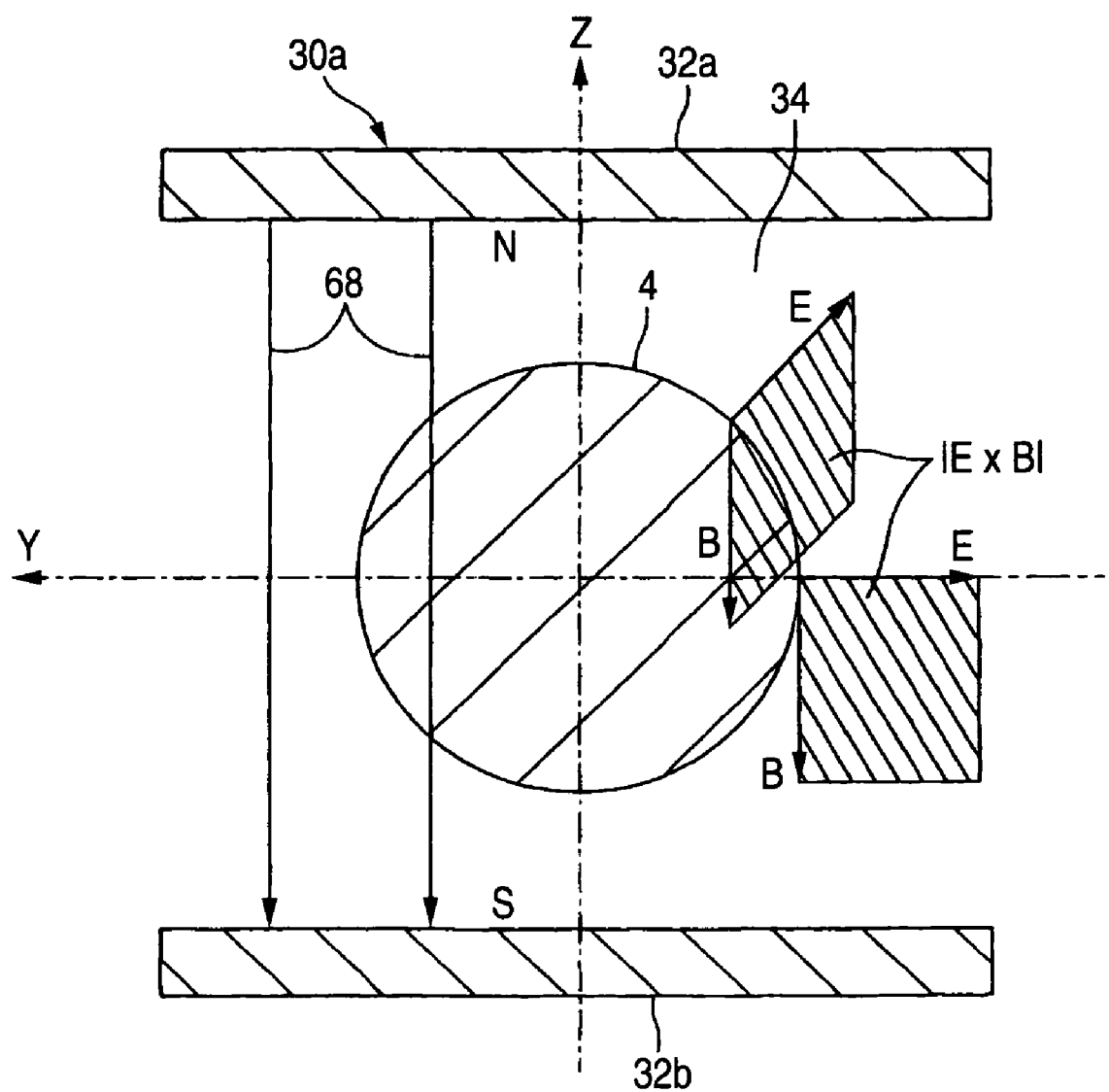
FIG. 12 is a section view schematically showing the magnitude of the E×B drift of electrons in the case where the deflecting electromagnet shown in FIG. 1 is cut along the YZ-plane.

For comparison, examples of the magnitude of the E×B drift in the YZ-plane of the deflecting electromagnet 30a of the first embodiment are shown in FIG. 12. Also an example of magnetic force lines 68 produced by the magnetic poles 32a, 32b is shown in the figure. In the case of the deflecting electromagnet 30a, the permanent-magnet group (specifically, the permanent magnets 54a, 54b) does not form a mirror magnetic field in the YZ-plane, and hence the magnetic force lines 68 are formed as substantially straight lines.

As seen from comparison of FIG. 12 with FIG. 13, in the deflecting electromagnet 30b of the second embodiment, the magnetic field B is bent. Therefore, |E×B| is reduced and the E×B drift is made small at a position which is deviated upward or downward from the Y-axis, as compared with the deflecting electromagnet 30a of the first embodiment.

In the deflecting electromagnet 30b of the second embodiment, also the second permanent-magnet group 64 (specifically, the permanent magnets 64a, 64b) causes a gradient B drift such as described above (see FIGS. 7 to 10 and the description thereof) to occur with respect to the permanent-magnet group 54, whereby the gradient B drift can be further enhanced. Specifically, the gradient B drift due to the second permanent-magnet group 64 is generated in directions indicated by the arrows G, H in FIG. 10, and this drift and the gradient B drift ($\nabla B \perp \times B$ drift) due to the permanent-magnet group 54 are connected to each other. Therefore, the electrons 38 rotate along the closed orbit, and are easily confined.

In this way, according to the deflecting electromagnet 30b, the E×B drift is made smaller at a location which is nearer to the magnetic pole with respect to the middle of the magnetic poles 32a, 32b, by the second mirror magnetic field formed by the second permanent-magnet group 64 (specifically, the permanent magnets 64a, 64b), and a gradient B drift due to magnitude nonuniformity of the magnetic field formed by the second permanent-magnet group 64 is produced, whereby the gradient B drift can be enhanced. Therefore, the confining region for the electrons 38 can be expanded, and the electron confining performance can be further enhanced. As result, space charges of the ion beam 4 can be more efficiently neutralized, the divergence of the ion beam 4 can be further suppressed, and therefore the transportation efficiency of the ion beam 4 can be more improved.

Figure 18:
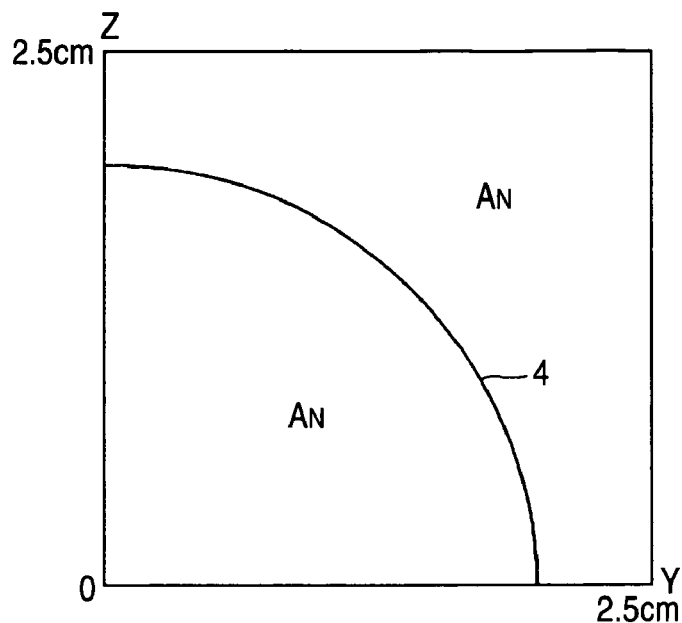
FIG. 18 is a diagram schematically showing an electron confining region and a non-confining region in the related-art deflecting electromagnet.
Figure 19:
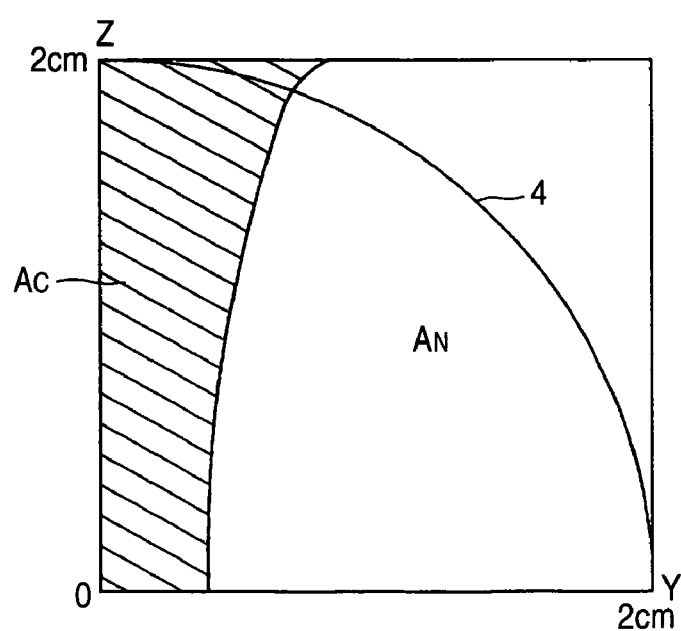
FIG. 19 is a diagram schematically showing an electron confining region and a non-confining region in the deflecting electromagnet of the first embodiment.
Figure 20:
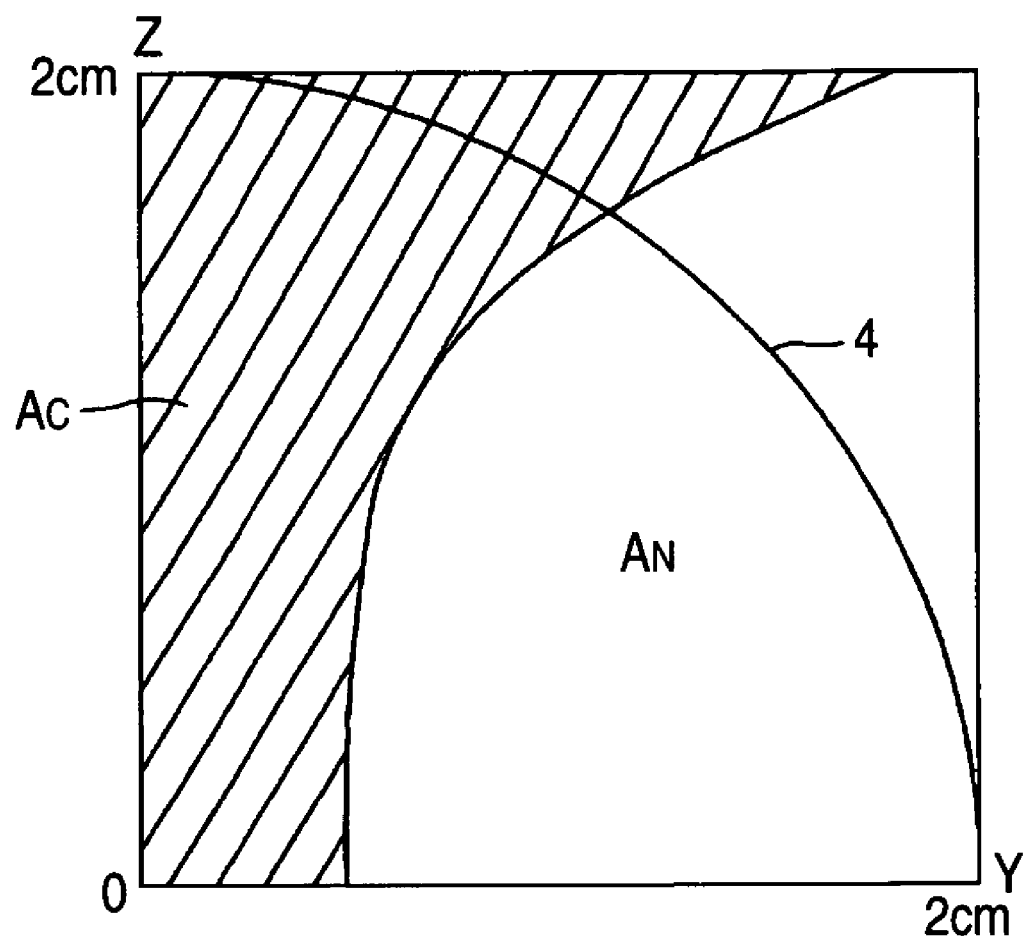
FIG. 20 is a diagram schematically showing an electron confining region and a non-confining region in the deflecting electromagnet of the second embodiment.

Electron confining regions and non-confining regions of the related-art deflecting electromagnet 30, the deflecting electromagnet 30a of the first embodiment, and the deflecting electromagnet 30b of the second embodiment are schematically collected in FIGS. 18 to 20. This will be described later.

Examples of results of simulations of an electron orbit in the related-art deflecting electromagnet 30, the deflecting electromagnet 30a of the first embodiment, and the deflecting electromagnet 30b of the second embodiment are shown in FIGS. 14 to 17. In FIGS. 14 to 17, with respect to the magnetic poles 32a, 32b, only their surfaces 33a, 33b are shown.

In the simulations, the dimensions of the magnetic poles 32a, 32b were set so that the total length in the X direction is 0.3 m, that in the Y direction is 0.16 m, and the distance between the magnetic poles 32a, 32b is 0.065 m. In the deflecting electromagnets 30a shown in FIGS. 15 and 16, the permanent magnets 54a, 54b in which the residual flux density is 1 T (Tesla), the width (the dimension in the X direction) is 5 mm, and the thickness (the dimension in the Z direction) is 3 mm are attached to the surfaces 33a, 33b of the magnetic poles 32a, 32b, respectively. The distance in the X direction between the permanent magnets 54a, 54b was 0.15 m. In the deflecting electromagnet 30b shown in FIG. 17, the permanent magnets 64a, 64b in which the residual flux density, the width (the dimension in the Y direction), and the thickness are identical with those of the permanent magnets 54a, 54b are attached to the surfaces 33a, 33b, respectively.

The intensity of the magnetic field which is produced in the middle of the inter-pole space 34 in the X and Y directions by the magnetic poles 32a, 32b is about 10 mT. In the case where the permanent magnets 54a, 54b are disposed, the intensity of the composite magnetic field is about 15 mT at the middle of the mirror magnetic field. In the case where the permanent magnets 64a, 64b are further disposed, the intensity of the composite magnetic field is about 18 mT at the middle of the mirror magnetic field. It is assumed that the ion beam 4 is formed by a columnar uniform current. The radius was set to 0.02 m, the current to 1 mA, the energy to 5 keV, and the ion species was monovalent boron. Also the equipotential lines 70 of the ion beam 4 are shown in the figures. The electrons 38 were emitted from the position indicated by the arrow P in the figure, i.e., the vicinity of the origin O (see FIG. 1) which is at the middle of the inter-pole space 34. The energy of the electrons 38 was set to 10 eV.

Figure 14:
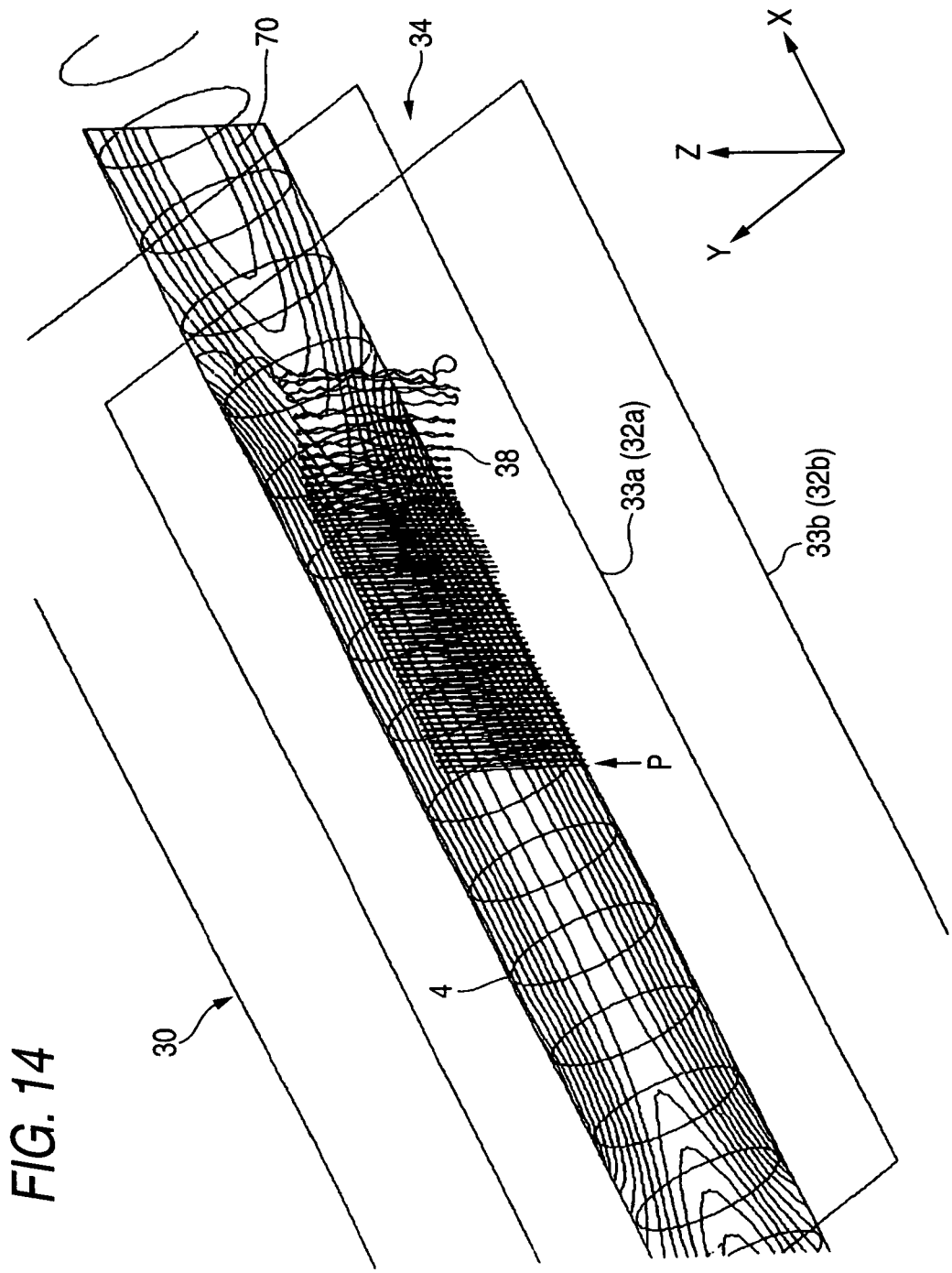
FIG. 14 is a view showing an example of results of a simulation of an electron orbit in the related-art deflecting electromagnet.

As shown in FIG. 14, in the related-art deflecting electromagnet 30, the orbit of the electrons 38 is largely deviated from the ion beam 4 in the vicinity of the X-direction end of the inter-pole space 34, and the electrons 38 cannot be confined.

Figure 15:
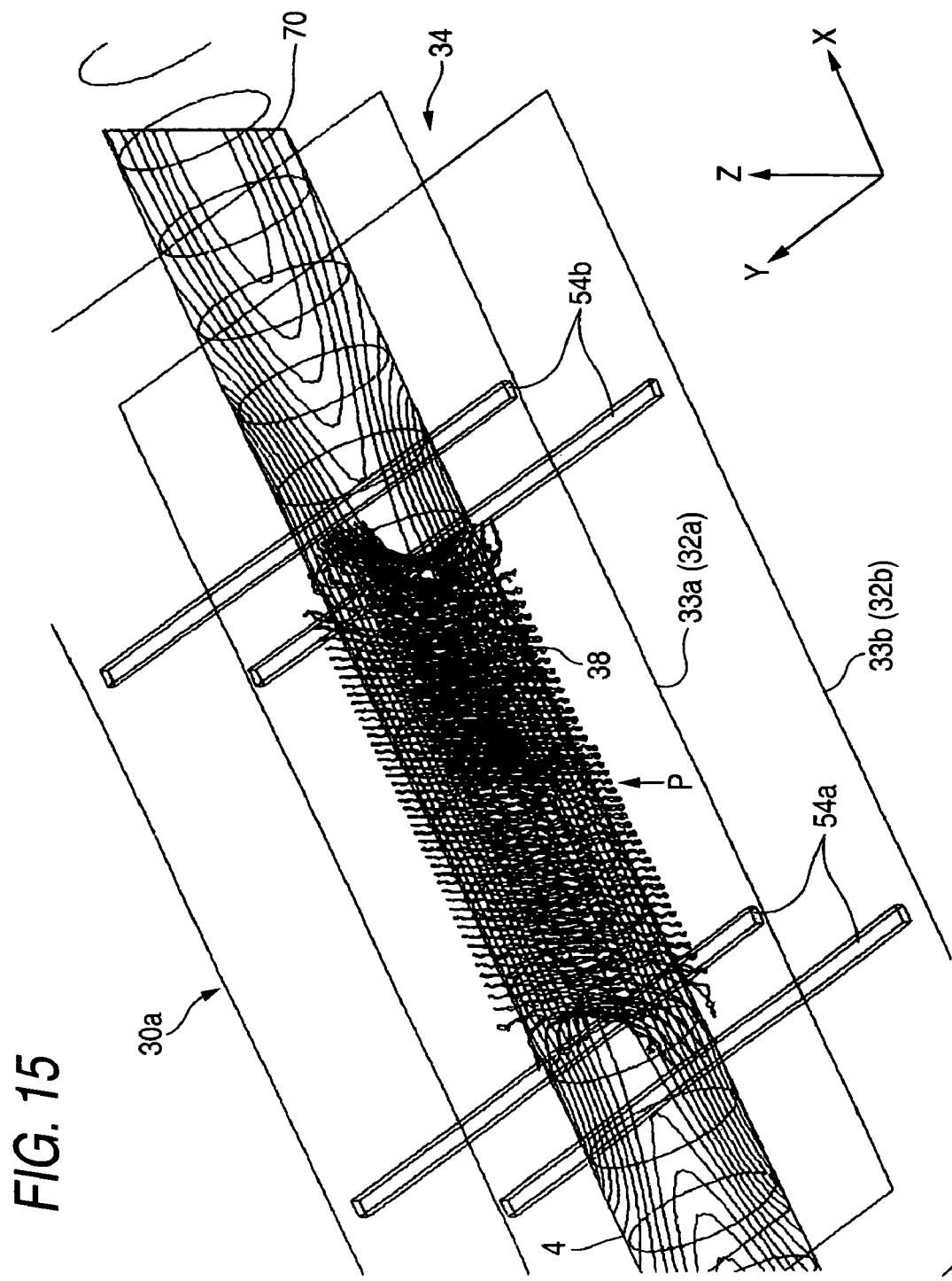
FIG. 15 is a view showing an example of results of a simulation of an electron orbit in the deflecting electromagnet of the first embodiment.

As shown in FIG. 15, in the deflecting electromagnet 30a of the first embodiment, the electrons 38 can be well confined between the permanent magnets 54a, 54b.

Figure 16:
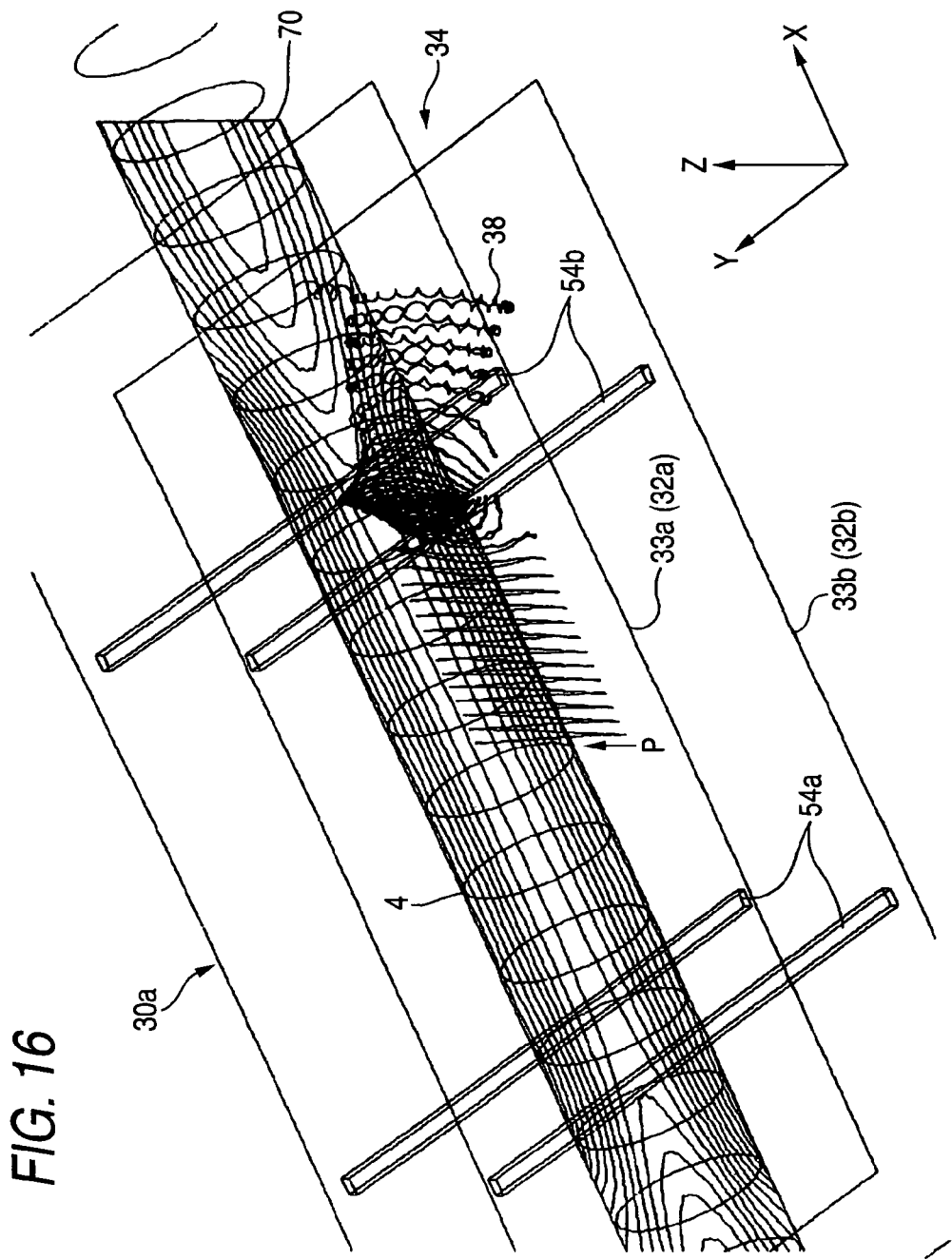
FIG. 16 is a view showing another example of results of a simulation of an electron orbit in the deflecting electromagnet of the first embodiment.
Figure 17:
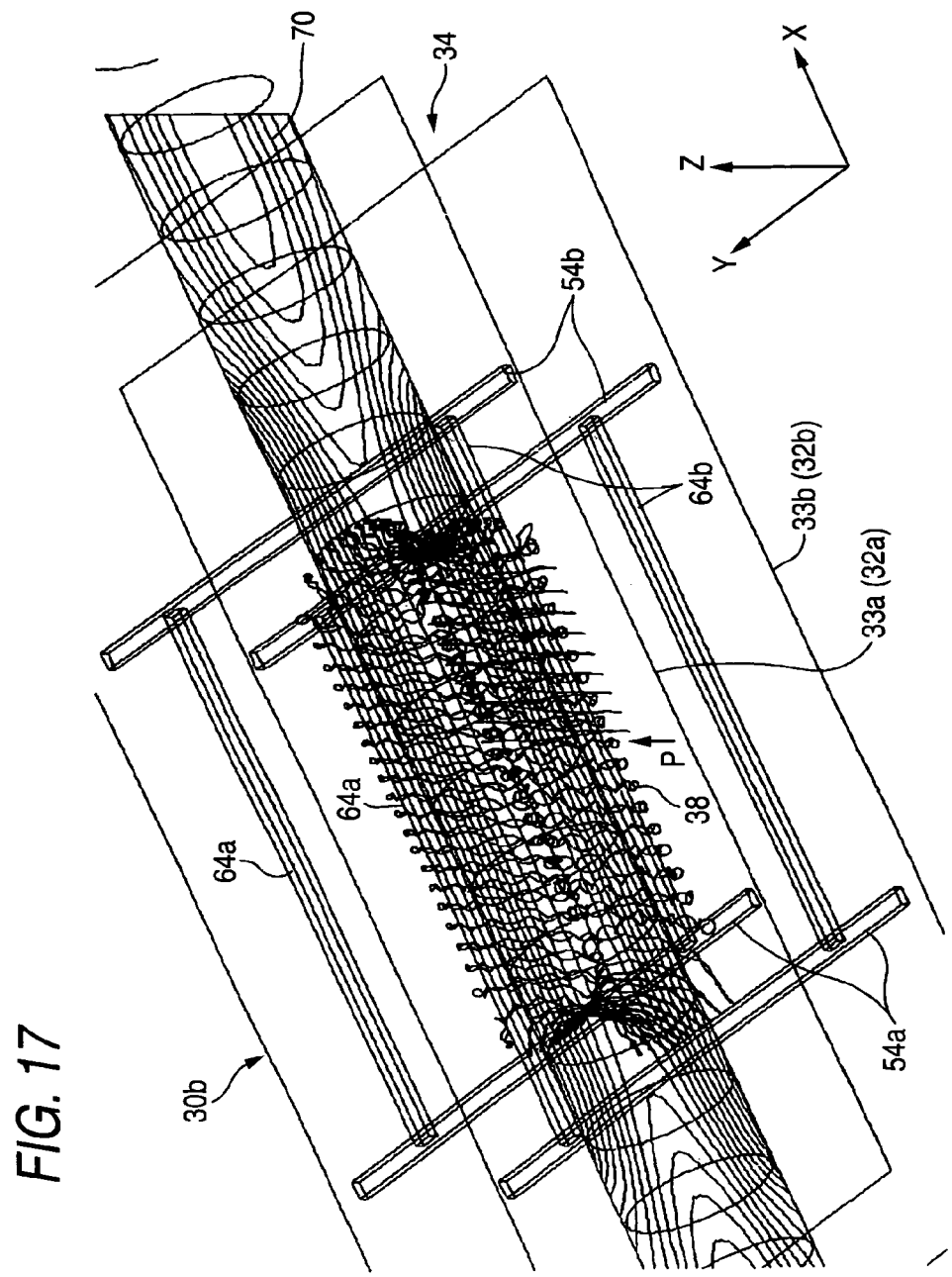
FIG. 17 is a view showing an example of results of a simulation of an electron orbit in the deflecting electromagnet of the second embodiment.

Also in the deflecting electromagnet 30a of the first embodiment, as shown in FIG. 16, the confinement is sometimes disabled depending on the emitting position of the electrons 38. Also in such a case, in the deflecting electromagnet 30b of the second embodiment, the electrons 38 can be well confined as shown in FIG. 17.

In order to check the range of confining the electrons 38, the electrons 38 are emitted from the vicinity of the origin O of the inter-pole space 34, and a confining region $A_c$ (hatched region) for the electrons 38 and a non-confining region $A_N$ (unhatched region) with respect to the emission position in the YZ-plane are schematically shown in FIGS. 18 to 20. FIG. 18 shows the related-art deflecting electromagnet 30, FIG. 19 shows the deflecting electromagnet 30a of the first embodiment, and FIG. 20 shows the deflecting electromagnet 30b of the second embodiment.

As shown in FIG. 18, in the related-art deflecting electromagnet 30, the confining region does not exist, and the whole region of the illustration is the non-confining region $A_N$.

As shown in FIG. 19, in the deflecting electromagnet 30a of the first embodiment, the confining region $A_c$ is formed in the vicinity of the Z-axis. Therefore, the performance of confining the electrons 38 is further improved.

As shown in FIG. 20, in the deflecting electromagnet 30b of the second embodiment, the confining region $A_c$ is expanded about two times as compared with the case of FIG. 19. Therefore, the performance of confining the electrons 38 is further improved.

The deflecting electromagnets 30a, 30b of the embodiments can be used in an ion beam irradiating apparatus. In an ion beam irradiating apparatus having a configuration which irradiates a target with the ion beam 4 emitted from an ion source, one or more of the deflecting electromagnet 30a or 30b of the first or second embodiment may be disposed in a path of the ion beam 4 from the ion source to the target. For example, the deflecting electromagnet 30a or 30b may be used as one or more of the mass separating magnet 6, the energy separating magnet 10, the scanning magnet 12, and the parallelizing magnet 14 of the ion beam irradiating apparatus shown in FIG. 51.

According to the configuration, in the deflecting electromagnets, the above-mentioned effects are achieved, and space charges of the ion beam 4 can be efficiently neutralized, whereby the divergence of the ion beam 4 can be suppressed. Therefore, the efficiency of transporting the ion beam 4 emitted from the ion source 2 to the target 16 can be improved.

Figure 21:
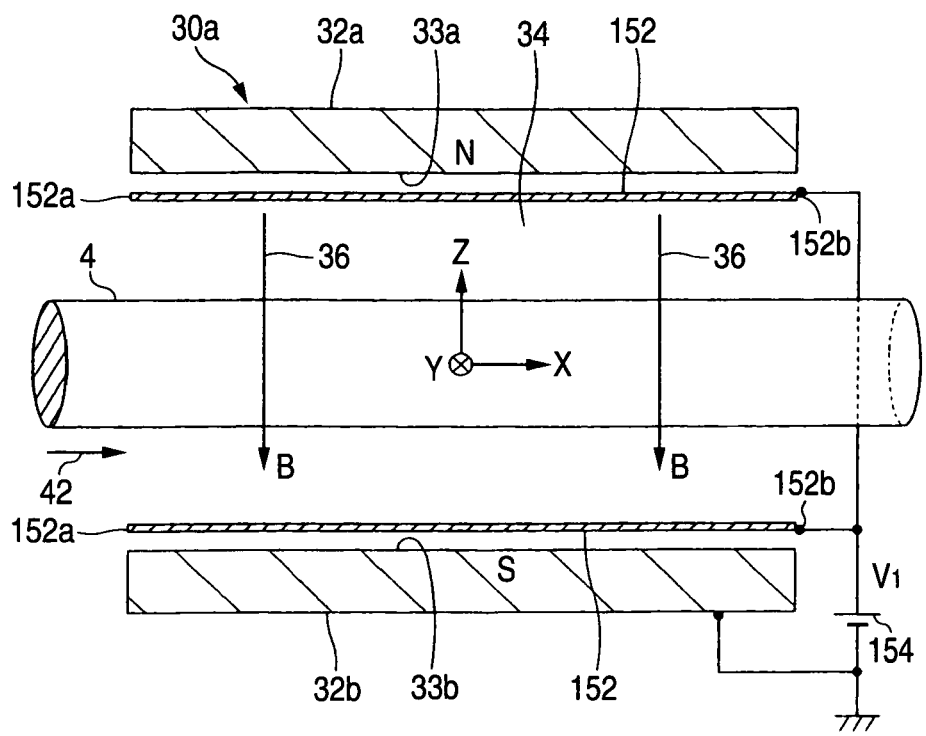
FIG. 21 is a schematic longitudinal section view showing a third embodiment of the deflecting electromagnet of the invention.

FIG. 21 is a schematic longitudinal section view showing a third embodiment of the deflecting electromagnet of the invention. The components which are identical or corresponding to those of the related-art example shown in FIGS. 58 to 60 are denoted by the same reference numerals. Hereinafter, description is made with placing emphasis on differences between the embodiment and the related-art example.

The deflecting electromagnet 30a comprises a pair of potential adjusting electrodes 152 which are placed so as to sandwich a path of the ion beam 4 in the same directions as the first and second magnetic poles 32a, 32b, in the inter-pole space 34 formed between the magnetic poles 32a, 32b. Specifically, the pair of plate-like potential adjusting electrodes 152 are placed respectively in the vicinities of the surfaces 33a, 33b of the magnetic poles 32a, 32b, while being electrically insulated from the magnetic poles 32a, 32b.

As shown in FIG. 21, etc., coordinate axes X, Y, Z which are orthogonal to one another are set in the inter-pole space 34. Namely, the center coordinate of the inter-pole space is set as the original, a direction which is oriented in the passing direction 42 of the ion beam 4 is set as the X-axis, a direction which is laterally orthogonal to the X-axis is set as the Y-axis, and a direction which is longitudinally orthogonal to the X-axis (i.e., the vertical direction between the magnetic poles 32a, 32b) is set as the Z-axis. The pair of potential adjusting electrodes 152 are placed so as to sandwich the ion beam 4 in the Z direction while forming a space therebetween.

The X and Y direction lengths of the potential adjusting electrodes 152 are preferably set to a value by which the electrodes cover the inter-pole space 34 as wide as possible, because, when they are set in this way, the potential of the periphery of the ion beam can be adjusted in a wider region of the inter-pole space 34. In the embodiment, the electrodes are set to have a length by which the electrodes cover a substantially whole range of the inter-pole space 34.

The deflecting electromagnet 30a further comprises a DC potential adjusting power source 154 which applies a positive voltage $V_1$ to the pair of potential adjusting electrodes 152. A positive end of the potential adjusting power source 154 is connected to the pair of potential adjusting electrodes 152, and a negative end is grounded. Also the magnetic poles 32a, 32b are electrically grounded.

Figure 22:
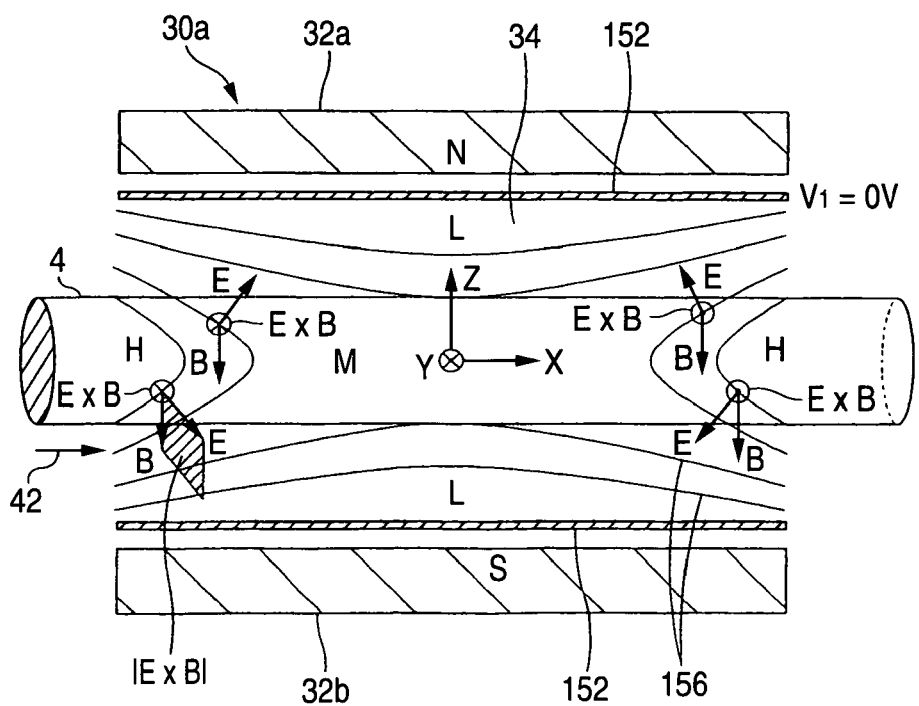
FIG. 22 is a longitudinal section view schematically showing the potential distribution and the E×B drift of electrons in the case where a voltage to be applied to potential adjusting electrodes in the deflecting electromagnet shown in FIG. 21 is 0 V.
Figure 23:
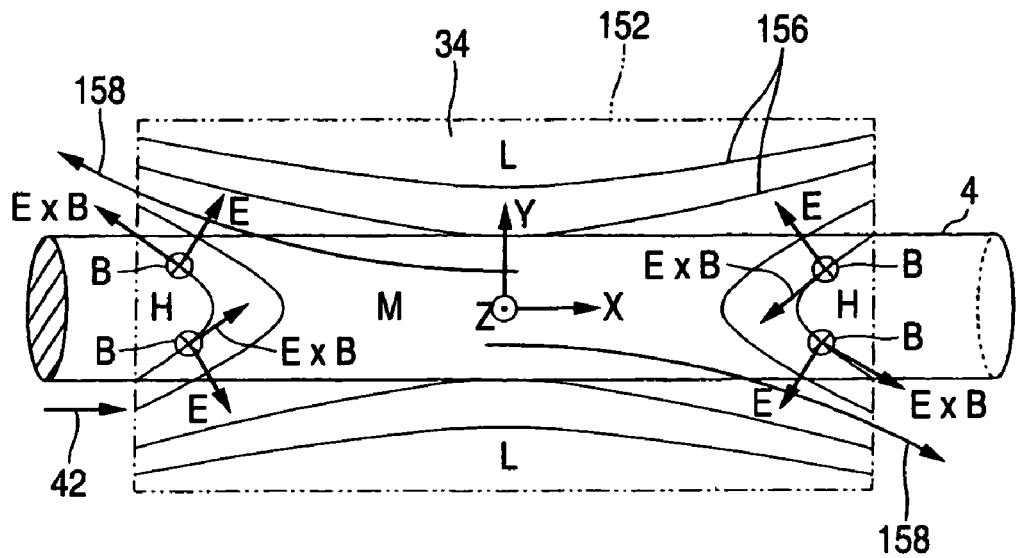
FIG. 23 is a plan view schematically showing the potential distribution and the electron drift orbit in the vicinity of an ion beam in FIG. 22.

FIGS. 22 and 23 schematically show the potential distribution of the periphery of the ion beam in the inter-pole space 34, and the E×B drift of the electrons 38 (if not illustrated, see FIGS. 58 to 60, FIGS. 32 to 37, etc., and the same will apply hereinafter) in the case where the positive voltage $V_1$ to be applied from the potential adjusting power source 154 to the potential adjusting electrodes 152 is 0 V (in this case, the potential adjusting electrodes 152 are equal in potential to the magnetic poles 32a, 32b, and hence the potential distribution of the periphery of the ion beam is identical with that in the case of the related-art deflecting electromagnet 30 shown in FIG. 59, etc.). The magnetic field B is produced by the magnetic poles 32a, 32b, and the electric field E is produced by the ion beam 4. The reference numeral 156 denotes equipotential lines. As described above, for example, the electrons 38 are secondary electrons which are generated by collision of part of the periphery of the ion beam 4 with a wall face or the like constituting the inter-pole space 34, or electrons which are generated by ionization caused by collision of a residual gas in the inter-pole space 34 with the ion beam 4. This will apply to electrons 38 which will be described later.

Figure 25:
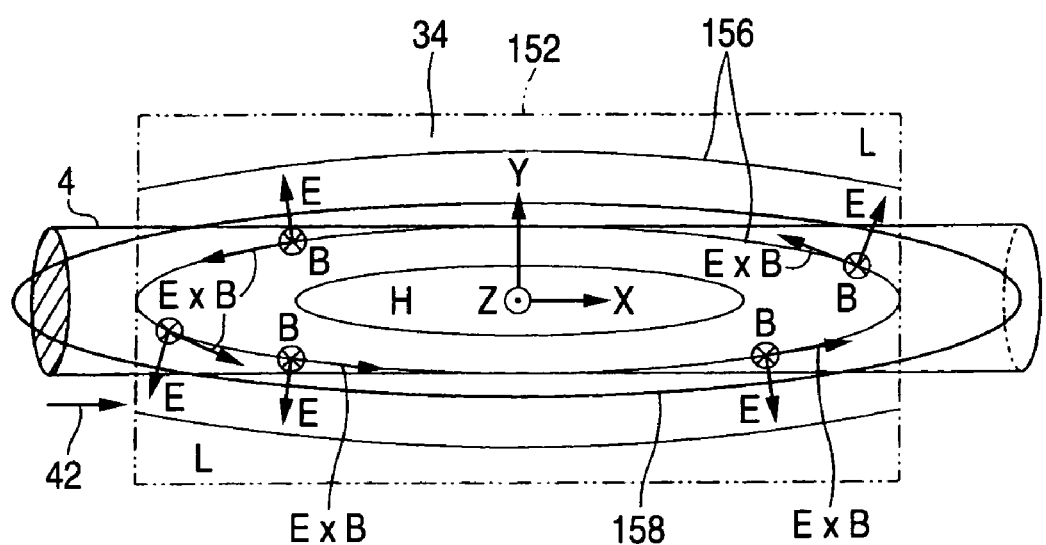
FIG. 25 is a plan view schematically showing the potential distribution and the electron drift orbit in the vicinity of an ion beam in FIG. 24.

In FIGS. 23 and 25, in order to facilitate the illustration of the equipotential lines 156 and the like, the upper magnetic pole 32a is not shown, and the upper potential adjusting electrode 152 is indicated by phantom lines. In FIG. 21 and subsequent figures, for the sake of convenience, the ion beam 4 is illustrated as a cylindrical shape. However, the shape is not restricted to this. Although the ion beam 4 is originally bent by the magnetic field produced by the magnetic poles 32a, 32b, the bend due to the magnetic field is ignored, and the ion beam is indicated by straight lines in order to simplify the illustration.

Figure 56:
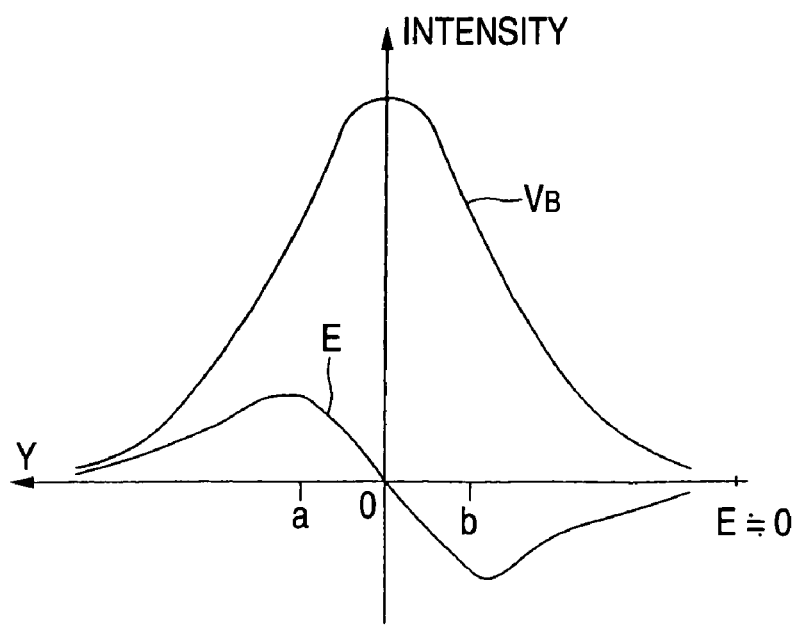
FIG. 56 is a diagram schematically showing distributions of the potential of the ion beam of FIG. 55 and an electric field.
Figure 57:
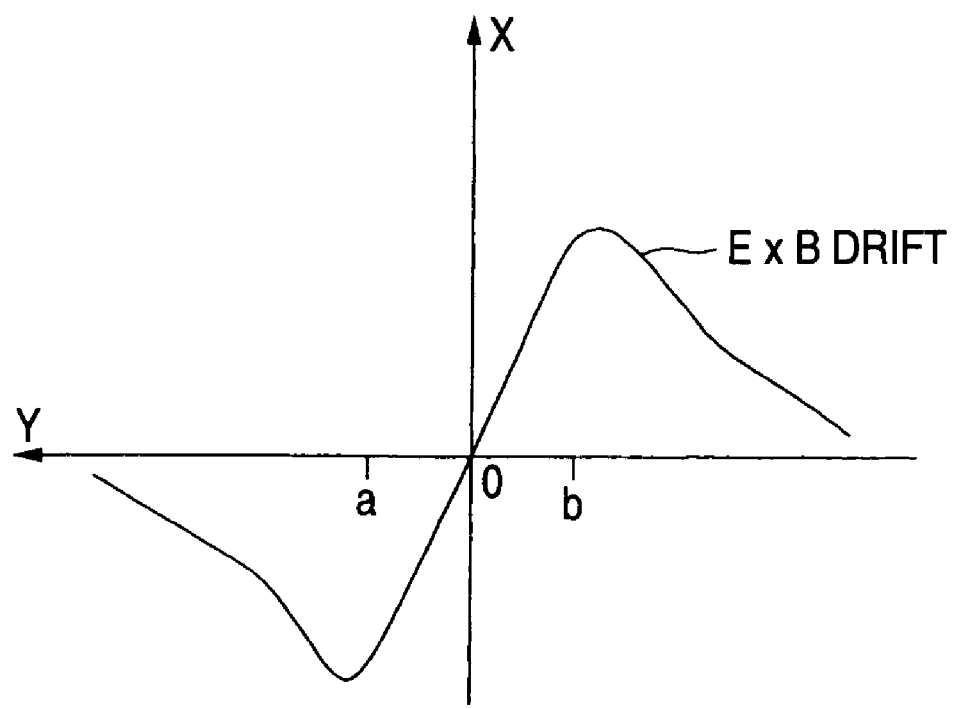
FIG. 57 is a diagram schematically showing the E×B drift of electrons in the cases of FIGS. 55 and 56.

As described above, the ion beam 4 has a positive potential (see FIG. 56 and the description thereof). In the case where the voltage $V_1$ is set to 0 V, the potential of a wall face in the periphery of the ion beam 4 (namely, the magnetic poles 32a, 32b and the potential adjusting electrodes 152) is 0 V. The potential distribution of the periphery of the ion beam 4 is affected by the potential, and becomes unsuitable for confining the electrons 38. As schematically illustrated by the equipotential lines 156 in FIG. 22, the potential of the vicinity of the ion beam 4 is made low at the middle by the effect of the potential of the surrounding wall face, and, in the vicinities of the inlet and outlet of the inter-pole space 34, the potential returns to high because the ion beam separates from the wall face. In other words, the potential distribution has a saddle-like shape. In the case where the potential of the ion beam 4 in an inlet portion of the inter-pole space 34 is 100 V, for example, the potential in the vicinity of the ion beam 4 is as follows: a portion of a higher potential (in the figures, indicated by "H", and the same will apply to other figures) is about 100 V; a portion of a medium potential (in the figures, indicated by "M", and the same will apply to other figures) is about 50 V; and a portion of a lower potential (in the figures, indicated by "L", and the same will apply to other figures) is about 10 V or lower.

As shown in FIG. 22, the direction of the E×B drift of the electrons 38 in this case is the +Y direction (namely, the front-to-rear direction of the sheet face) in the ion beam inlet of the inter-pole space 34, and the −Y direction (namely, the rear-to-front direction of the sheet face) in the ion beam outlet. In FIG. 22 (and FIG. 24 and the like), the magnitude |E×B| of the E×B drift is indicated by the area of a hatched parallelogram.

FIG. 22 is a longitudinal section view in which the ion beam 4 is seen from the lateral side. As shown in FIG. 23, also when seen from the upper side, the potential distribution of the periphery of the ion beam 4 has a saddle-like shape in a similar manner as FIG. 22. This is caused because of the following reason. As described above, since the voltage $V_1$ to be applied to the potential adjusting electrodes 152 is 0 V, the potential of a wall face in the periphery of the ion beam 4 is 0 V, and FIGS. 22 and 23 are mainly different from each other only in direction of the magnetic field B.

In the case where the distribution of the equipotential lines 156 in the periphery of the ion beam, i.e., the distribution of the potential has a saddle-like shape, the drift orbit 158 of the electrons 38 splits right and left, and is not closed as shown in FIG. 23. Therefore, the electrons 38 flow out to the outside of the inter-pole space 34 in the direction of the ion beam 4 to be lost.

Figure 24:
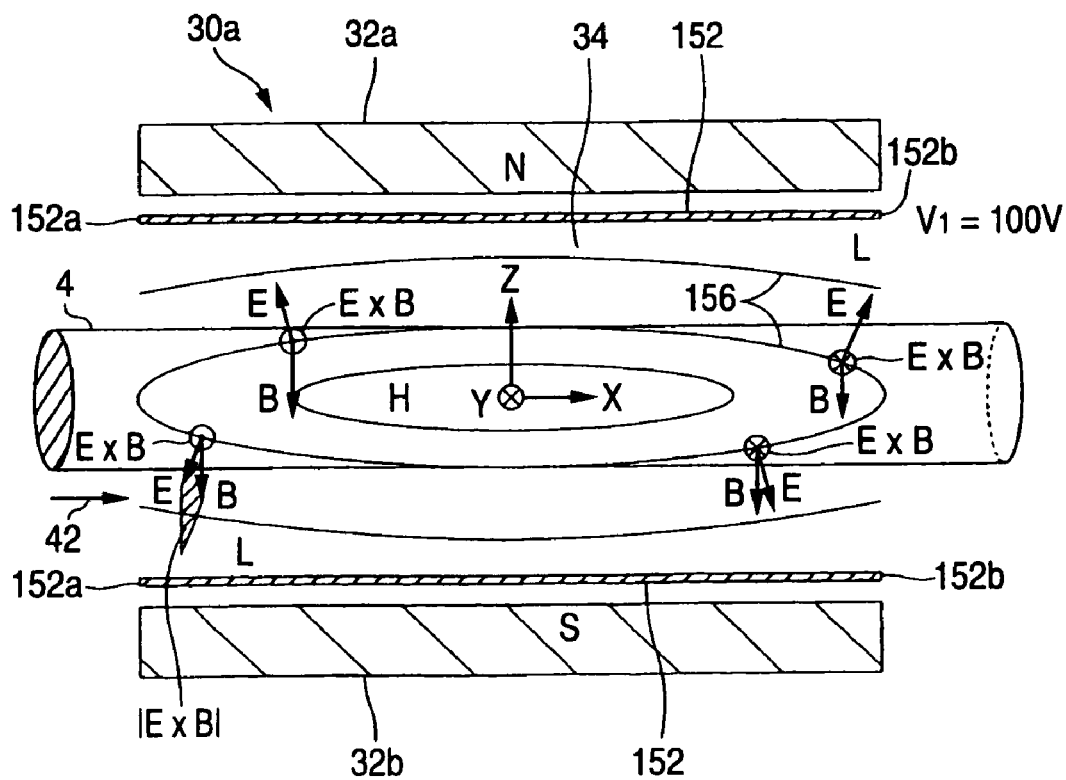
FIG. 24 is a longitudinal section view schematically showing the potential distribution and the E×B drift of electrons in the case where a voltage to be applied to potential adjusting electrodes in the deflecting electromagnet shown in FIG. 21 is 100 V.

By contrast, FIGS. 24 and 25 schematically show the potential distribution in the periphery of the ion beam in the inter-pole space 34, and the E×B drift of the electrons 38 in the case where the positive voltage $V_1$ is applied from the potential adjusting power source 154 to the potential adjusting electrodes 152. The figures correspond respectively to FIGS. 22 and 23 above.

FIGS. 24 and 25 show an example where the potential of the ion beam 4 in the inlet portion of the inter-pole space 34 is 100 V and the voltage $V_1$ is 100 V. In this case, the potential in the periphery of the ion beam in the inter-pole space 34 is affected by the potential of the potential adjusting electrodes 152 so as to have a distribution of a convex shape in which the potential is highest in the vicinity of the middle of the ion beam 4. For example, the highest potential is about 150 V, and the potential is gradually lowered as advancing toward the periphery. The potential is about 100 V in the vicinities of the potential adjusting electrodes 152.

In the case where the distribution of the equipotential lines 156 in the periphery of the ion beam, i.e., the distribution of the potential is convex as described above, as shown in FIG. 25, the E×B drift of the electrons 38 is produced so as to rotate in the XY-plane, and the drift orbit 158 of the electrons 38 includes that which is closed in a space including the inter-pole space 34. In the deflecting electromagnet 30a, namely, the potential in the periphery of the ion beam can be adjusted by applying the positive voltage $V_1$ to the potential adjusting electrodes 152, thereby enabling an orbit which is closed in a space including the inter-pole space 34 to exist as the orbit of the electron E×B drift due to the electric field E in the periphery of the ion beam and the magnetic field B produced by the magnetic poles.

As a result, the electrons 38 in a state where the orbit is captured can exist in the ion beam or in the vicinity thereof. Accordingly, the loss of the electrons 38 from the inter-pole space 34 due to the E×B drift can be reduced, and hence the confinement of the electrons 38 in the inter-pole space 34 can be improved.

Furthermore, space charges of the ion beam 4 can be efficiently neutralized by the confined electrons 38, whereby the divergence of the ion beam 4 can be suppressed, and therefore the transportation efficiency of the ion beam 4 can be improved.

The electrons 38 can be confined into the vicinity of the ion beam orbit. Therefore, electrons which are generated from the vicinity of the ion beam 4 by collision of the ion beam with a residual gas can be efficiently confined. Accordingly, the effect that space charges of the ion beam 4 are neutralized is further enhanced.

It is not required to form a complex magnetic field such as a cusp magnetic field. Therefore, the structure of the deflecting electromagnet 30a can be simplified. Furthermore, there is no possibility that the orbit of the ion beam 4 is disturbed by an extra magnetic field.

Electrons which are generated due to the ion beam 4, namely, secondary electrons which are generated by collision of part of the periphery of the ion beam 4 with a wall face or the like constituting the inter-pole space 34, or electrons which are generated by ionization caused by collision of a residual gas in the inter-pole space 34 with the ion beam 4 are confined to neutralize space charges of the ion beam 4. Therefore, it is not required to dispose an electron source which supplies electrons from the surfaces of the magnetic poles or the outside into the inter-pole space 34. When a large ion beam current flows, moreover, electrons which are generated due to the ion beam 4 are increased, and the neutralization of space charges is spontaneously adjusted. Accordingly, a large control system is not necessary.

Even when the ion beam 4 is scanned, electrons are so light that they are moved while being pulled by the electric field of the ion beam 4, and the electron drift speed is high. Also in the case where the deflecting electromagnet 30a scans the ion beam 4, such as the case of a scanning magnet, therefore, it is possible to attain the above-mentioned effects.

Preferably, the voltage Vi which is applied from the potential adjusting power source 154 to the potential adjusting electrodes 152 is higher than a higher one of: the potential of the ion beam 4 (with respect to ground) at ion beam inlet ends 152a of the potential adjusting electrodes 152; and a potential between the ion beam 4 at ion beam outlet ends 152b and ground.

According to the configuration, the potential in the vicinity of the middle of the ion beam 4 can be made higher than the potentials in the inlet and outlet ends 152a, 152b, so that the potential distribution in the periphery of the ion beam can more surely have a convex shape. Therefore, an orbit which is closed in a space including the inter-pole space 34 can exist more surely in the orbit of the electron E×B drift of the electrons 38. Therefore, the performance of confining the electrons 38 can be further enhanced. As a result, space charges of the ion beam 4 can be more efficiently neutralized, whereby the divergence of the ion beam 4 can be further suppressed, and therefore the transportation efficiency of the ion beam 4 an be further improved.

Figure 26:
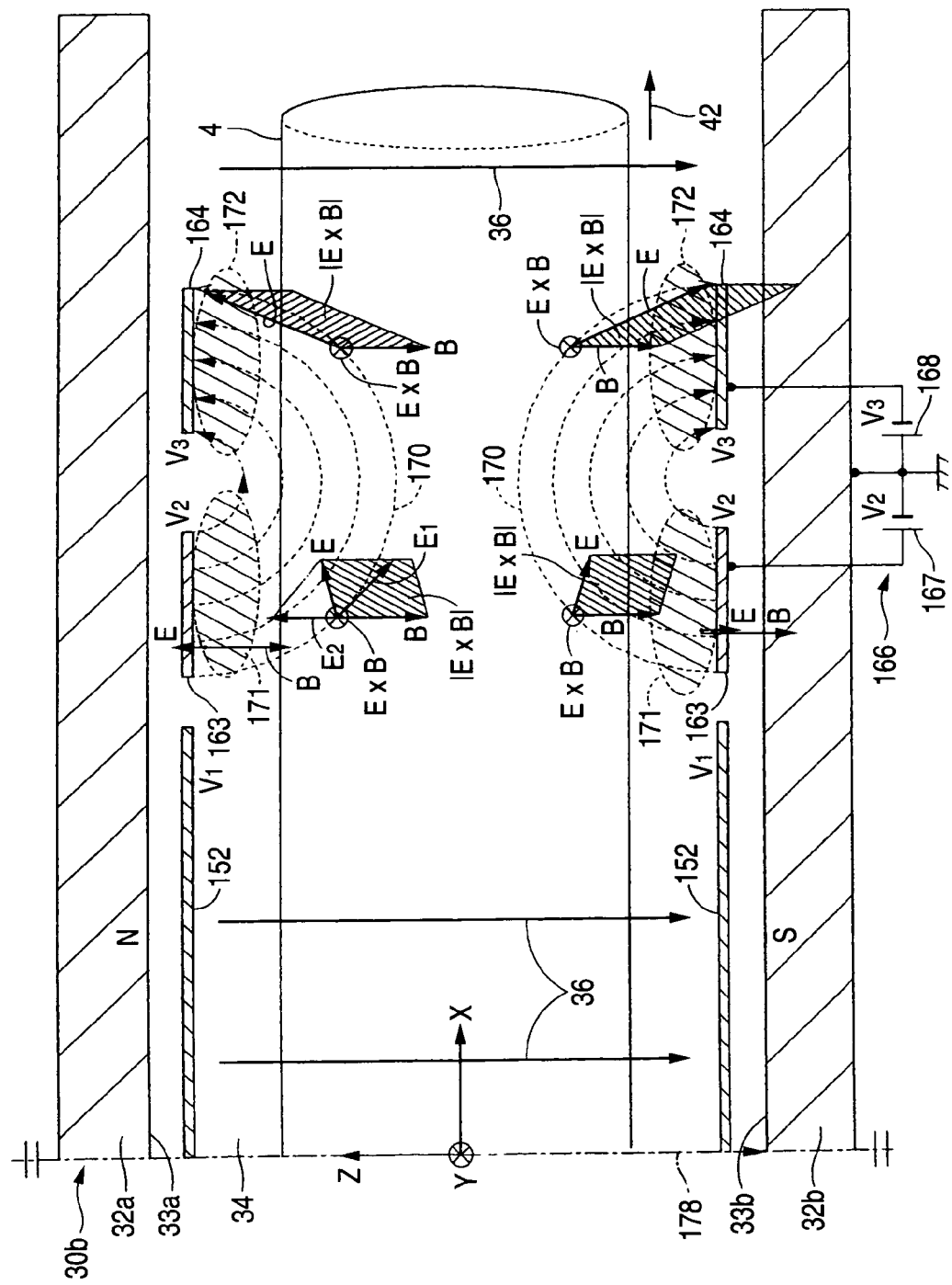
FIG. 26 is a schematic longitudinal section view showing an outlet-side half of a fourth embodiment of the deflecting electromagnet of the invention.
Figure 27:
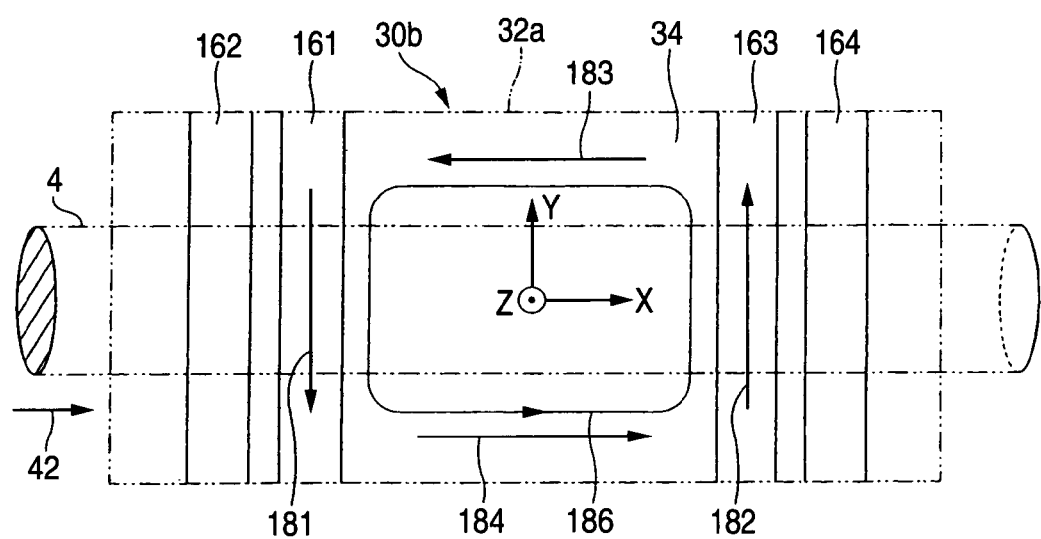
FIG. 27 is a plan view schematically showing the direction of the electron E×B drift in the deflecting electromagnet shown in FIG. 26.

FIG. 26 is a schematic longitudinal section view showing an outlet-side half of a fourth embodiment of the deflecting electromagnet of the invention. FIG. 27 is a plan view schematically showing the direction of the electron E×B drift in the deflecting electromagnet shown in FIG. 26. Although an inlet-side half is not illustrated in FIG. 26, the inlet-side half has a structure which is symmetric to the illustrated structure about a center line 178 of symmetry (see FIG. 27). This is applicable also to FIGS. 28 and 29. In FIG. 27, in order to facilitate the illustration of the drift direction of electrons and the like, the upper magnetic pole 32a is indicated by phantom lines. The potential adjusting electrodes 152 are not required in the description, and hence are omitted in the figure.

The deflecting electromagnet 30b comprises: a first pair of correcting electrodes 161 (see FIG. 27) which are placed to sandwich a path of the ion beam 4 in the same directions as the first and second magnetic poles 32a, 32b, in locations of the inter-pole space 34 which are nearer to an inlet with respect to the middle in the ion beam passing direction; a second pair of correcting electrodes 162 (see FIG. 27) which are juxtaposed with the first pair of correcting electrodes 161 to be positioned outside the first pair of correcting electrodes 161 in the ion beam passing direction; a third pair of correcting electrodes 163 which are placed to sandwich the path of the ion beam 4 in the same directions as the first and second magnetic poles 32a, 32b, in locations of the inter-pole space 34 which are nearer to an outlet with respect to the middle in the ion beam passing direction; and a fourth pair of correcting electrodes 164 which are juxtaposed with the third pair of correcting electrodes 163 to be positioned outside the third pair of correcting electrodes 163 in the ion beam passing direction.

Each of the first to fourth pairs of correcting electrodes 161 to 164 have a plate-like shape, and are placed so as to sandwich the ion beam 4 in the above-mentioned Z direction while forming a space therebetween. Specifically, the pairs of correcting electrodes 161 to 164 are placed in the vicinities of the surfaces 33a, 33b of the magnetic poles 32a, 32b, while being electrically insulated from the magnetic poles 32a, 32b.

The Y-direction lengths of the pairs of the correcting electrodes 161 to 164 are preferably set to a value by which the electrodes cover the inter-pole space 34 as long as possible, because, when they are set in this way, electrons can be confined in a wider region. In the embodiment, the lengths of the electrodes are set to be substantially equal to the Y-direction length of the inter-pole space 34. The pairs of correcting electrodes 161 to 164 are required to have an X direction length by which a concentric semicircular electric field (see electric force lines 170) that will be described later can be produced.

The deflecting electromagnet 30b further comprises: a first DC correcting power source (not shown, see a second correcting power source 166 corresponding to it) which holds the potentials of the second pair of correcting electrodes 162 to be lower than those of the first pair of correcting electrodes 161; and the second DC correcting power source 166 which holds the potentials of the fourth pair of correcting electrodes 164 to be lower than those of the third pair of correcting electrodes 163.

In this example, the second correcting power source 166 has a DC power source 167 in which a positive end is connected to the third pair of correcting electrodes 163, and a DC power source 168 in which a negative end is connected to the fourth pair of correcting electrodes 164. A negative end of the DC power source 167, and a positive end of the DC power source 168 are grounded. When the voltages output from the DC power sources 167, 168 are $V_2$ and $V_3$, respectively, the potentials of the correcting electrodes 163, 164 are $V_2$ and $V_3$, respectively. Although not illustrated, for example, the first DC correcting power source on the inlet side is configured in the same manner as described above.

When the first and second correcting power sources are configured as different power sources, the degree of freedom in electric field correction is high. Alternatively, the correcting power sources may be configured as an identical power source. In the alternative, the power source configuration can be simplified. In the case of an identical power source, the same voltage (in this example, $V_2$) is applied to the correcting electrodes 161, 163, and the same voltage (in this example, $V_3$) is applied to the correcting electrodes 162, 164.

The deflecting electromagnet 30b comprises also the above-mentioned potential adjusting electrodes 152. However, the potential adjusting electrodes 152 is not necessarily used together with the correcting electrodes 161 to 164. The potential adjusting electrodes 152 may not be disposed. When the potential adjusting electrodes 152 is disposed and the above-described positive voltage $V_1$ is applied to the electrodes, it is possible to attain both the above-described effects due to the potential adjusting electrodes 152, and effects which are due to the correcting electrodes 161 to 164, and which will be described below.

In the deflecting electromagnet 30b, the potential of the correcting electrodes 164 is lower than that of the correcting electrodes 163 (in other words, the potential of the correcting electrodes 163 is higher than that of the correcting electrodes 164), and hence the electric force lines 170 which are oriented from the correcting electrodes 163 toward the correcting electrodes 164, which have a concentric semicircular section shape. The E×B drift due the electric field E which is a combination of an electric field $E_1$ produced by the correcting electrodes 163,164, and the electric field (here, this is indicated by $E_2$) produced by the ion beam 4; and the magnetic field B produced by the magnetic poles 32a, 32b is oriented in a direction which intersects with the ion beam 4 as shown in FIG. 26. Specifically, the E×B drift is oriented in the +Y direction. The direction of the E×B drift is indicated by the arrow 182 in FIG. 27. In the same manner as described above, the magnitude |E×B| of the E×B drift is indicated by the area of a hatched parallelogram in FIG. 26. The electric fields $E_1$ and $E_2$ are shown in more detail in FIG. 29, and therefore see also the figure.

In the E×B drift due to: the electric field E which is a combination of an electric field produced by the first pair of correcting electrodes 161 and the second pair of correcting electrodes 162 which are nearer to the inlet, and the electric field produced by the ion beam 4; and the magnetic field B produced by the magnetic poles 32a, 32b, the electric field produced by the correcting electrodes 161, 162 are oppositely oriented, and also the composite electric field E is oppositely oriented. Therefore, the E×B drift is oriented in a direction which is opposite to that on the side of the third and fourth pairs of correcting electrodes 163, 164, and which intersects with the ion beam 4. Specifically, the E×B drift is oriented in the −Y direction. The direction of the E×B drift is indicated by the arrow 181 in FIG. 27.

By contrast, as previously described with reference to FIG. 60 and the like, the E×B drift due to the electric field produced by the ion beam 4 and the magnetic field produced by the magnetic poles 32a, 32b is oriented in the direction of the ion beam 4. Specifically, in the left side as seen in the passing direction 42 of the ion beam 4, the drift is oriented in the −X direction as indicated by the arrow 183 in FIG. 27, and, in the right side, the drift is oriented in the +X direction as indicated by the arrow 184.

In the inter-pole space 34, therefore, the electrons 38 drift in a direction which is a combination of: the two kinds of E×B drifts which are in the Y direction intersecting with the ion beam 4 and respectively in the vicinities of the inlet and the outlet, and which are oriented in opposite directions (in the directions indicated by the arrows 181, 182 in FIG. 27); and the E×B drift which is in the X direction or along the ion beam 4 (in the directions indicated by the arrows 183, 184 in FIG. 27). As a result, the drifts in the directions indicated by the arrows 181 to 184 are connected to one another, and therefore a closed electron orbit exists in the ion beam 4 and in the vicinity thereof. An example of such a closed electron drift orbit 186 is shown in FIG. 27. According to the configuration, the electrons 38 in which the orbit is captured can exist in the ion beam 4 or in the vicinity thereof. Therefore, the loss of the electrons 38 from the inter-pole space 34 due to the E×B drift can be reduced, and hence the confinement of the electrons 38 in the inter-pole space 34 can be improved. As a result, space charges of the ion beam 4 can be efficiently neutralized by the confined electrons 38, whereby the divergence of the ion beam 4 can be suppressed, and therefore the transportation efficiency of the ion beam 4 can be improved.

Figure 29:
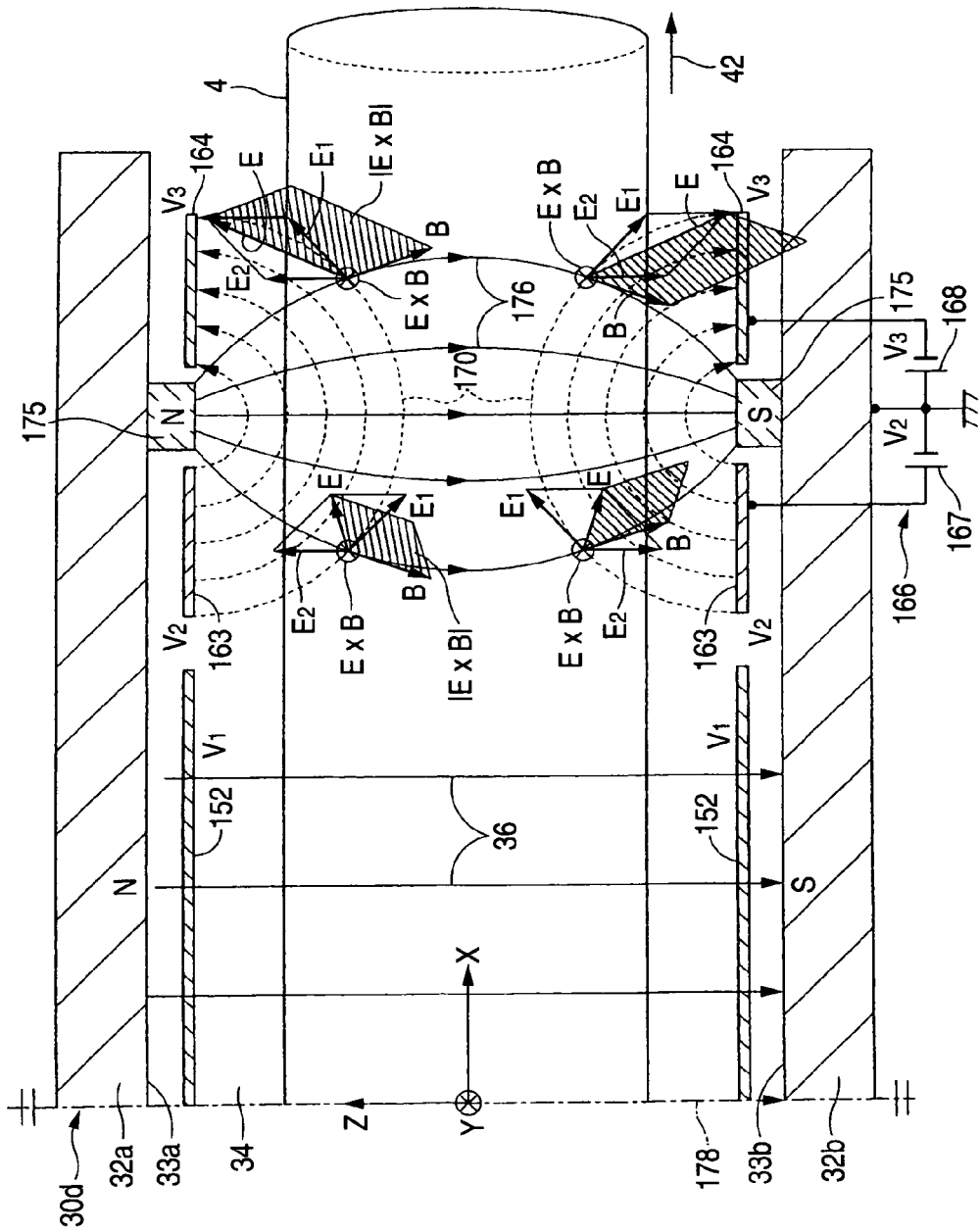
FIG. 29 is a schematic longitudinal section view showing an outlet-side half of a sixth embodiment of the deflecting electromagnet of the invention.

Preferably, the first and second pairs of correcting electrodes 161, 162 are placed in the vicinity of the inlet end of the inter-pole space 34 in the ion beam passing direction, and the third and fourth pairs of correcting electrodes 163, 164 are placed in the vicinity of the outlet end of the inter-pole space 34 in the ion beam passing direction (see the correcting electrodes 163, 164 in FIG. 29). According to the configuration, the distances between the first and second pairs of correcting electrodes 161, 162 and the third and fourth pairs of correcting electrodes 163, 164 can be prolonged, and the reciprocal confinement length of the electrons 38 along the ion beam passing direction can be made long. Therefore, a region where space charges of the ion beam 4 are neutralized can be widened. As a result, space charges of the ion beam 4 can be more efficiently neutralized, whereby the divergence of the ion beam 4 can be further suppressed, and therefore the transportation efficiency of the ion beam 4 can be further improved.

In the deflecting electromagnet 30b, as shown in FIG. 26, the electric field $E_2$ produced by the upper and lower correcting electrodes 163, 164 is substantially perpendicular to the correcting electrodes 163, 164 in the vicinities of the correcting electrodes 163, 164. Therefore, the electric field E which is a combination of the electric field $E_2$ and the electric field $E_1$ produced by the ion beam 4 is substantially parallel to the magnetic field B, the magnitude |E×B| of the E×B drift is reduced, and the confinement of the electrons 38 is weakened. Namely, weak confining regions 171, 172 are produced as indicated by hatchings in FIG. 26.

Figure 28:
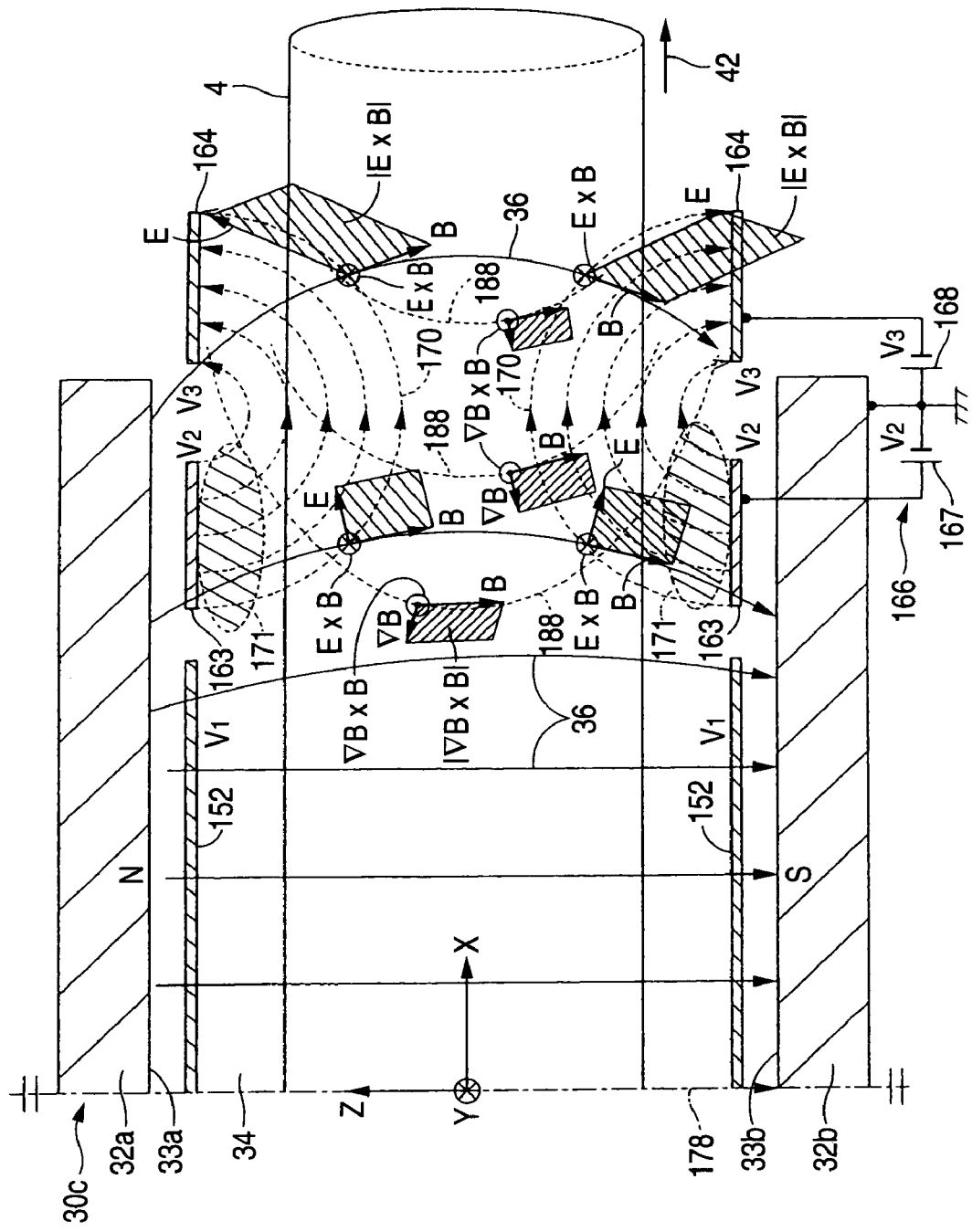
FIG. 28 is a schematic longitudinal section view showing a fifth embodiment in which correcting electrodes of the deflecting electromagnet shown in FIG. 26 are shifted toward the outlet.

FIG. 28 shows an embodiment (fifth embodiment) which can improve the problem of weak confining regions. Description is made with placing emphasis on differences between this embodiment and the embodiment shown in FIG. 26. In the deflecting electromagnet 30c, the third pair of correcting electrodes 163 are placed in the vicinity of the outlet end of the inter-pole space 34 in the ion beam passing direction, and the fourth pair of correcting electrodes 164 are placed outside the outlet end of the inter-pole space 34 in the ion beam passing direction. Although not illustrated, the inlet side is configured in the same manner. Namely, the first pair of correcting electrodes 161 are placed in the vicinity of the inlet end of the inter-pole space 34 in the ion beam passing direction, and the second pair of correcting electrodes 162 are placed outside the inlet end of the inter-pole space 34 in the ion beam passing direction.

According to the configuration, a leakage magnetic field exists in the vicinities of end portions of the magnetic poles 32a, 32b, and the magnetic force lines 36 produced by the magnetic poles 32a, 32b are bent in the outward direction of the inter-pole space 34. Therefore, the composite electric field E and the magnetic field B can be prevented from being made parallel to each other in the vicinity of the correcting electrodes 164, and the weak confining region 172 shown in FIG. 26 can be prevented from being produced. Furthermore, the weak confining region 171 produced in the vicinities of the correcting electrodes 163 can be made small. This is applicable also to the vicinities of the correcting electrodes 161, 162 on the inlet side.

As described above, according to the deflecting electromagnet 30c shown in FIG. 28, with using the curvature of the magnetic force lines 36 in the vicinities of end portions of the magnetic poles 32a, 32b, reduction of the electron E×B drift of the electrons 38 in the vicinities of the correcting electrodes 161 to 164 is suppressed, whereby a weak electron confining region for the electrons 38 can be reduced. Therefore, the performance of confining the electrons 38 can be further enhanced. Furthermore, the distances between the first and second pairs of correcting electrodes 161, 162 and the third and fourth pairs of correcting electrodes 163, 164 can be prolonged, and the reciprocal confinement length of the electrons 38 along the ion beam passing direction can be made long. Therefore, a region where space charges of the ion beam 4 are neutralized can be widened. As a result, space charges of the ion beam 4 can be more efficiently neutralized, whereby the divergence of the ion beam 4 can be further suppressed, and therefore the transportation efficiency of the ion beam 4 can be further improved.

FIG. 29 shows an embodiment (sixth embodiment) which can improve the problem of weak confining regions. Description is made with placing emphasis on differences between this embodiment and the embodiment shown in FIG. 26. The deflecting electromagnet 30d comprises a pair (second pair) of permanent magnets 175 which are placed on the surfaces 33a, 33b of the magnetic poles 32a, 32b, and between the third pair of correcting electrodes 163 and the fourth pair of correcting electrodes 164 to intersect with the path of the ion beam 4, and which produce a magnetic field in a direction along which the magnetic field produced by the magnetic poles 32a, 32b is enhanced. The polarities of the faces of the upper and lower permanent magnets 175 which are oriented to the ion beam 4 are identical with those of the surfaces 33a, 33b of the magnetic poles 32a, 32b, respectively. Each of the permanent magnets 175 has a rod-like shape which extends in a direction intersecting with the passing direction of the ion beam 4.

Although not illustrated, the inlet side comprises permanent magnets similar to the permanent magnets 175. Namely, the inlet side comprises a pair (first pair) of permanent magnets which are placed on the surfaces 33a, 33b of the magnetic poles 32a, 32b, and between the first pair of correcting electrodes 161 and the second pair of correcting electrodes 162 to intersect with the path of the ion beam 4, and which produce a magnetic field in a direction along which the magnetic field produced by the magnetic poles 32a, 32b is enhanced.

In the deflecting electromagnet 30d, the magnetic field produced by the permanent magnets 175 is superimposed on that produced by the magnetic poles 32a, 32b to form the composite magnetic field B. Since the magnetic field produced by the permanent magnets 175 is bent, also the composite magnetic field B is bent in the inward and outward directions of the inter-pole space 34 (in other word, +X and −X directions). Several of magnetic force lines 176 indicating the magnetic field B are shown in FIG. 29. Since the magnetic field B is bent in this way, the magnetic field B and the composite electric field E can be prevented from being made parallel to each other in the vicinities of the correcting electrodes 163, 164, and the weak confining regions 171, 172 shown in FIG. 26 can be reduced or prevented from being produced. This occurs also in the vicinities of the correcting electrodes 161, 162 on the inlet side.

Furthermore, the composite magnetic field B in the vicinities of the permanent magnets 175 is stronger than that in the vicinity of the Y-axis. Therefore, the intensity of the magnetic field B is nonuniform, the Lamor radius of the electrons 38 is changed depending on the location, and there occurs a phenomenon that the cyclotron motion is shifted and the electrons 38 are caused to drift. This phenomenon is called a gradient B drift. Naturally, the phenomenon appears more strongly in the vicinities of the permanent magnets 175.

Figure 30:
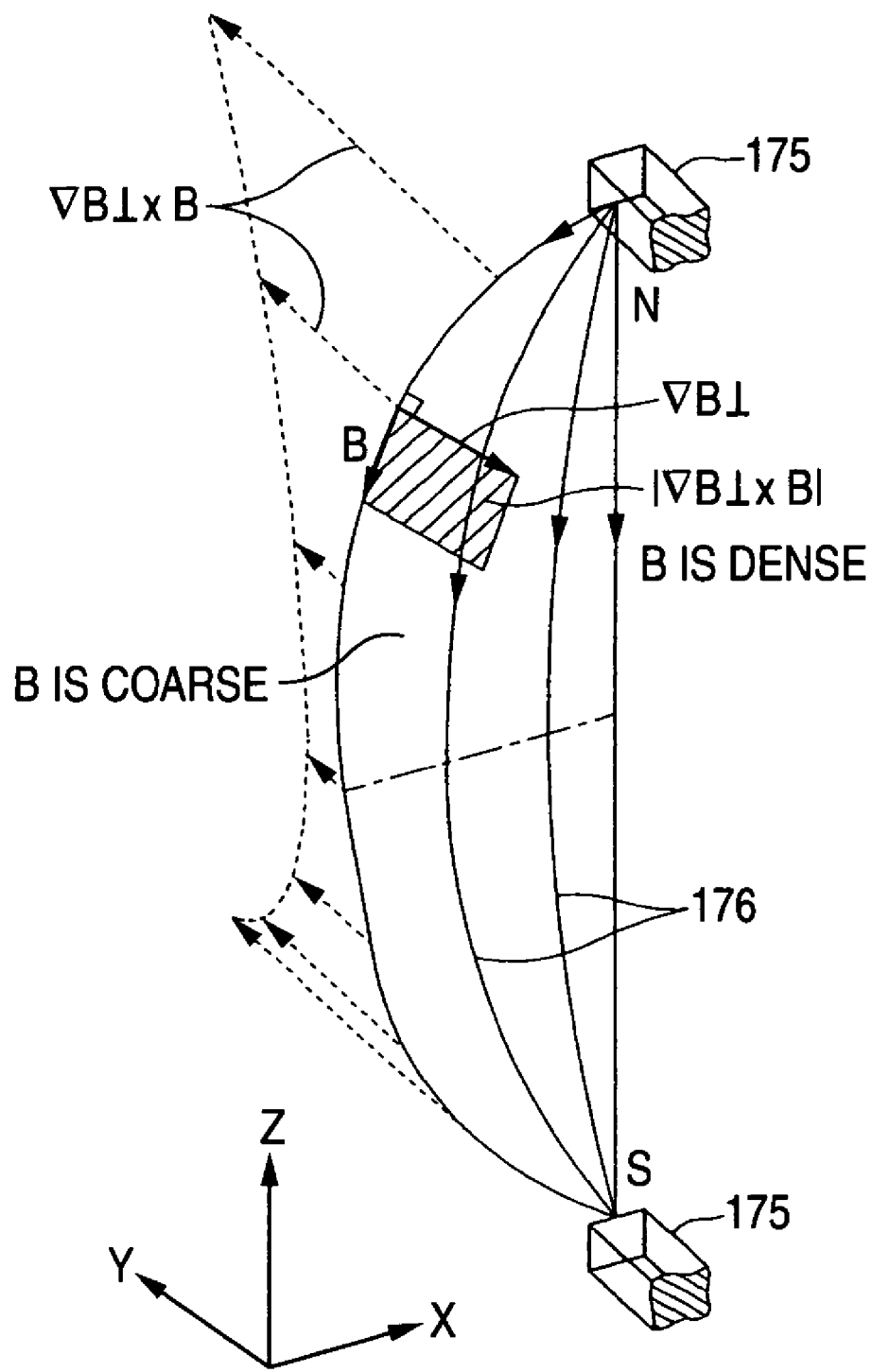
FIG. 30 is a diagram which schematically shows the gradient B drift of electrons caused by disposition of permanent magnets shown in FIG. 29, and in which only magnetic force lines on one side of the X direction are shown.

In FIG. 30, a component of the gradient $\nabla B$ of the magnetic field B which is perpendicular to the magnetic force lines 176 is indicated by $\nabla B \perp$. In FIG. 30, only the magnetic force lines 176 which are bent in the inward direction of the inter-pole space 34 (in other words, in the −X direction) are shown. However, there are also magnetic force lines which are bent in the outward direction of the inter-pole space 34 (in other words, in the +X direction). The magnetic field density gradient $\nabla B$ can be split into the component $\nabla B \perp$ which is perpendicular to the magnetic force lines 176, and a component $\nabla B \|$ which is parallel to the magnetic force lines. Since $\nabla B \| \times B = 0$, however, it is requested to consider only the vertical component $\nabla B \perp$. Therefore, the $\nabla B \perp \times B$ drift due to the component is hereinafter referred to as the gradient B drift. The magnetic force lines 176 are bent in the inward and outward directions of the inter-pole space 34. As shown in FIG. 30, in the half on the side where the magnetic force lines 176 are bent in the inward direction of the inter-pole space 34, therefore, the gradient B drift is oriented in the +Y direction, and, in the half on the side where the magnetic force lines are bent in the outward direction, the drift is oriented in the opposite direction or the −Y direction. Of course, the drift is not affected by an electric field.

Figure 31:
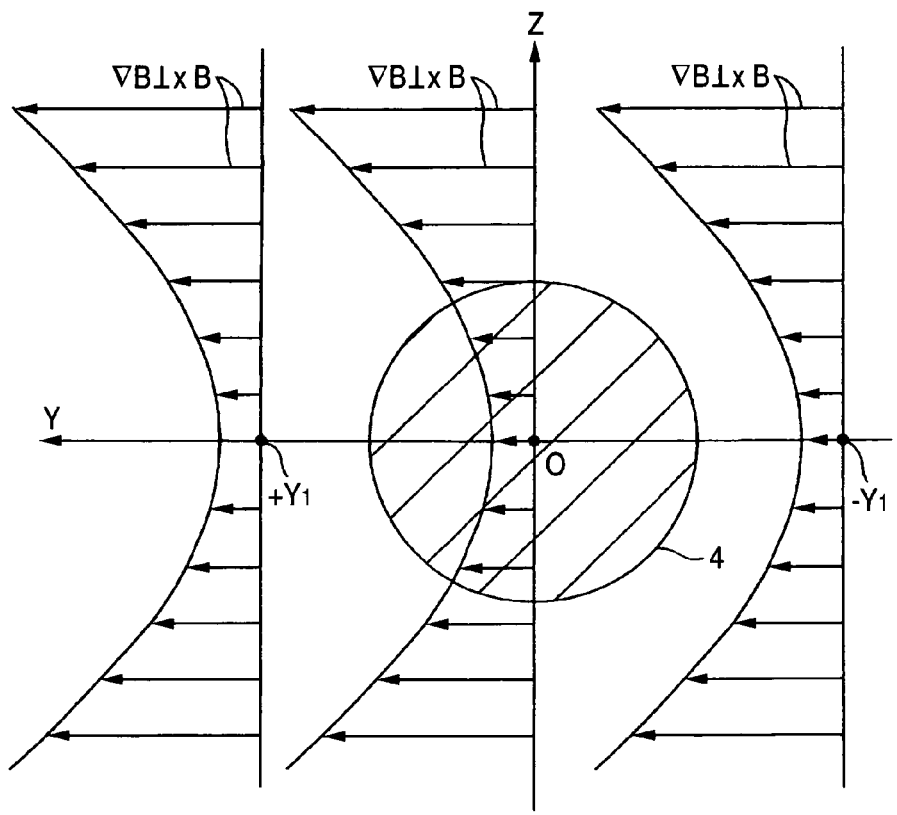
FIGS. 31A to 31C are diagrams schematically showing distributions at different Y-coordinate positions of the gradient B drift shown in FIG. 30.

As shown in FIGS. 31A to 31C, the magnitude and direction of the gradient B drift ($\nabla B \perp \times B$ drift) shown in FIG. 30 have a minimum value on the Y-axis, and are maximum in the vicinities of the upper and lower permanent magnets 175. The bent shape of the magnetic force lines 176 is not changed in the Y-axis direction, i.e., the longitudinal direction of the rod-like permanent magnets 175. As shown in FIGS. 31A to 31C of the figure, therefore, the drift is not changed depending on the Y-coordinate position (for example, $+Y_1$, 0, $-Y_1$).

In the same manner as described above, also in the vicinities of the permanent magnets on the inlet side of the inter-pole space 34, the gradient B drift is produced. Since the bending direction of the magnetic force lines is opposite, however, the direction of the drift is opposite to that on the outlet side. Namely, in the half on the side where the magnetic force lines are bent in the inward direction of the inter-pole space 34, the gradient B drift is oriented in the −Y direction, and, in the half on the side where the magnetic force lines are bent in the outward direction, the drift is oriented in the +Y direction.

The drift directions of the gradient B drift due to the magnetic fields of the inlet- and outlet side permanent magnets, and in the vicinities of the correcting electrodes 161, 163 will be considered. They are oriented in the directions of the arrows 181, 182 shown in FIG. 27, respectively. Therefore, the gradient B drift can enhance the Y-direction drifts of electrons in the vicinities of the correcting electrodes 161, 163, whereby the electron confining region can be expanded. Namely, the drifts in the directions indicated by the arrows 181 to 184 in FIG. 27 are connected to one another in a wider region in the Z direction, and hence closed electron orbits exist in the wider region in the Z direction.

As described above, according to the deflecting electromagnet 30d shown in FIG. 29, the disposition of the first and second pairs of permanent magnets can prevent or reduce the formation of a weak electron confining region in the vicinities of the correcting electrodes 161 to 164, and the Y-direction drift can be enhanced by the gradient B drift. Therefore, the electron confining region can be expanded. Consequently, the performance of confining the electrons 38 can be further enhanced. As a result, space charges of the ion beam 4 can be more efficiently neutralized, whereby the divergence of the ion beam 4 can be further suppressed, and therefore the transportation efficiency of the ion beam 4 an be further improved.

The first and second pairs of permanent magnets may not be placed on the surfaces 33a, 33b of the magnetic poles 32a, 32b, and may be placed in the vicinities of the surfaces 33a, 33b. Also in this case, the same effects as described above are attained.

The deflecting electromagnet 30c of the fifth embodiment shown in FIG. 28 will be considered in more detail. In end portions of the magnetic poles 32a, 32b, the magnetic force lines 36 due to the magnetic poles protrude to the outside, and the magnetic field B is weakened in the outside. Therefore, the gradient B occurs in a direction along which the magnetic field B is strong (i.e., in the inward direction of the inter-pole space 34), and the gradient B drift occurs in the direction of ∇B×B. In FIG. 28, |∇B×B| indicates the magnitude of the drift. The reference numeral 188 denotes equipotential lines of the magnitude |B| of the magnetic field B produced by the magnetic poles 32a, 32b. The gradient B drift acts in a direction of canceling the function of confining the electrons 38 by the above-described E×B drift, and correspondingly the performance of confining the electrons 38 is slightly lowered. As in the case of, for example, the deflecting electromagnet 30b shown in FIG. 26, when the correcting electrodes 161 to 164 are placed inner than the end of the inter-pole space 34 (namely, the ends of the magnetic poles 32a, 32b), bending of the magnetic force lines 36 produced by the magnetic poles 32a, 32b is not produced or is small in the places, or in other words the magnetic field produced by the magnetic poles 32a, 32b is uniform or substantially uniform. Therefore, the gradient B is not generated or is very small. As advancing further inwardly in the inter-pole space 34, the magnetic field produced by the magnetic poles 32a, 32b is more uniform.

Figure 32:
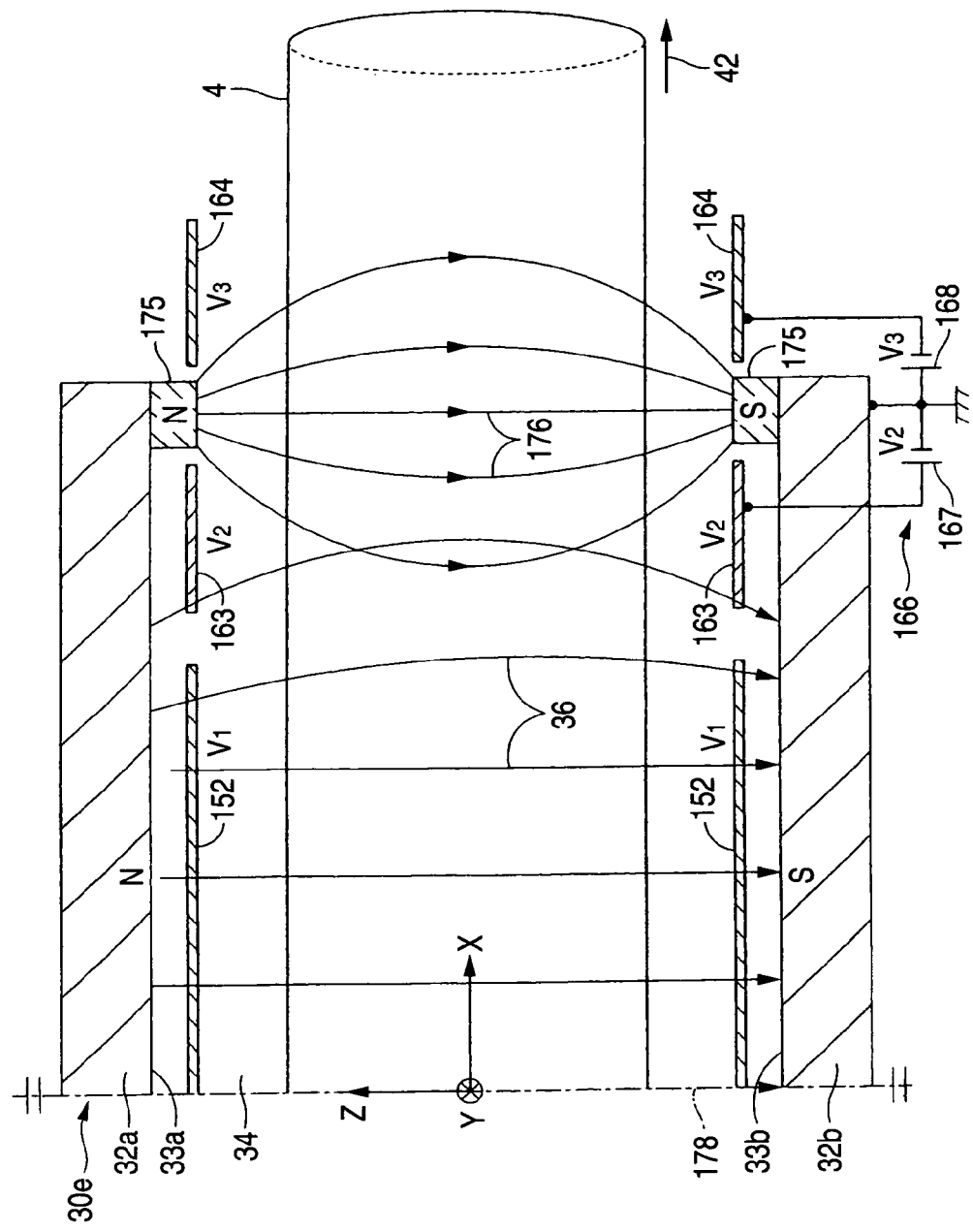
FIG. 32 is a schematic longitudinal section view showing an outlet-side half of a seventh embodiment of the deflecting electromagnet of the invention.

In order to solve the above-discussed problem of the deflecting electromagnet 30c of the fifth embodiment, for example, the pair of permanent magnets 175 may be disposed between the third pair of correcting electrodes 163 and the fourth pair of correcting electrodes 164, and in or in the vicinities of end portions of the magnetic poles 32a, 32b as in a deflecting electromagnet 30e of a seventh embodiment shown in FIG. 32. Although not illustrated, also in the inlet side, a pair of permanent magnets similar to the permanent magnets 175 may be disposed between the first pair of correcting electrodes 161 and the second pair of correcting electrodes 162, and in or in the vicinities of end portions of the magnetic poles 32a, 32b. According to the configuration, bending of the magnetic field produced by the magnetic poles 32a, 32b is corrected (suppressed) by the magnetic field (an example of magnetic force lines is indicated by the reference numeral 176) produced by the permanent magnets 175, so that the gradient B, and therefore the gradient B drift can be reduced. As a result, the performance of confining the electrons 38 is improved.

A comparison of the performances of confining the electrons 38 in the deflecting electromagnets of the related-art example and the third to seventh embodiments will be described hereinafter with reference to results of simulations of an electron orbit and the electron confining region.

Figure 33:
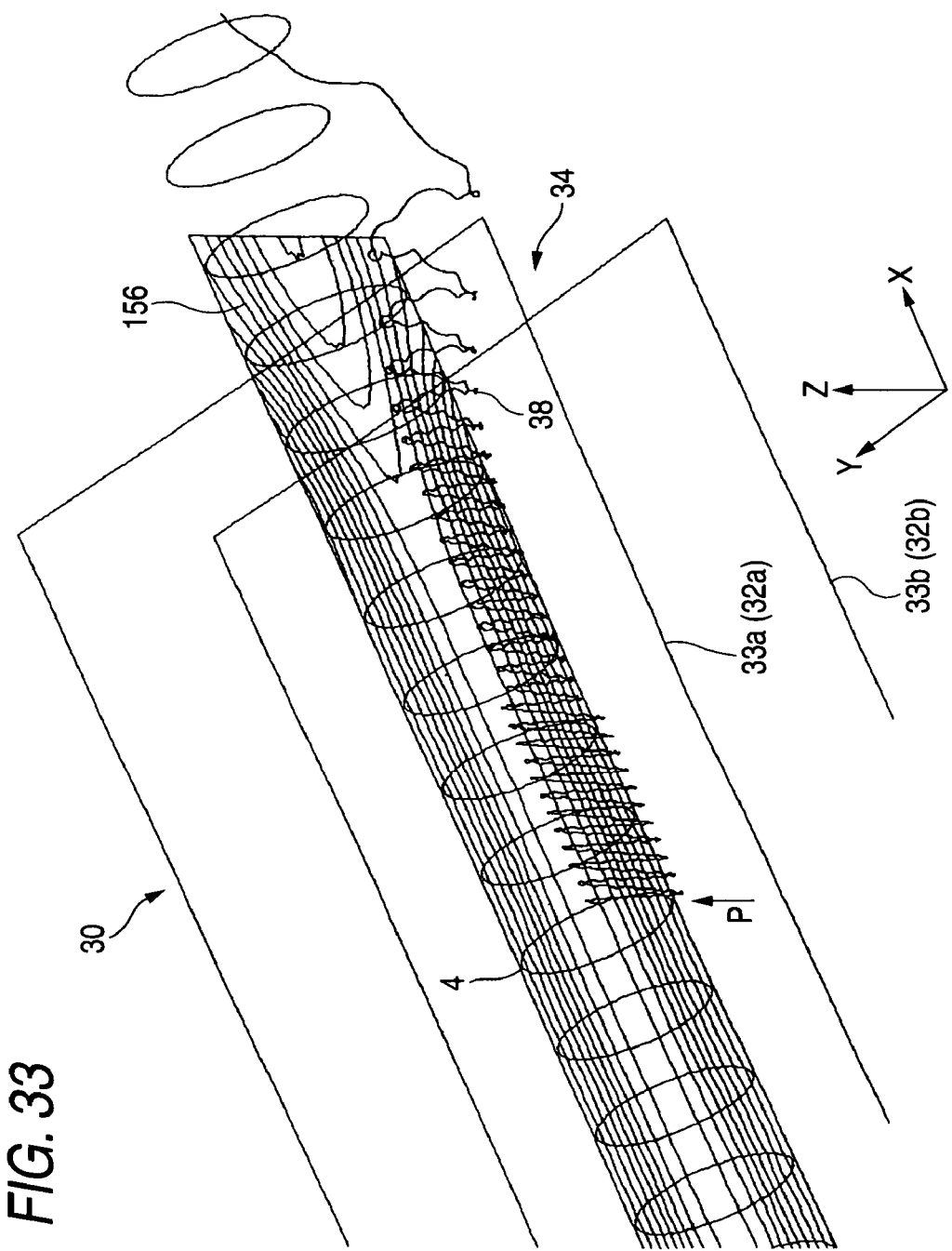
FIG. 33 is a view showing an example of results of a simulation of an electron orbit in the related-art deflecting electromagnet.
Figure 34:
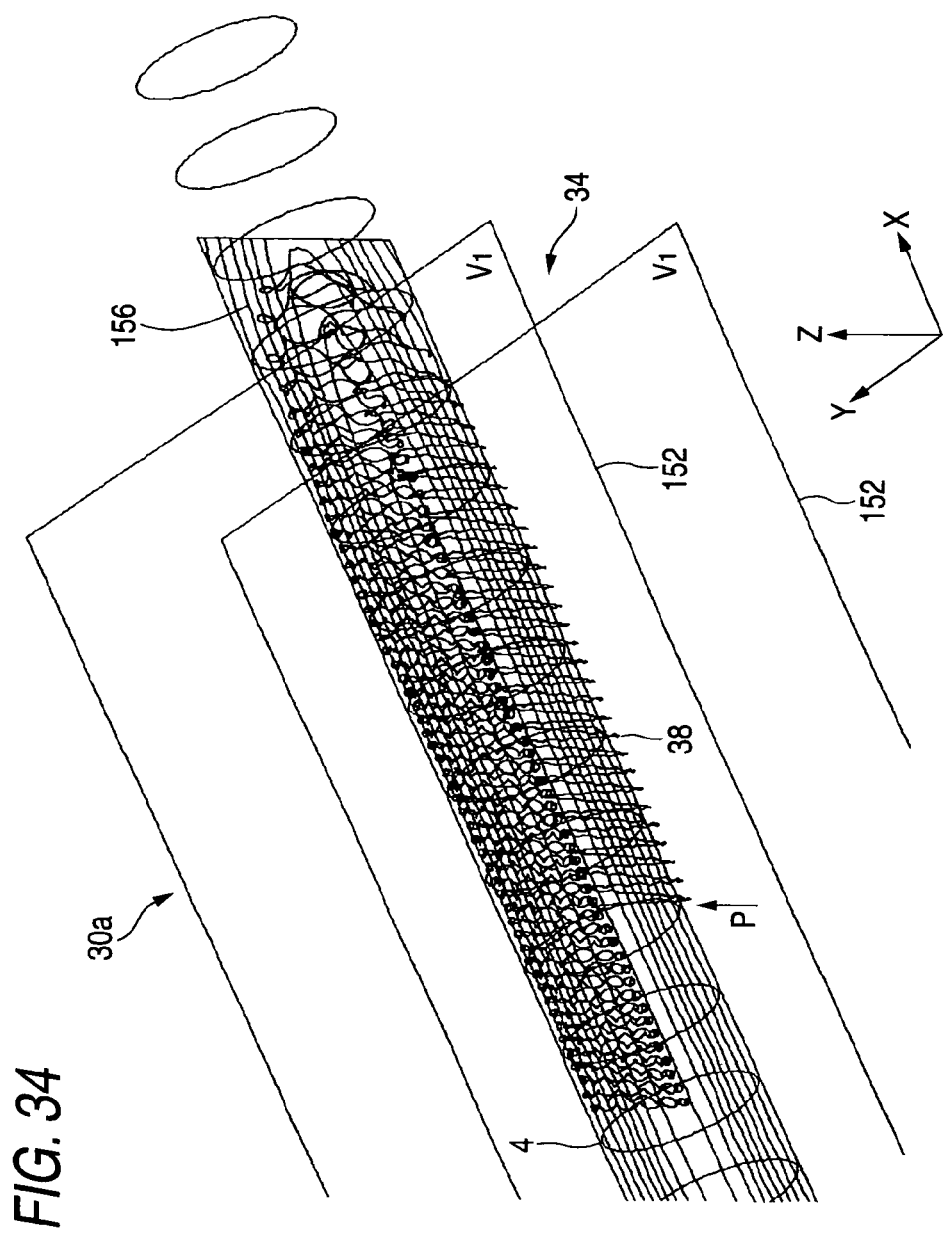
FIG. 34 is a view showing an example of results of a simulation of an electron orbit in the deflecting electromagnet of the third embodiment.

Examples of results of simulations of an electron orbit in the related-art deflecting electromagnet 30 and the deflecting electromagnets 30a to 30e of the third to seventh embodiments are shown in FIGS. 33 to 39. In FIGS. 33 to 39, with respect to the magnetic poles 32a, 32b, only their surfaces 33a, 33b are shown. In FIG. 34, the potential adjusting electrodes 152 which are disposed on the surfaces of the magnetic poles are illustrated in place of the magnetic poles, In the simulations, the dimensions of the magnetic poles 32a, 32b were set so that the total length in the X direction is 0.3 m, that in the Y direction is 0.16 m, and the distance between the magnetic poles 32a, 32b is 0.065 m. In the deflecting electromagnets 30d, 30e shown in FIGS. 38 and 39, the permanent magnets 175 in which the residual flux density is 1 T (Tesla), the width (the dimension in the X direction) is 5 mm, and the thickness (the dimension in the Z direction) is 3 mm are attached to the surfaces 33a, 33b of the magnetic poles 32a, 32b, respectively. The intensity of the magnetic field which is produced in the middle of the inter-pole space 34 in the X and Y directions by the magnetic poles 32a, 32b is about 10 mT. It is assumed that the ion beam 4 is formed by a columnar uniform current. The radius was set to 0.02 m, the current to 1 mA, the energy to 5 keV, and the ion species was monovalent boron. Also the equipotential lines 156 of the ion beam 4 are shown in the figures. The electrons 38 were emitted from the position indicated by the arrow P in the figure, i.e., the vicinity of the origin which is at the middle of the inter-pole space 34. The energy of the electrons 38 was set to 10 eV.

As shown in FIG. 33, in the related-art deflecting electromagnet 30, the orbit of the electrons 38 is largely deviated from the ion beam 4 in the vicinity of the X-direction end of the inter-pole space 34, and the electrons 38 cannot be confined. This is applicable also to the case where the potential adjusting electrodes 152 were disposed and the voltage $V_1$ to be applied to them was 0 V.

In the deflecting electromagnet 30a of the third embodiment shown in FIG. 34, the voltage $V_1$ to be applied to the potential adjusting electrodes 152 was 180 V. The orbit of the electrons 38 is closed, and the electrons 38 can be confined.

Figure 35:
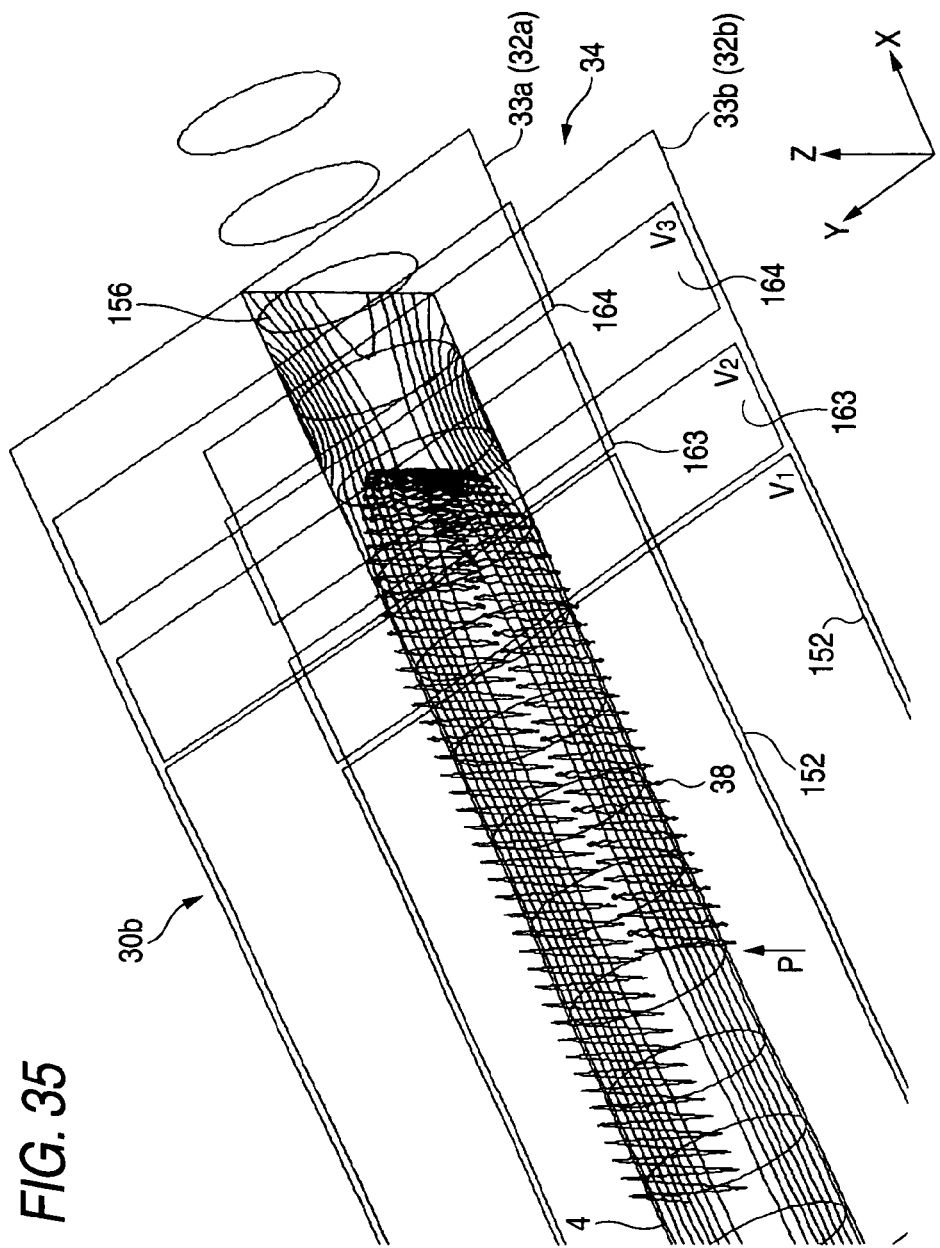
FIG. 35 is a view showing an example of results of a simulation of an electron orbit in the deflecting electromagnet of the fourth embodiment.

In the deflecting electromagnet 30b of the fourth embodiment shown in FIG. 35, the voltages $V_1$, $V_2$, and $V_3$ to be applied to the potential adjusting electrodes 152 and the correcting electrodes 163, 164 were 15 V, 15 V, and −15 V, respectively. Also the voltages $V_2$ and $V_3$ to be applied to the correcting electrodes 161, 162 (not shown in the figure) on the inlet side were 15 V and −15 V, respectively. The orbit of the electrons 38 is closed, and the electrons 38 can be confined. In the third embodiment shown in FIG. 34, a voltage as high as 180 V is required for confining electrons. In the fourth embodiment, the voltage can be lowered to 15 V.

Figure 36:
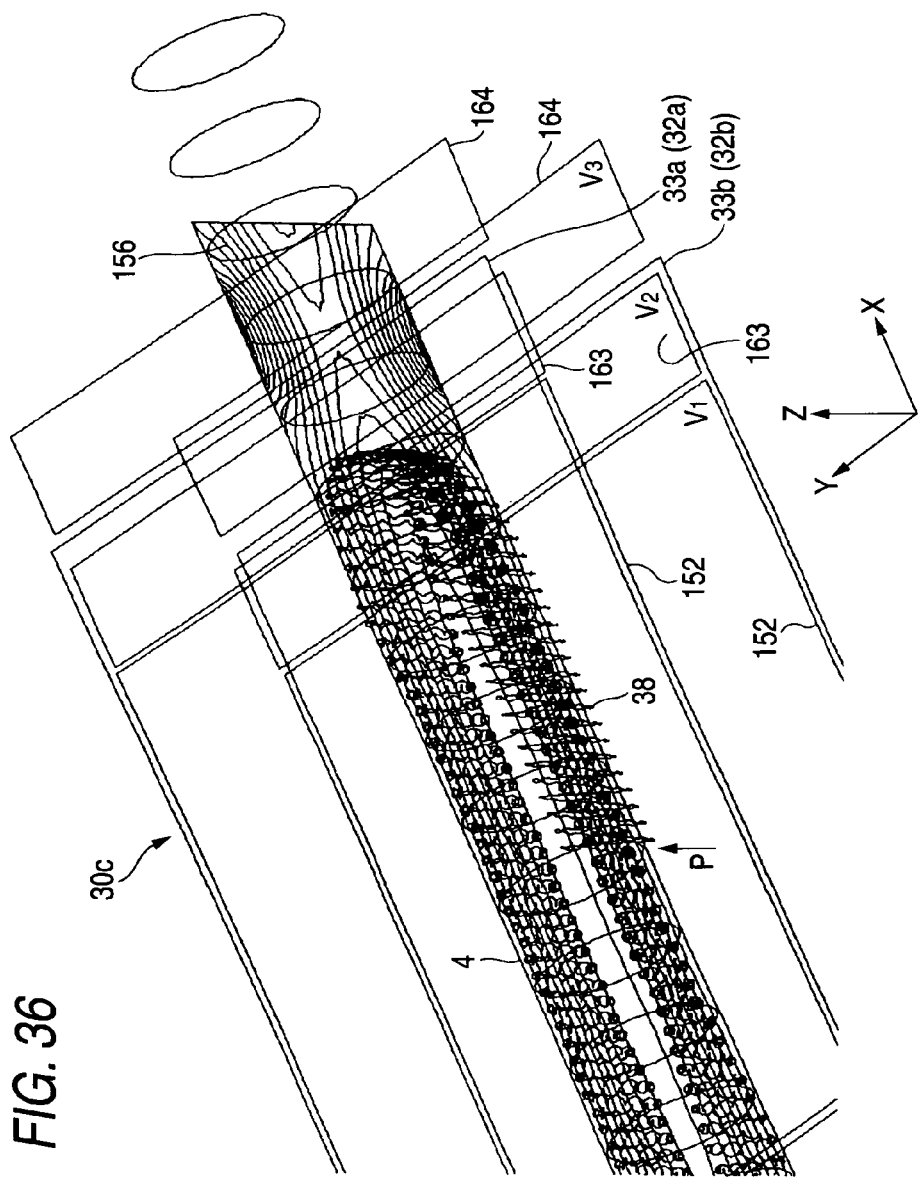
FIG. 36 is a view showing an example of results of a simulation of an electron orbit in the deflecting electromagnet of the fifth embodiment.

In the deflecting electromagnet 30c of the fifth embodiment shown in FIG. 36, the voltages $V_1$, $V_2$, and $V_3$ to be applied to the potential adjusting electrodes 152 and the correcting electrodes 163, 164 were 30 V, 30 V, and −30 V, respectively. Also the voltages $V_2$ and $V_3$ to be applied to the correcting electrodes 161, 162 (not shown in the figure) on the inlet side were 30 V and −30 V, respectively. The orbit of the electrons 38 is closed, and the electrons 38 can be confined. In the embodiment, the voltage is slightly high or 30 V.

Figure 37:
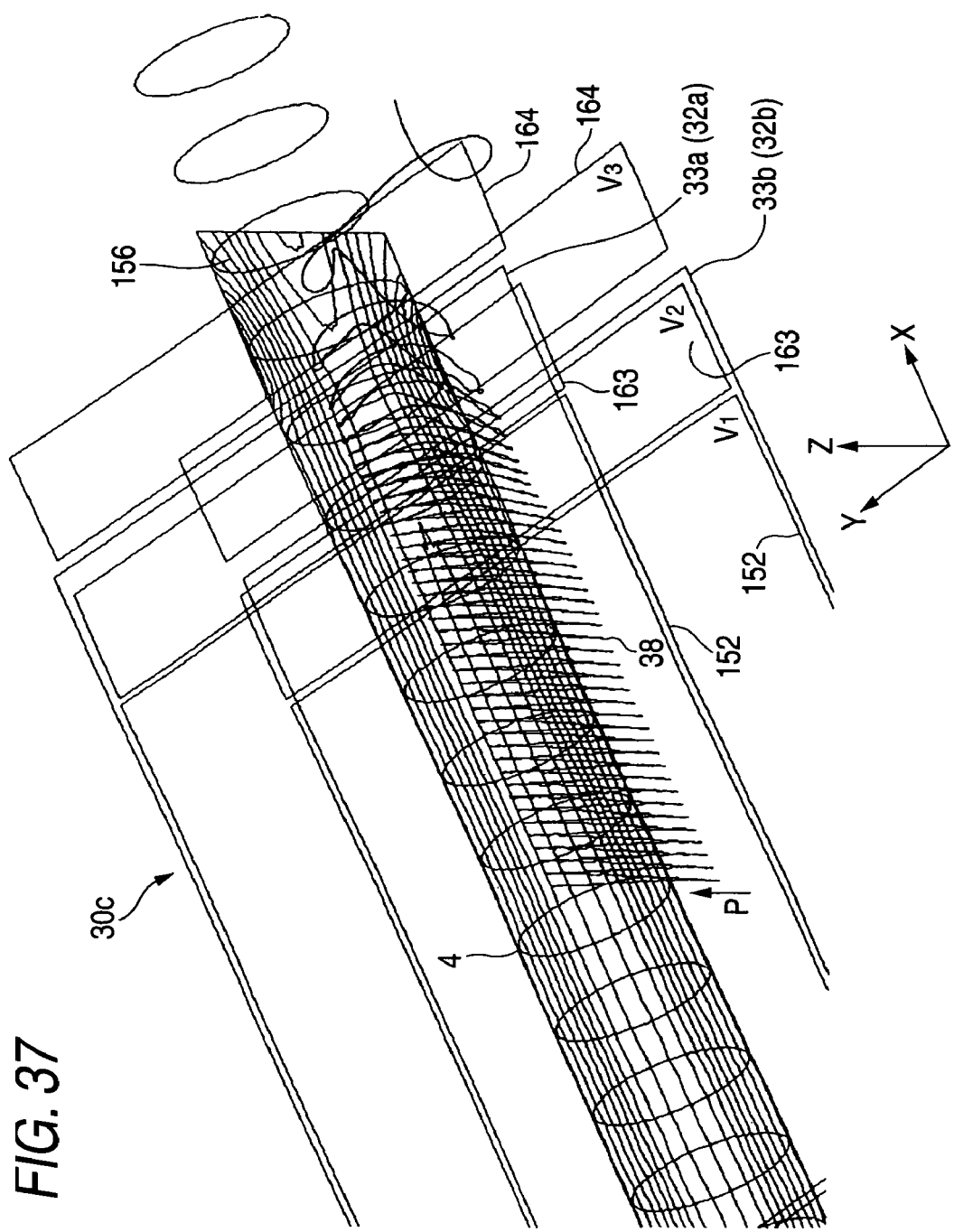
FIG. 37 is a view showing another example of results of a simulation of an electron orbit in the deflecting electromagnet of the fifth embodiment.

FIG. 37 shows the case where, in the deflecting electromagnet 30c of the fifth embodiment, the voltages $V_1$, $V_2$, and $V_3$ to be applied to the potential adjusting electrodes 152 and the correcting electrodes 163, 164 were 8 V, 8 V, and −8 V, respectively, and the electrons 38 were not confined. In this case, also the voltages to be applied to the correcting electrodes 161, 162 (not shown in the figure) on the inlet side were 8 V and −8 V, respectively.

Figure 38:
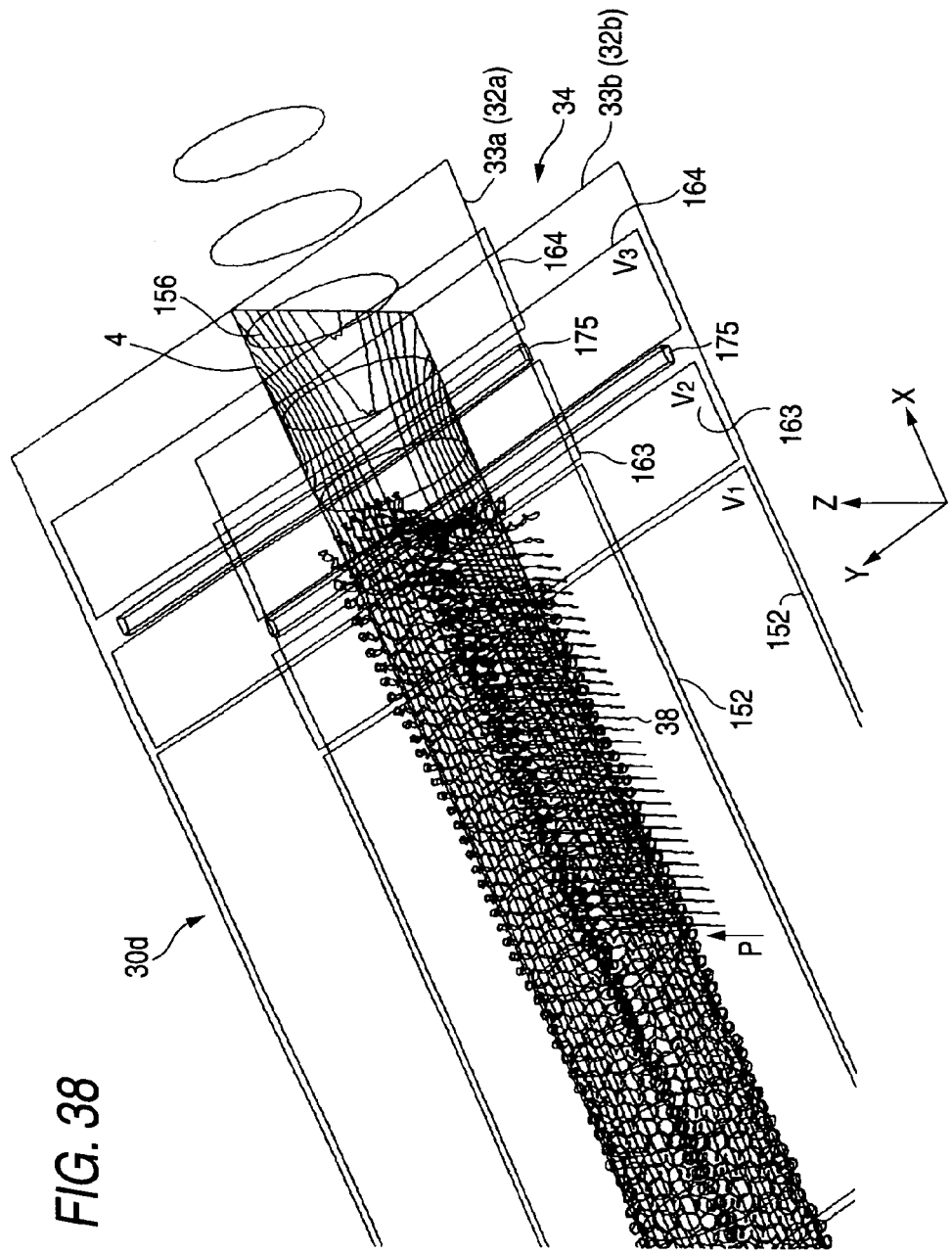
FIG. 38 is a view showing an example of results of a simulation of an electron orbit in the deflecting electromagnet of the sixth embodiment.
Figure 39:
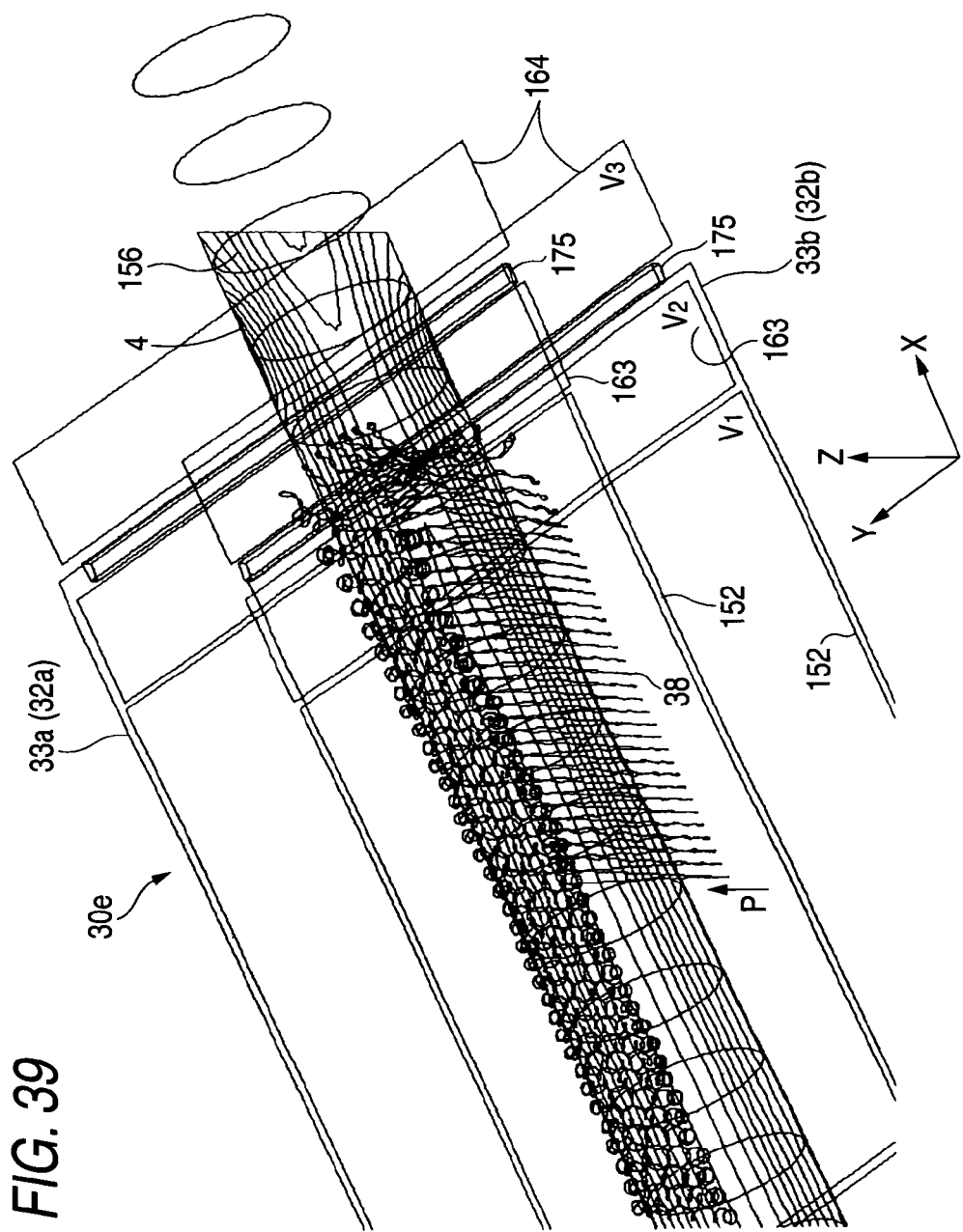
FIG. 39 is a view showing an example of results of a simulation of an electron orbit in the deflecting electromagnet of the seventh embodiment.

In the case where the permanent magnets 175 are added as in the deflecting electromagnet 30d of the sixth embodiment shown in FIG. 38 (although not shown in the figure, permanent magnets corresponding to the permanent magnets 175 are added to the inlet side), even when the voltages $V_1$, $V_2$, and $V_3$ are lowered 5 V, 5 V, and −5 V, respectively, the orbit of the electrons 38 is closed, and the electrons 38 can be confined. Namely, the voltage can be lowered more than the fourth embodiment shown in FIG. 35.

In the case shown in FIG. 37, it was impossible to confine the electrons 38. In the case where the permanent magnets 175 are added as in the deflecting electromagnet 30e of the seventh embodiment shown in FIG. 39 (although not shown in the figure, permanent magnets corresponding to the permanent magnets 175 are added to the inlet side), even when the voltages are identical with those in the case of FIG. 37, or the voltages $V_1$, $V_2$, and $V_3$ are 8 V, 8 V, and −8 V, respectively, however, the orbit of the electrons 38 is closed, and the electrons 38 can be confined.

In order to check the range of confining the electrons 38 in the deflecting electromagnets having the structures shown in FIGS. 33 to 39, the electrons 38 are emitted from the vicinity of the origin at the middle of the inter-pole space 34, and a confining region $A_c$ (hatched region) for the electrons 38 and a non-confining region $A_N$ (unhatched region) with respect to the emission position in the YZ-plane are schematically shown in FIGS. 40 to 50.

Figure 40:
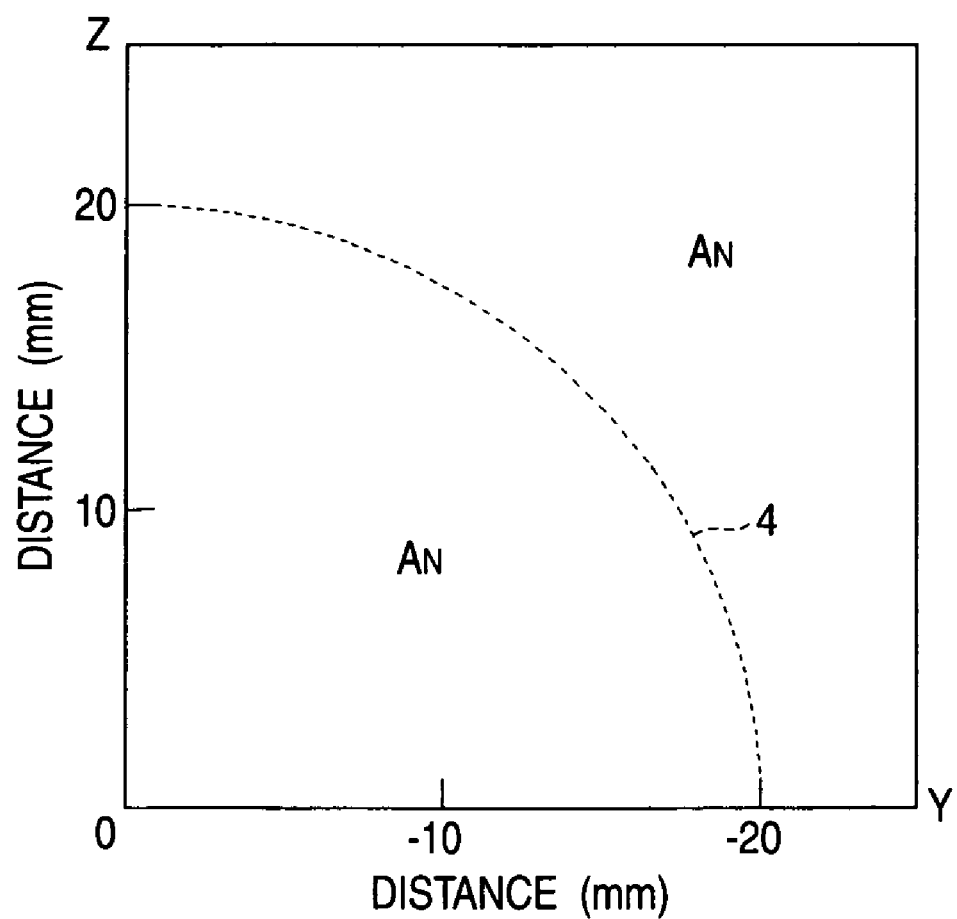
FIG. 40 is a diagram schematically showing an electron confining region and a non-confining region in the related-art deflecting electromagnet.

As shown in FIG. 40, in the related-art deflecting electromagnet 30, the confining region does not exist, and the whole region in the ion beam 4 and its peripheral face is the non-confining region $A_N$.

Figure 41:
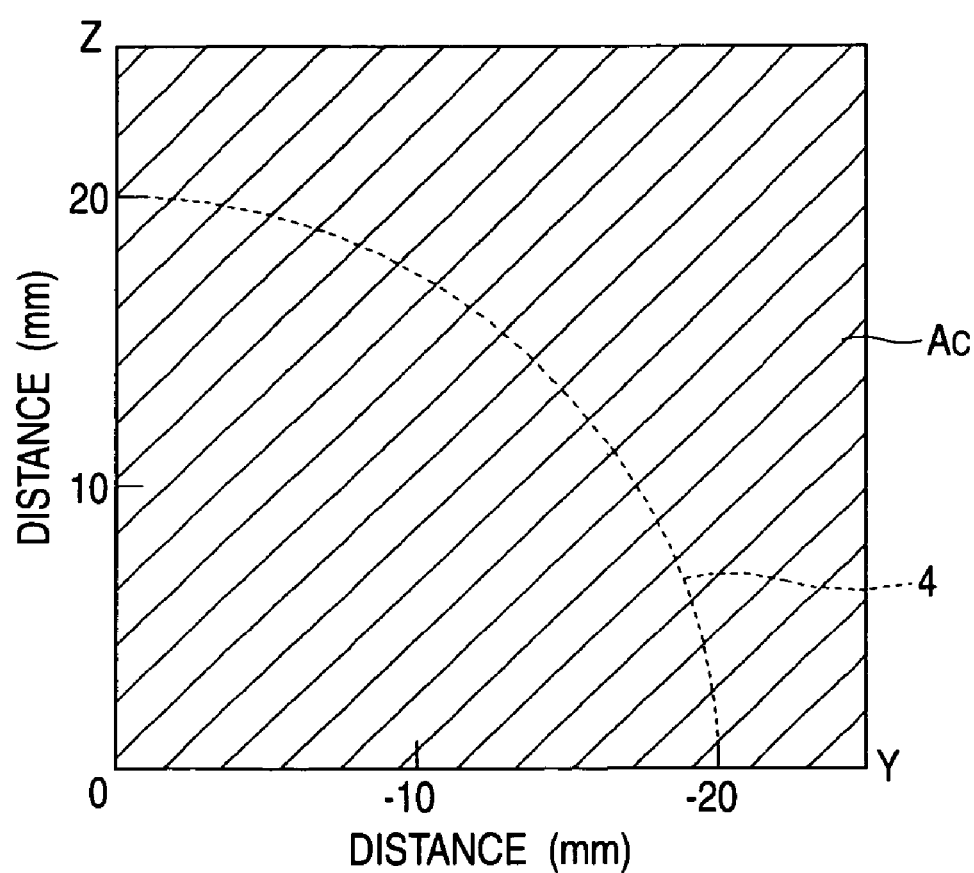
FIG. 41 is a diagram schematically showing an example of an electron confining region and a non-confining region in the deflecting electromagnet of the third embodiment.

FIG. 41 shows the case where, in the deflecting electromagnet 30a of the third embodiment, the voltage $V_1$ was 180 V. The whole region in the ion beam 4 and the vicinity thereof is the confining region $A_c$.

Figure 42:
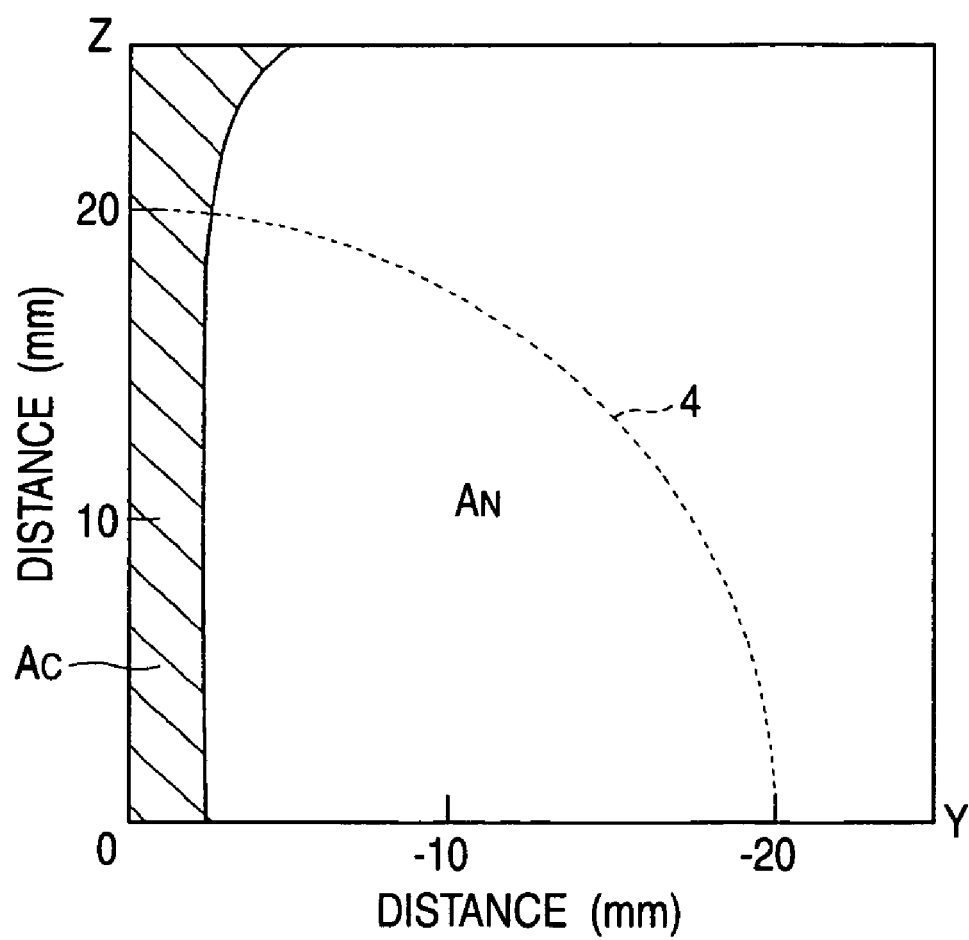
FIG. 42 is a diagram schematically showing another example of the electron confining region and the non-confining region in the deflecting electromagnet of the third embodiment.

In the deflecting electromagnet 30a of the third embodiment, when the voltage $V_1$ is 30 V, the confining region $A_c$ is very narrow as shown in FIG. 42.

Figure 43:
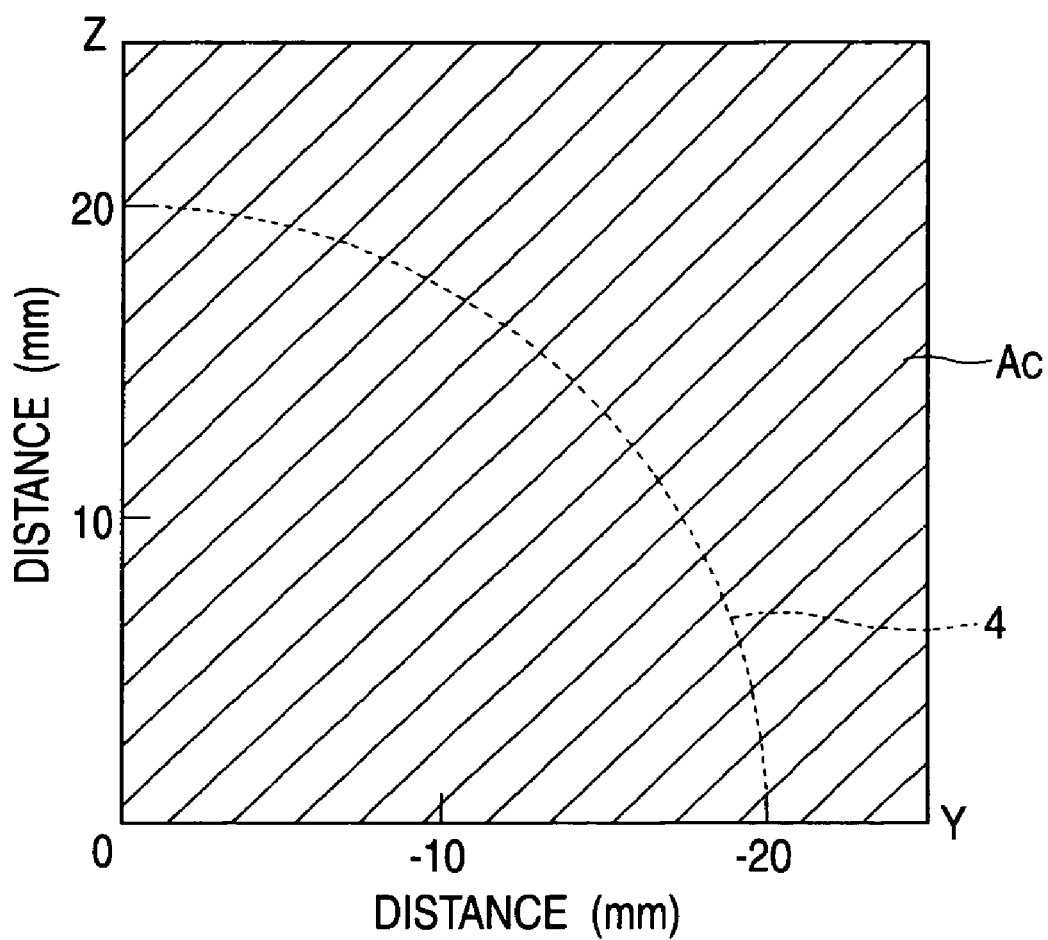
FIG. 43 is a diagram schematically showing an example of an electron confining region and a non-confining region in the deflecting electromagnet of the fourth embodiment.

FIG. 43 shows the case where, in the deflecting electromagnet 30b of the fourth embodiment, the voltages $V_1$, $V_2$, and $V_3$ were 30 V, 30 V, and −30 V, respectively. The whole region in the ion beam 4 and the vicinity thereof is the confining region $A_c$. A voltage which is lower than the case of FIG. 41 can be used. Therefore, a considerable effect is attained.

Figure 45:
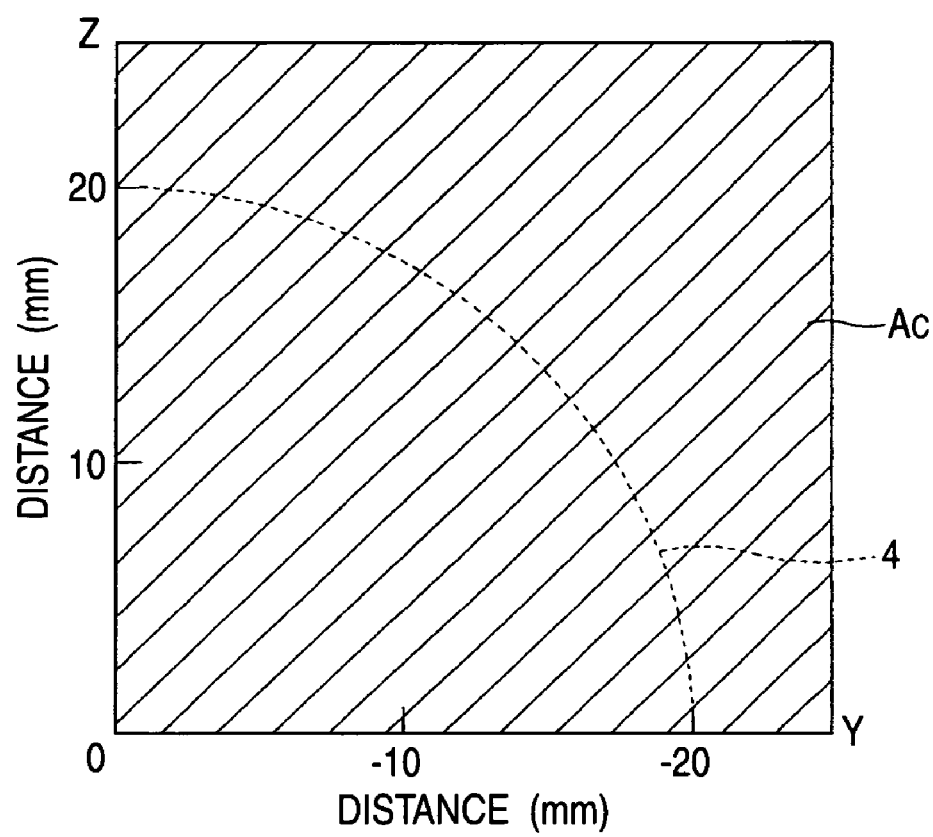
FIG. 45 is a diagram schematically showing an example of an electron confining region and a non-confining region in the deflecting electromagnet of the fifth embodiment.

FIG. 45 shows the case where, in the deflecting electromagnet 30c of the fifth embodiment, the voltages $V_1$, $V_2$, and $V_3$ were 30 V, 30 V, and −30 V, respectively. The whole region in the ion beam 4 and the vicinity thereof is the confining region $A_c$. A voltage which is lower than the case of FIG. 41 can be used. Therefore, a considerable effect is attained.

Figure 44:
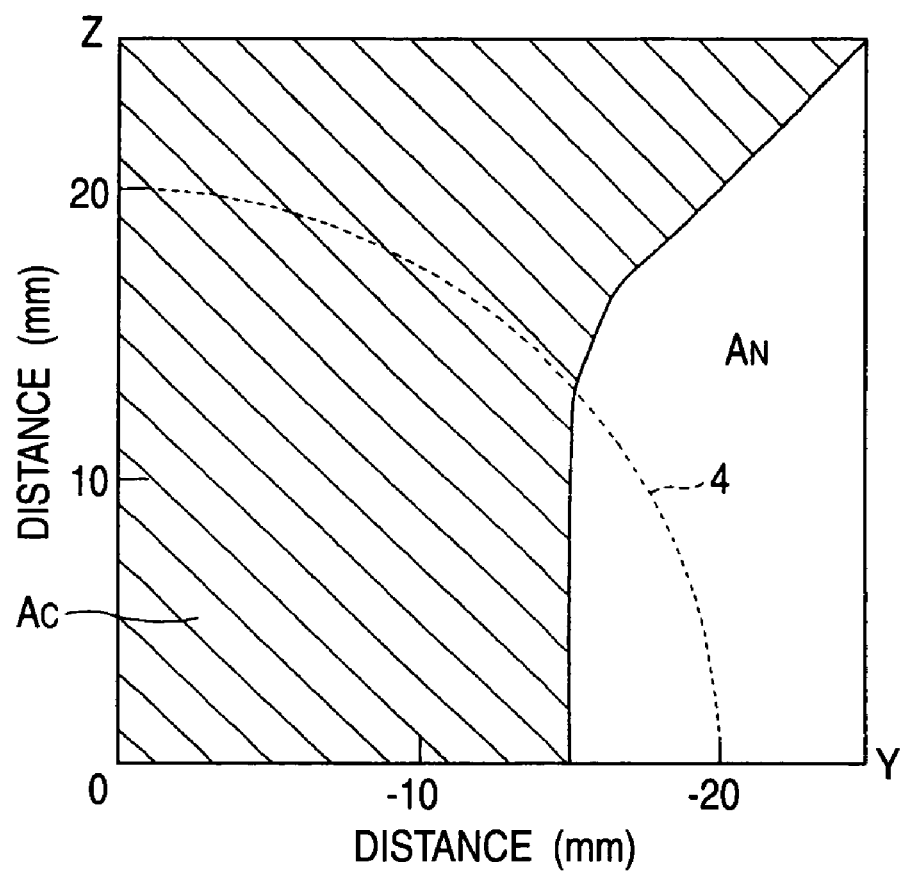
FIG. 44 is a diagram schematically showing another example of the electron confining region and the non-confining region in the deflecting electromagnet of the fourth embodiment.
Figure 46:
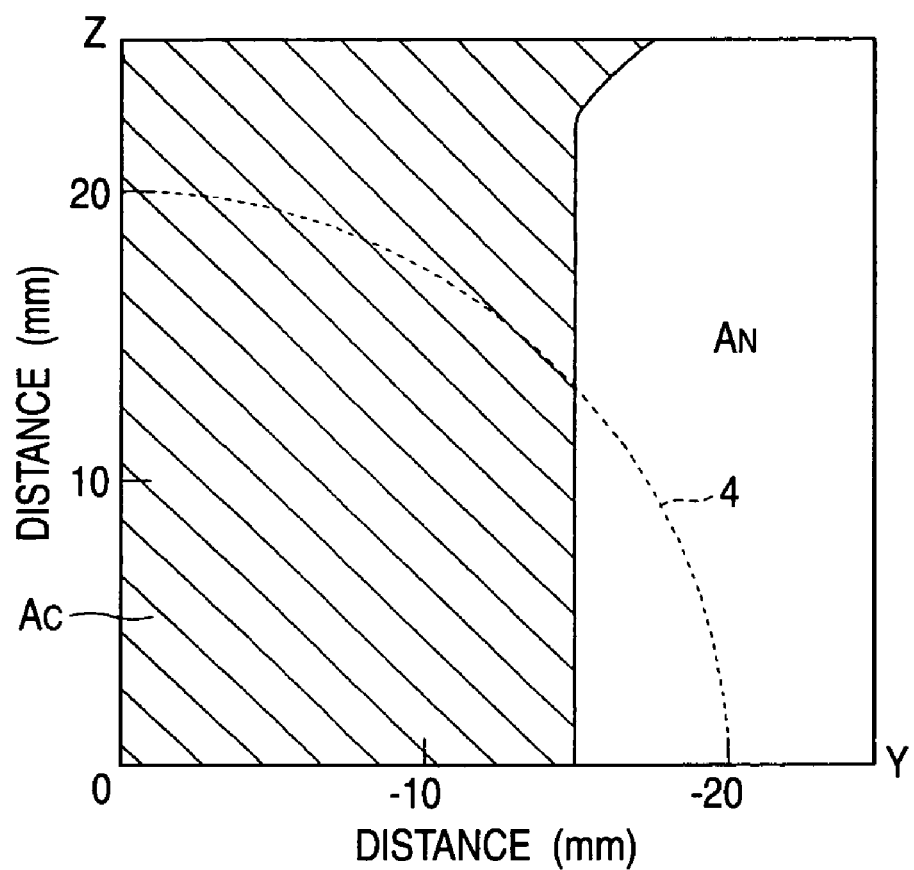
FIG. 46 is a diagram schematically showing another example of the electron confining region and the non-confining region in the deflecting electromagnet of the fifth embodiment.

In order to check differences in effect between the deflecting electromagnet 30b of the fourth embodiment and the deflecting electromagnet 30c of the fifth embodiment, the confining range was checked while the voltages $V_1$, $V_2$, and $V_3$ were lowered or set to 15 V, 15 V, and −15 V, respectively. The results are shown in FIGS. 44 and 46. The confining region $A_c$ in FIG. 44 is wider than that in FIG. 46. Therefore, the confining performance of the fourth embodiment is slightly better.

Figure 47:
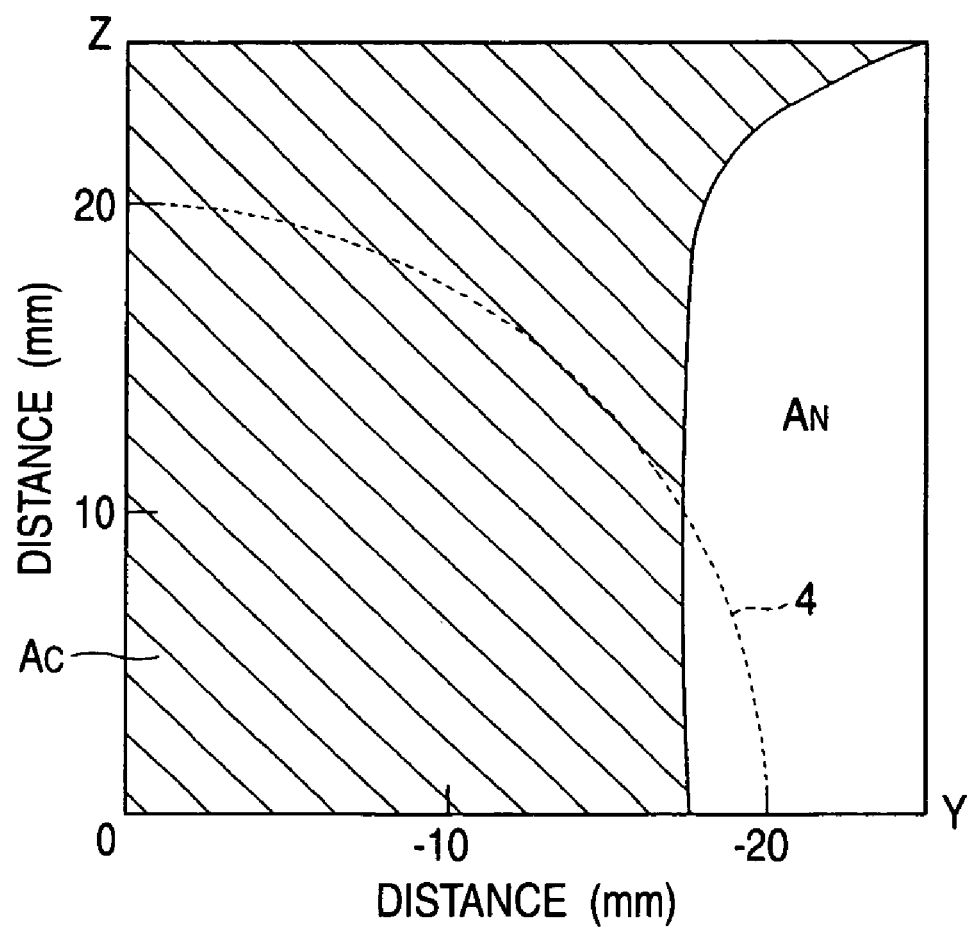
FIG. 47 is a diagram schematically showing an example of an electron confining region and a non-confining region in the deflecting electromagnet of the sixth embodiment.

FIG. 47 shows the case where, in the deflecting electromagnet 30d of the sixth embodiment, the voltages $V_1$, $V_2$, and $V_3$ were 15 V, 15 V, and −15 V, respectively. As compared with FIG. 44 showing results in the case (the fourth embodiment) where the voltages are set in the same manner and the permanent magnets are not disposed, the confining region $A_c$ is wider.

Figure 49:
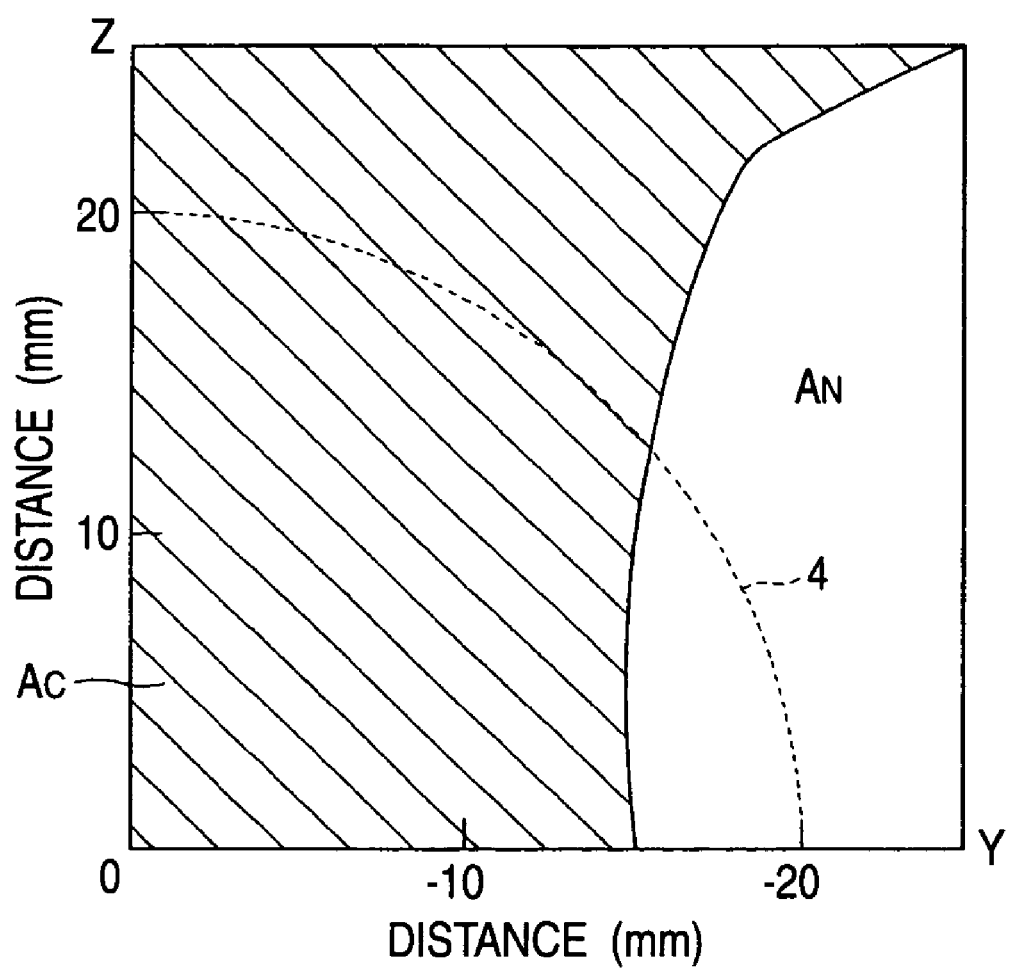
FIG. 49 is a diagram schematically showing an example of an electron confining region and a non-confining region in the FIG. 50 is a diagram schematically showing another example of the electron confining region and the non-confining region in the deflecting electromagnet of the seventh embodiment.

FIG. 49 shows the case where, in the deflecting electromagnet 30e of the seventh embodiment, the voltages $V_1$, $V_2$, and $V_3$ were 15 V, 15 V, and −15 V, respectively. As compared with FIG. 46 showing results in the case (the fifth embodiment) where the voltages are set in the same manner and the permanent magnets are not disposed, the confining region $A_c$ is wider.

Figure 48:
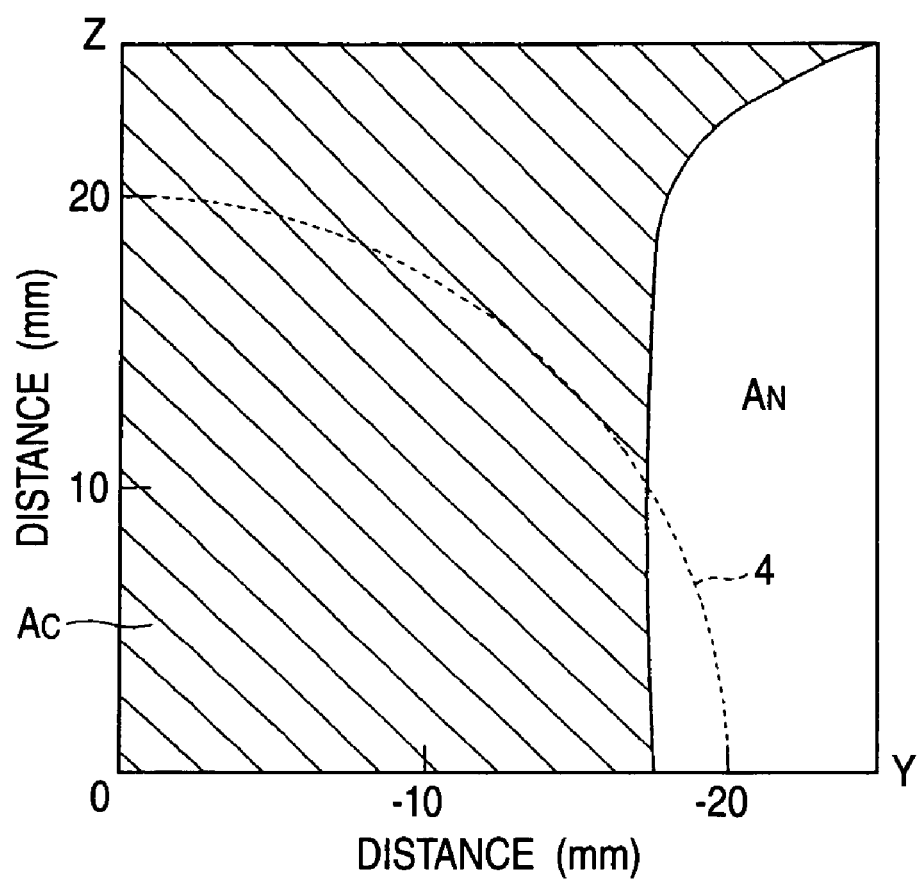
FIG. 48 is a diagram schematically showing another example of the electron confining region and the non-confining region in the deflecting electromagnet of the sixth embodiment.
Figure 50:
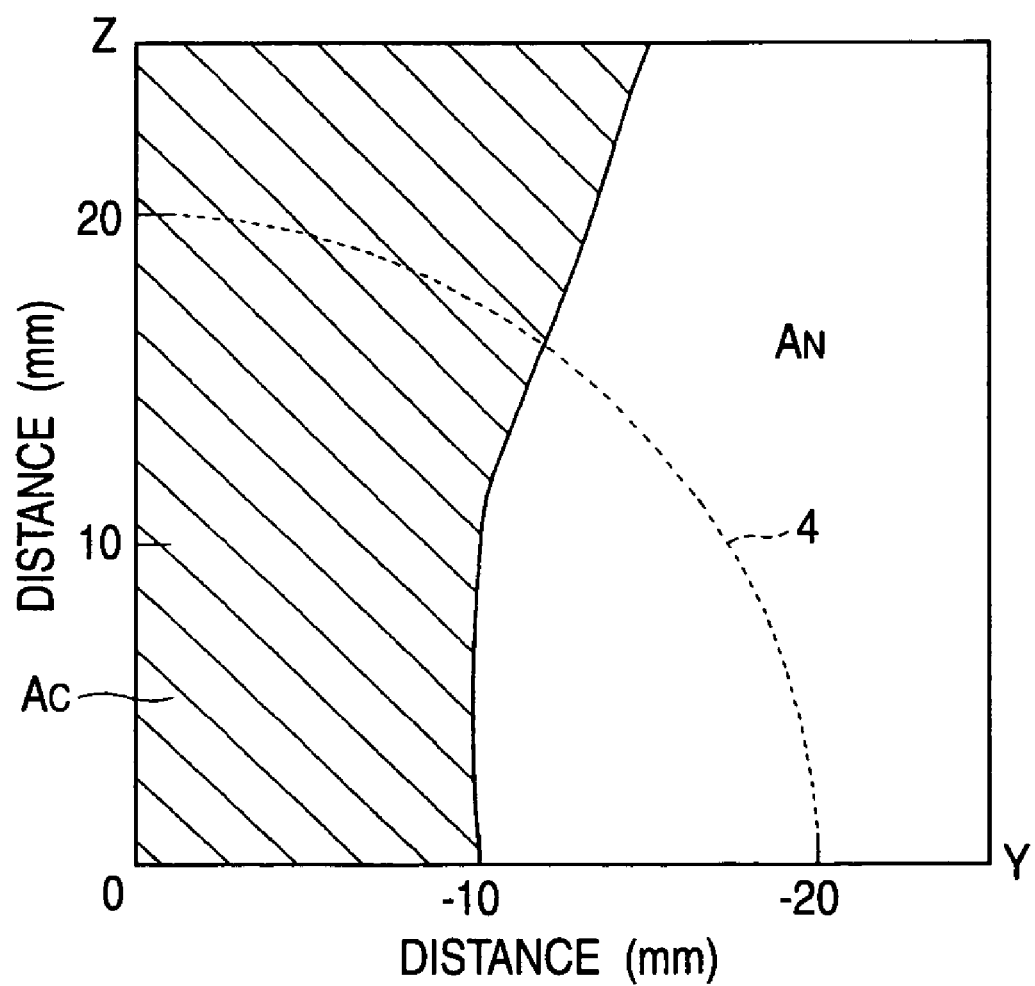

FIGS. 48 and 50 show the cases where, in the deflecting electromagnet 30d of the sixth embodiment and the deflecting electromagnet 30e of the seventh embodiment, the voltages $V_1$, $V_2$, and $V_3$ were lowered or set to 8 V, 8 V, and −8 V, respectively. The confining region $A_c$ in FIG. 48 is wider than that in FIG. 50. Therefore, the confining performance of the sixth embodiment is slightly better.

As described above, when the voltages are low, the deflecting electromagnets 30d, 30e of the sixth and seventh embodiments exhibit a higher performance of confining the electrons 38. When the electromagnets are strictly compared with each other, the performance of confining the electrons 38 in the deflecting electromagnet 30d of the sixth embodiment is slightly higher. In the deflecting electromagnet 30d of the sixth embodiment, the correcting electrodes 161, 164 are not disposed outside the magnetic poles 32a, 32b unlike the deflecting electromagnet 30e of the seventh embodiment, and hence the arrangement can be easily performed. Therefore, it can be said that the deflecting electromagnet 30d of the sixth embodiment is most useful.

The deflecting electromagnets 30a to 30e of the embodiments can be used in an ion beam irradiating apparatus. In an ion beam irradiating apparatus having a configuration which irradiates a target with the ion beam 4 emitted from an ion source, one or more of any one of the deflecting electromagnets 30a to 30e of the third to seventh embodiments may be disposed in a path of the ion beam 4 from the ion source to the target. For example, any one of the deflecting electromagnets 30a to 30e may be used as one or more of the mass separating magnet 6, the energy separating magnet 10, the scanning magnet 12, and the parallelizing magnet 14 of the ion beam irradiating apparatus shown in FIG. 51.

According to the configuration, in the deflecting electromagnets, the above-mentioned effects are achieved, and space charges of the ion beam 4 can be efficiently neutralized, whereby the divergence of the ion beam 4 can be suppressed. Therefore, the efficiency of transporting the ion beam 4 emitted from the ion source 2 to the target 16 can be improved.

What is claimed is:

1. A deflecting electromagnet comprising:
   first and second magnetic poles that are opposed to each other, both in polarity and position, across an inter-pole space through which an ion beam passes, for bending the ion beam passing through said inter-pole space, the first and second magnetic poles separated by a substantially uniform width across the inter-pole space and providing a pole magnetic field; and
   a first permanent-magnet group in said inter-pole space for forming a first mirror magnetic field in which intensity is relatively low in a vicinity of a middle of said inter-pole space and relatively high near an inlet and an outlet of said inter-pole space.

2. The deflecting electromagnet according to claim 1, wherein said first permanent-magnet group comprises:
   a first pair of permanent magnets, each permanent magnet in the first pair being placed opposite one another, both in polarity and position, in a vicinity of said first and second magnetic poles at locations in the inter-pole space that are nearer to the inlet of the inter-pole space with respect to the middle, said first pair of permanent magnets contributing to producing the first mirror magnetic field in a direction along which the pole magnetic field is enhanced; and
   a second pair of permanent magnets, each permanent magnet in the first pair being placed opposite one another, both in polarity and position in a vicinity of said first and second magnetic poles at locations in the inter-pole space that are nearer to the outlet of the inter-pole space with respect to the middle, said second pair of permanent magnets contributing to producing the first mirror magnetic field in a direction along which the pole magnetic field is enhanced.

3. The deflecting electromagnet according to claim 1, wherein further comprising:
a second permanent-magnet group forming a second mirror magnetic field in the inter-pole space, in which intensity is relatively low in the vicinity of the middle of said inter-pole space and relatively high nearer to the inlet and the outlet than the middle.

4. The deflecting electromagnet according to claim 3, wherein said second permanent-magnet group comprises:
third and fourth pairs of permanent magnets, each permanent magnet in the third and fourth pairs being placed opposite one another, both in polarity and position, respectively, in the inter-pole space and in a vicinity of said first and second magnetic poles at locations nearer to the inlet and the outlet than the middle, said third and fourth pairs of permanent magnets contributing to producing the second mirror magnetic field in a direction along which the pole magnetic field is enhanced.

5. An ion beam irradiating apparatus for irradiating a target, the apparatus comprising:
an ion source that emits an ion beam; and
at least one deflecting electromagnet according to claim 1.

6. A deflecting electromagnet comprising:
first and second magnetic poles that are opposed to each other, both in polarity and position, across an inter-pole space through which an ion beam passes, for bending the ion beam passing through said inter-pole space, the first and second magnetic poles separated by a substantially uniform width across the inter-pole space and providing a pole magnetic field; and
a pair of potential adjusting electrodes which are placed in the inter-pole space to sandwich a path of the ion beam; and
a DC potential adjusting power source which applies a positive voltage with respect to ground, across said pair of potential adjusting electrodes.

7. The deflecting electromagnet according to claim 6, wherein the voltage which is applied from said potential adjusting power source across said potential adjusting electrodes is higher than a higher one of:
a first potential of the ion beam at ion beam inlet ends of said potential adjusting electrodes; and
a second potential of the ion beam at ion beam outlet ends of said potential adjusting electrodes.

8. A deflecting electromagnet comprising:
first and second magnetic poles that are opposed to each other, both in polarity and position, across an inter-pole space through which an ion beam passes, for bending the ion beam passing through said inter-pole space, the first and second magnetic poles separated by a substantially uniform width across the inter-pole space and providing a pole magnetic field; and
a first pair of correcting electrodes placed in the inter-pole space nearer to an inlet of the inter-pole space than a middle of the inter-pole space, and placed to sandwich a path of the ion beam;
a second pair of correcting electrodes which are juxtaposed with said first pair of correcting electrodes to be positioned downstream of said first pair of correcting electrodes relative to the direction that the ion beam travels;
a third pair of correcting electrodes placed in the inter-pole space nearer to an outlet of the inter-pole space than a middle of the inter-pole space, and placed to sandwich the path of the ion beam;
a fourth pair of correcting electrodes which are juxtaposed with said third pair of correcting electrodes to be positioned downstream of said third pair of correcting electrodes relative to the direction that the ion beam travels;
a first DC correcting power source which holds a second potential across said second pair of correcting electrodes lower than a first potential across said first pair of correcting electrodes; and
a second DC correcting power source which holds a forth potential across said fourth pair of correcting electrodes to be lower than a third potential across said third pair of correcting electrodes.

9. The deflecting electromagnet according to claim 8, wherein said first DC correcting power source and said second DC correcting power source are a same power source.

10. The deflecting electromagnet according to claim 8, wherein said first and second pairs of correcting electrodes are placed in a vicinity of the inlet of said inter-pole space, and said third and fourth pairs of correcting electrodes are placed in a vicinity of the outlet of said inter-pole space.

11. The deflecting electromagnet according to claim 8, wherein said first pair of correcting electrodes are placed in a vicinity of the inlet of said inter-pole space, said second pair of correcting electrodes are placed downstream of said inlet of said inter-pole space, said third pair of correcting electrodes are placed in a vicinity of the outlet end of said inter-pole space, and said fourth pair of correcting electrodes are placed downstream of said outlet end of said inter-pole space.

12. The deflecting electromagnet according to claim 8, further comprising:
a first pair of permanent magnets placed on or in a vicinity of said first and second magnetic poles, and between said first pair of correcting electrodes and said second pair of correcting electrodes and on opposite sides of the ion beam to intersect with the path of the ion beam, said first pair of permanent magnets contributing to producing a first mirror magnetic field in a direction along which the pole magnetic field is enhanced; and
a second pair of permanent magnets placed on or in a vicinity of said first and second magnetic poles, and between said third pair of correcting electrodes and said fourth pair of correcting electrodes to intersect with the path of the ion beam, said second pair of permanent magnets contributing to producing the first mirror magnetic field in a direction along which the pole magnetic field is enhanced.

13. An ion beam irradiating apparatus for irradiating a target, the apparatus comprising:
an ion source that emits an ion beam; and
at least one deflecting electromagnet according to claim 6.

14. An ion beam irradiating apparatus for irradiating a target, the apparatus comprising:
an ion source that emits an ion beam; and
at least one deflecting electromagnet according to claim 8.

* * * * *

UNITED STATES PATENT AND TRADEMARK OFFICE
CERTIFICATE OF CORRECTION

PATENT NO. : 7,498,572 B2
APPLICATION NO. : 11/519008
DATED : March 3, 2009
INVENTOR(S) : Hideki Fujita Page 1 of 1

It is certified that error appears in the above-identified patent and that said Letters Patent is hereby corrected as shown below:

In claim 2, column 32, line 64, "position" should read --position,--.

In claim 6, column 33, line 38, "voltage" should read --voltage,--.

In claim 8, column 34, line 15, "forth" should read --fourth--.

Signed and Sealed this

Fourth Day of August, 2009

JOHN DOLL
*Acting Director of the United States Patent and Trademark Office*